(12) United States Patent
Chung et al.

(10) Patent No.: US 10,672,987 B2
(45) Date of Patent: Jun. 2, 2020

(54) POLYMER AND ELECTRONIC DEVICE AND ORGANIC THIN FILM TRANSISTOR INCLUDING THE SAME

(71) Applicants: Samsung Electronics Co., Ltd., Suwon-si, Gyeonggi-do (KR); The Board of Trustees of the Leland Stanford Jr. University, Stanford, CA (US)

(72) Inventors: Jong Won Chung, Hwaseong-si (KR); Sangyoon Lee, Seoul (KR); Zhenan Bao, Stanford, CA (US); Simon Rondeau-Gagne, Stanford, CA (US); Bob C. Schroeder, Stanford, CA (US); Jinyoung Oh, Stanford, CA (US); Yu-Cheng Chiu, Stanford, CA (US); Franziska Lissel, Stanford, CA (US)

(73) Assignees: Samsung Electronics Co., Ltd., Gyeonggi-do (KR); The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 16/033,428

(22) Filed: Jul. 12, 2018

(65) Prior Publication Data

US 2018/0323376 A1 Nov. 8, 2018

Related U.S. Application Data

(62) Division of application No. 15/167,029, filed on May 27, 2016, now Pat. No. 10,050,203.

(51) Int. Cl.
*H01L 51/00* (2006.01)
*C08G 61/12* (2006.01)
*H01L 51/05* (2006.01)

(52) U.S. Cl.
CPC ........ *H01L 51/0036* (2013.01); *C08G 61/122* (2013.01); *C08G 61/123* (2013.01);
(Continued)

(58) Field of Classification Search
CPC .......... C08G 61/126; C08G 2261/3243; C08G 2261/3223; C08G 2261/124; C08G 2261/414; C08G 2261/91; C08G 2261/95
See application file for complete search history.

(56) References Cited

U.S. PATENT DOCUMENTS 7,718,999 B2  5/2010  Li et al.
7,932,344 B2  4/2011  Li
(Continued)

FOREIGN PATENT DOCUMENTS

EP        2837593 A1    2/2015
JP     2010-0108977 A    5/2010
(Continued)

OTHER PUBLICATIONS

Hung-Chin Wu, et al. "A Rapid and Facile Soft Contact Lamination Method: Evaluation of Polymer Semiconductors for Stretchable Transistors," J. Chem. Mater. vol. 26, pp. 4544-4551 (2014).
(Continued)

*Primary Examiner* — Shane Fang
(74) *Attorney, Agent, or Firm* — Harness, Dickey & Pierce, P.L.C.

(57) ABSTRACT

A polymer includes a first repeating unit and a second repeating unit forming a main chain, the first repeating unit including at least one first conjugated system, and the second repeating unit including at least one second conjugated system and a multiple hydrogen bonding moiety represented by Chemical Formula 1.

16 Claims, 52 Drawing Sheets
(10 of 52 Drawing Sheet(s) Filed in Color)

(52) U.S. Cl.
CPC ......... *C08G 61/124* (2013.01); *C08G 61/125* (2013.01); *C08G 61/126* (2013.01); *H01L 51/0043* (2013.01); *C08G 2261/124* (2013.01); *C08G 2261/1412* (2013.01); *C08G 2261/1646* (2013.01); *C08G 2261/18* (2013.01); *C08G 2261/3221* (2013.01); *C08G 2261/3222* (2013.01); *C08G 2261/3223* (2013.01); *C08G 2261/3241* (2013.01); *C08G 2261/3243* (2013.01); *C08G 2261/3246* (2013.01); *C08G 2261/334* (2013.01); *C08G 2261/3327* (2013.01); *C08G 2261/344* (2013.01); *C08G 2261/51* (2013.01); *C08G 2261/62* (2013.01); *C08G 2261/92* (2013.01); *H01L 51/052* (2013.01); *H01L 51/0545* (2013.01); *H01L 51/0558* (2013.01); *H01L 51/0566* (2013.01)

(56) References Cited

U.S. PATENT DOCUMENTS

| | | | |
|---|---|---|---|
| 8,809,484 | B2 | 8/2014 | Wigglesworth et al. |
| 2009/0283723 | A1 | 11/2009 | Meyer-Friedrichsen et al. |
| 2014/0333982 | A1 | 11/2014 | Higuchi et al. |

FOREIGN PATENT DOCUMENTS

| | | |
|---|---|---|
| KR | 10-1262319 B1 | 5/2013 |
| KR | 10-1358988 B1 | 2/2014 |
| KR | 2015-0126570 A | 11/2015 |

OTHER PUBLICATIONS

Wang, et al. "Thiophene-Diketopyrrolopyrrole-Based Quinoidal Small Molecules as Solution-Processable and Air-Stable Organic Semiconductors: Tuning of the Length and Branching Position of the Alkyl Side Chain toward a High-Performance n-Channel Organic Field-Effect Transistor," Applied Materials & Interfaces, vol. 7, pp. 15978-15987 (2015).

Sheldrick "A short history of SHELX," Acta Cryst. vol. A64, pp. 112-122 (2008).

Sheldrick "SHELXT—Integrated space-group and crystal-structure determination," Acta Cryst., vol. A71, pp. 3-8 (2015).

Schroeder, et al. "Non-Conjugated Flexible Linkers in Semiconducting Polymers: A Pathway to Improved Processability without Compromising Device Performance," Advanced Electronic Materials, vol. 1600104, pp. 1-10 (2016).

Song, et al. "Stretchable and Transparent Organic Semiconducting Thin Film with Conjugated Polymer Nanowires Embedded in an Elastomeric Matrix," Advanced Electronic Materials, vol. 1500250, No. 2, pp. 1-8, (2016).

Miller, et al. "Tough, Semiconducting Polyethylene-poly (3-hexylthiophene) Diblock Copolymers," Advanced Functional Materials, vol. 17, pp. 2674-2679 (2007).

O'Connor, et al. "Anisotropic Structure and Charge Transport in Highly Strain-Aligned Regioregular Poly(3-hexylthiophene)," Advanced Functional Materials, vol. 21, pp. 3697-3705 (2011).

Oh, et al. "Conducting Polymer Dough for Deformable Electronics," Advanced Materials, pp. 1-7 (2015).

Sekitani, et al. "Stretchable, Large-area Organic Electronics," Advanced Materials, vol. 22, pp. 2228-2246 (2010).

Lipomi, et al. "Stretchable Organic Solar Cells," Advanced Materials, vol. 23, pp. 1771-1775 (2011).

Yu, et al. "Intrinsically Stretchable Polymer Light-Emitting Devices Using Carbon Nanotube-Polymer Composite Electrodes," Advanced Materials, vol. 23, pp. 3989-3994 (2011).

Wang, et al. "A Rapid and Efficient Self-Healing Thermo-Reversible Elastomer Crosslinked with Graphene Oxide," Advanced Materials, vol. 25, pp. 5785-5790 (2013).

Shin, et al. "Polythiophene Nonofibril Bundles Surface-Embedded in Elastomer: A Route to a Highly Stretchable Active Channel Layer," Advanced Materials, vol. 27, pp. 1255-1261 (2015).

Hammock, et al. "25th Anniversary Article: The Evolution of Electronic Skin (E-Skin): A Brief History, Design Considerations, and Recent Progress," Advanced Materials, vol. 25, pp. 5997-6038 (2013).

Shin, et al. "Highly Stretchable Polymer Transistors Consisting Entirely of Stretchable Device Components," Advanced Materials, vol. 26, pp. 3706-3711 (2014).

Chortos, et al. "Highly Stretchable Transistors Using a Microcracked Organic Semiconductor," Advanced Materials, vol. 26, pp. 4253-4259 (2014).

Yao, et al. "Nanomaterial-Enable Stretchable Conductors: Strategies, Materials and Devices," Advanced Materials, vol. 27, pp. 1480-1511 (2015).

Chortos, et al. "Mechanically Durable and Highly Stretchable Transistors Employing Carbon Nanotube Semiconductor and Electrodes," Advanced Materials, pp. 1-8 (2015).

Jonkheijm, et al. "π-Conjugated Oligo-(p-phenylenevinylene) Rosettes and Their Tubular Self-Assembly," Angew. Chem. Int. Ed. vol. 43, pp. 74-48 (2004).

Hu, et al. "Highly stretchable, conductive, and transparent nanotube thin films," Applied Physics Letters, vol. 94, 161108-1-161108-3 (2009).

Frauenrath, et al. "A General Concept for the Preparation of Hierarchically Structured π-Conjugated Polymers," Chemistry A European Journal, vol. 14, pp. 2942-2955 (2008).

Stupp, et al. "Supramolecular Chemistry and Self-Assembly in Organic Materials Design," Chemistry of Materials, vol. 26, pp. 507-518 (2014).

Savagatrup, et al. "Molecularly Stretchable Electronics," Chemistry of Materials, vol. 26, pp. 3028-3041 (2014).

Choi, et al. "Importance of Electron Transport Ability in Naphthalene Diimide-Based Polymer Acceptors for High-Performance, Additive-Free, All-Polymer Solar Cells," Chemistry of Materials, vol. 27, pp. 5230-5237 (2015).

Martin "Comparisons of Indefinite Self-Association Models," American Chemical Society, vol. 96, No. 8, pp. 3043-3064 (1996).

Yang, et al. "Self-healing polymeric materials," Chem. Soc. Rev., vol. 42, pp. 7446-7467 (2013).

Li, et al. "High mobility diketopyrrolopyrrole (DPP_-based organic semiconductor materials for organic thin film transistors and photovoltaics," Energy & Environmental Science, vol. 6, pp. 1684-1710 (2013).

Rivnay, et al. "Quantitative Determination of Organic Semiconductor Microstructure from the Molecular to Device Scale," Chemical Reviews, vol. 112, pp. 5488-5519 (2012).

Ray, et al. "Highly Stabilized Low-Spin Iron(III) and Colbalt(III) Complexes of a Tridentate Bis-Amide Ligand 2,6-BIS(N-phenylcarbamoyl)pyridine. Novel Nonmacrocyclic Tetraamido-N Coordination and Two Unusually Short Metal-Pyridine Bonds," Inorg. Chem, vol. 36, pp. 3568-3572 (1997).

Gellman, et al. "Conformation-Directing Effects of a Single Intramolecular Amide-Amide Hydrogen Bong: Variable-Temperature NMR and IR Studies on a Homologous Diamide Series," American Chemical Society, vol. 113, pp. 1164-1173 (1991).

Yao, et al. "Significant Improvement of Semiconducting Performance of the Diketopyrrolopyrrole-Quaterthiophene Conjugated Polymer through Side-Chain Engineering via Hydrogen-Bonding," Journal of American Chemical Society, vol. 138, pp. 173-185 (2016).

Kang, et al. "Record High Hole Mobility in Polymer Semiconductors via Side-Chain Engineering," Journal of American Chemical Society, vol. 135, pp. 14896-14899 (2013).

Dolomanov, et al. "OLEX2: a complete structure solution, refinement and analysis program," J. Appl. Cryst. vol. 42, pp. 339-341 (2009).

Marlin, et al. "Extended structures controlled by intramolecular and intermolecular hydrogen bonding: a case study with pyridine-2,6-dicarboxamide, 1,3-benzenedicarboxamide and N,N1-dimethyl-2,6-pyridinedicarboxamide," Journal of Molecular Structure, vol. 554, pp. 211-223 (2000).

(56) References Cited

OTHER PUBLICATIONS

Langley, et al. "Relation of Elastic Modulus to Crosslink and Entanglement Concentrations in Rubber Networks," Journal of Polymer Science, vol. 12, pp. 1023-1034 (1974).

Baker, et al. "Quantification of Thin Film Crystallographic Orientation Using X-ray Diffraction with an Area Detector," American Chemical Society, Langmuir, vol. 26, No. 11, pp. 9146-9151 (2010).

Herbst, et al. "Self-Healing Polymers via Supramolecular Forces," Macromolecular Rapid Communications, vol. 34, pp. 203-220 (2013).

Savagatrup, et al. "Best of Both Worlds: Conjugated Polymers Exhibiting Good Photovoltaic Bahvior and High Tensile Elasticity," Macromolecules, vol. 47, pp. 1981-1992 (2014).

Zhao, et al. "Conjugation-Break Spacers in Semiconducting Polymers: Impact on Polymer Processability and Charge Transport Properties," Macromolecules, vol. 48, pp. 2048-2053 (2015).

Chortos, et al. "Skin-inspired electronic devices," Materials Today, vol. 17, No. 7, pp. 321-331 (2014).

Wagner, et al. "Materials for stretchable electronics," Materials Research Society, vol. 37, pp. 207-213 (2012).

Xu, et al. "Highly Stretchable Carbon Nanotube Transistors with Ion Gel Gate Dielectrics," Nano Letters, vol. 14, pp. 682-686 (2014).

Choi, et al. "Biaxially Stretchable "Wavy" Silicon Nanomembranes," Nano Letters, vol. 7, No. 6, pp. 1655-1663 (2007).

Chen, et al. "Multiphase design of autonomic self-healing thermoplastic elastomers," Nature Chemistry, col. 4, pp. 467-472 (2012).

Ramirez, et al. "Mechanochemical strengthening of a synthetic polymer in response to typically destructive shear forces," Nature Chemistry, vol. 5, pp. 757-761 (2013).

Kaltenbrunner, et al. "Ultrathin and lightweight organic solar cells with high flexibility," Nature Communications, pp. 1-7 (2012).

Liang, et al. "Intrinsically stretchable and transparent thin-film transistors based on printable silver nanowires, carbon nanotubes and an elastomeric dielectric," Nature Communications, pp. 1-10 (2015).

Diao, et al. "Flow-enhanced solution printing of all-polymer solar cells," Nature Communications, pp. 1-10 (2015).

Chou, et al. "A chameleon-inspired stretchable electronic skin with interactive colour changing controlled by tactile sensing," Nature Communications, pp. 1-10 (2015).

Wojtecki, et al. "Using the dynamic bond to access macroscopically responsive structurally dynamic polymers," Nature Materials, vol. 10, pp. 14-27 (2011).

Sekitani, et al. "Stretchable active-matrix organic light-emitting diode display using printable elastic conductors," Nature Materials, vol. 8, pp. 494-499 (2009).

Lipomi, et al. "Skin-like pressure and strain sensors based on transparent elastic films of carbon nanotubes," Nature Technology, vol. 6, pp. 788-792 (2011).

Kim, et al. "Large-scale pattern growth of graphene films for stretchable transparent electrodes," Nature Letters, vol. 457, pp. 706-710 (2009).

Cordier, et al. Self-healing and thermoreversible rubber from supramolecular assembly, Nature Letters, vol. 451, pp. 977-980 (2008).

Zalesskiy, et al. "Pd2(dba)3 as Precursor of Soluble Metal Complexes and Nanoparticles: Determination of Palladium Active Species for Catalysis and Synthesis," Organometallics, vol. 31, pp. 2302-2309 (2012).

Benight, et al. "Stretchable and self-healing polymers and devices for electronic skin," Progress in Polymer Science, vol. 38, pp. 1961-1977 (2013).

Printz, et al. "Increased elasticity of a low-bandgap conjugated copolymer by random segmentation for mechanically robust solar cells," RSC Adv., vol. 4, pp. 13635-13643 (2014).

Wang, et al. "Significance of the double-layer capacitor effect in polar rubbery dielectrics and exceptionally stable low-voltage high transconductance organic transistors," Scientific Reports, pp. 1-8 (2015).

Rogers, et al. "Materials and Mechanics for Stretchable Electronics," Science, vol. 327, pp. 1603-1607 (2010).

Kim, et al. "Epidermal Electronics," Science, vol. 333, pp. 838-843 (2011).

Tee, et al. "A skin-inspired organic digital mechanoreceptor," Science, vol. 350, No. 6258, pp. 313-316 (2015).

Sekitani, et al. "A Rubberlike Stretchable Active Matrix Using Elastic Conductors," Science, vol. 321, pp. 1468-1472 (2008).

Khang, et al. "A stretchable Form of Single-Crystal Silicon for High-Performance Electronics on Rubber Substrates," Science, vol. 311, pp. 208-212 (2006).

POLYMER AND ELECTRONIC DEVICE AND ORGANIC THIN FILM TRANSISTOR INCLUDING THE SAME

CROSS-REFERENCE TO RELATED APPLICATIONS

This is a divisional of, and claims priority under 35 U.S.C. § 120 to, U.S. application Ser. No. 15/167,029, filed May 27, 2016.

BACKGROUND

1. Field

Example embodiments provide a composition for preparing an electrically conductive composite, a composite prepared therefrom, and an electronic device including the same.

2. Description of the Related Art

The recent development of portable and smart electronics has changed the way humans interact and communicate with electronic devices. For example, intimate contact between humans and electronic devices has continuously been improving, with anticipation that, in the near future, wearable electronic devices may act as a second skin for humans to interact and communicate with other humans and electronics for various applications. As a result, deformable electronic materials (e.g., polymer semiconductor materials) that can be stretched similarly to human skin and are able to endure various human motions is an expanding field that has attracted increasing attention.

Thin-film field-effect transistors (TFTs) are basic elements of stretchable electronic devices, and polymer semiconductor materials are a key component of stretchable transistors. Many research has progressed in order to provide a semiconductor material with enhanced stretchability. So far, however, in the case of the currently available technologies, a polymer film tends to be more easily broken and to show a decreased level of electrical properties under an increased level of strain. Thus, developing a material that may show enhanced mechanical properties (e.g., stretchability) together with relatively high electrical properties may be desirable.

SUMMARY

Example embodiments provide a polymeric material capable of showing improved stretchability together with enhanced electrical properties.

Example embodiments also provide an electronic device including the aforementioned polymeric material.

Example embodiments also provide an organic thin film transistor including the aforementioned polymeric material.

According to example embodiments, a polymer includes a first repeating unit and a second repeating unit forming a main chain, the first repeating unit including at least one first conjugated system, and the second repeating unit including at least one second conjugated system and a multiple hydrogen bonding moiety represented by Chemical Formula 1:

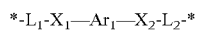

Chemical Formula 1 wherein, in Chemical Formula 1,
each of $L_1$ and $L_2$ are the same or different, and are independently one of a direct bond and a $C_1$ to $C_5$ substituted or unsubstituted alkylene group,
each of $X_1$ and $X_2$ are the same or different, and are independently one of amide, urea, carbamate, —CO—, —OCO—, —NH—, and a combination thereof,
$Ar_1$ is a heteroaromatic group, and
* is a portion that is linked to an adjacent second conjugated system.

The first conjugated system may include at least one selected from a moiety represented by Chemical Formula 2-1, a moiety represented by Chemical Formula 2-2, a moiety represented by Chemical Formula 2-3, a moiety represented by Chemical Formula 2-4, a moiety represented by Chemical Formula 2-5, a moiety represented by Chemical Formula 2-6, a moiety represented by Chemical Formula 2-7, and a moiety represented Chemical Formula 2-8:

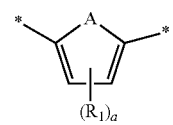

[Chemical Formula 2-1]

wherein, in Chemical Formula 2-1,
A is one of O, S, and NH,
$R_1$ is one of a substituted or unsubstituted aliphatic hydrocarbon group, a substituted or unsubstituted aromatic hydrocarbon group, and a halogen,
a is 0 to 2, and
* is a portion linked to an adjacent moiety;

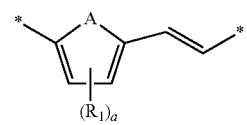

[Chemical Formula 2-2]

wherein, in Chemical Formula 2-2,
A is one of O, S, and NH,
$R_1$ is one of a substituted or unsubstituted aliphatic hydrocarbon group, a substituted or unsubstituted aromatic hydrocarbon group, and a halogen,
a is 0 to 2, and
* is a portion linked to an adjacent moiety;

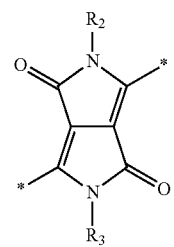

[Chemical Formula 2-3]

wherein, in Chemical Formula 2-3,
each of $R_2$ and $R_3$ is one of hydrogen, a substituted or unsubstituted aliphatic hydrocarbon group, and a substituted or unsubstituted aromatic hydrocarbon group, and

* is a portion linked to an adjacent moiety (e.g., an adjacent conjugated system);

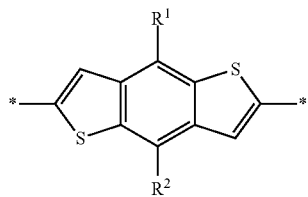

[Chemical Formula 2-4]

wherein, in Chemical Formula 2-4, each of R¹ and R² is one of hydrogen, a substituted or unsubstituted aliphatic hydrocarbon group, and a substituted or unsubstituted aromatic hydrocarbon group, and

* is a portion linked to an adjacent moiety;

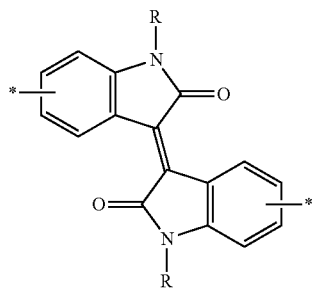

[Chemical Formula 2-5]

wherein, in Chemical Formula 2-5, each R is one of independently hydrogen, a substituted or unsubstituted aliphatic hydrocarbon group, and a substituted or unsubstituted aromatic hydrocarbon group, and

* is a portion linked to an adjacent moiety;

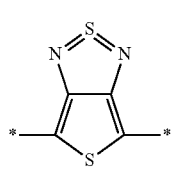

[Chemical Formula 2-6]

wherein, in Chemical Formula 2-6,

* is a portion linked to an adjacent moiety;

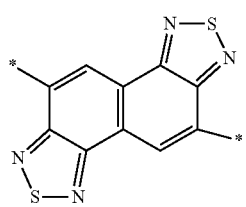

[Chemical Formula 2-7]

wherein, in Chemical Formula 2-7,

* is a portion linked to an adjacent moiety; and

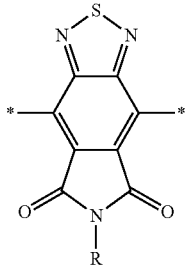

[Chemical Formula 2-8]

wherein, in Chemical Formula 2-8,

* is a portion linked to an adjacent moiety and R is one of independently hydrogen, a substituted or unsubstituted aliphatic hydrocarbon group, and a substituted or unsubstituted aromatic hydrocarbon group.

The first conjugated system may include one of a substituted or unsubstituted phenylene group, a substituted or unsubstituted thiazoline group, a substituted or unsubstituted pyridine group, a substituted or unsubstituted naphthalene group, a substituted or unsubstituted anthracene group, a substituted or unsubstituted naphthacene group, a substituted or unsubstituted fluorene group, a substituted or unsubstituted carbazole group, a substituted or unsubstituted thienothiophene group, a substituted or unsubstituted thieno benzothiophene group, and a combination thereof.

The second conjugated system may include at least one selected from a moiety represented by Chemical Formula 2-1, a moiety represented by Chemical Formula 2-2, a moiety represented by Chemical Formula 2-3, a moiety represented by Chemical Formula 2-4, a moiety represented by Chemical Formula 2-5, a moiety represented by Chemical Formula 2-6, a moiety represented by Chemical Formula 2-7, and a moiety represented Chemical Formula 2-8:

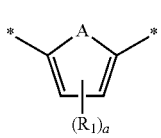

[Chemical Formula 2-1]

wherein, in Chemical Formula 2-1,

A is one of O, S, and NH,

R₁ is one of a substituted or unsubstituted aliphatic hydrocarbon group, a substituted or unsubstituted aromatic hydrocarbon group, and a halogen, a is 0 to 2, and

* is a portion linked to an adjacent moiety;

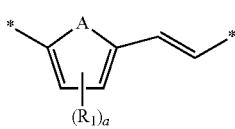

[Chemical Formula 2-2]

wherein, in Chemical Formula 2-2,

A is one of O, S, and NH, $R_1$ is one of a substituted or unsubstituted aliphatic hydrocarbon group, a substituted or unsubstituted aromatic hydrocarbon group, and a halogen, a is 0 to 2, and

* is a portion linked to an adjacent moiety;

[Chemical Formula 2-3]

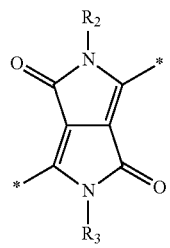

wherein, in Chemical Formula 2-3, each of $R_2$ and $R_3$ is one of hydrogen, a substituted or unsubstituted aliphatic hydrocarbon group, and a substituted or unsubstituted aromatic hydrocarbon group, and

* is a portion linked to an adjacent moiety (e.g., an adjacent conjugated system);

[Chemical Formula 2-4]

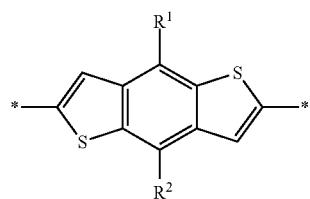

wherein, in Chemical Formula 2-4, each of $R^1$ and $R^2$ is one of hydrogen, a substituted or unsubstituted aliphatic hydrocarbon group, and a substituted or unsubstituted aromatic hydrocarbon group, and

* is a portion linked to an adjacent moiety;

[Chemical Formula 2-5]

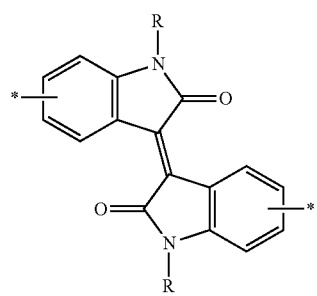

wherein, in Chemical Formula 2-5, each R is one of independently hydrogen, a substituted or unsubstituted aliphatic hydrocarbon group, and a substituted or unsubstituted aromatic hydrocarbon group, and

* is a portion linked to an adjacent moiety;

[Chemical Formula 2-6]

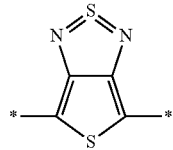

wherein, in Chemical Formula 2-6,
* is a portion linked to an adjacent moiety;

[Chemical Formula 2-7]

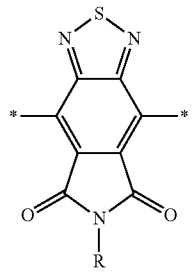

wherein, in Chemical Formula 2-7,
* is a portion linked to an adjacent moiety; and

[Chemical Formula 2-8]

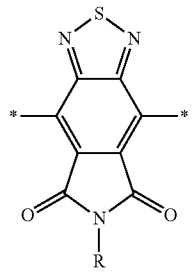

wherein, in Chemical Formula 2-8,
* is a portion linked to an adjacent moiety and R is one of independently hydrogen, a substituted or unsubstituted aliphatic hydrocarbon group, and a substituted or unsubstituted aromatic hydrocarbon group.

The at least one second conjugated system may be a plurality of second conjugated systems, and the second repeating unit may include the multiple hydrogen bonding moiety between adjacent ones of the second conjugated systems.

In Chemical Formula 1, the $Ar_1$ may be one of a pyridine moiety, a bipyridine moiety, a phenanthroline moiety, a phenyl moiety, a thiophene moiety, a pyrrole moiety, and a combination thereof.

The multiple hydrogen bonding moiety may be represented by Chemical Formula 1-1:

[Chemical Formula 1-1]

wherein, in Chemical Formula 1-1,
each R is independently one of hydrogen and a $C_1$ to $C_{10}$ alkyl group,
$Ar_1$ is one of a pyridine moiety, a bipyridine moiety, a phenanthroline moiety, a phenyl moiety, a thiophene moiety, and a pyrrole moiety, and
n is an integer of 0 to 5.

The polymer may consist of the first repeating unit and the second repeating unit.

A ratio between the first repeating unit and the second repeating unit may be about 1:0.01 to about 1:30.

The polymer may include a random copolymer.

The polymer may be represented by Chemical Formula 3:

[Chemical Formula 3]

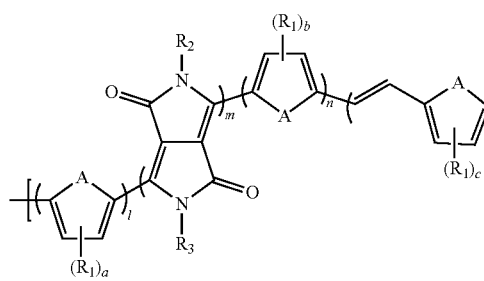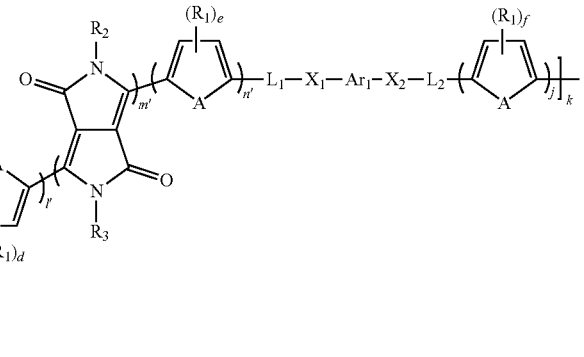

wherein, in Chemical Formula 3, each $R_1$ is independently one of a substituted or unsubstituted aliphatic hydrocarbon group, a substituted or unsubstituted aromatic hydrocarbon group, and a halogen, each of $R_2$ and $R_3$ is independently one of hydrogen, a substituted or unsubstituted aliphatic hydrocarbon group, and a substituted or unsubstituted aromatic hydrocarbon group, each A is independently one of O, S, and NH, each of a, b, c, d, e, and f is independently 0 to 2, each of l, m, n, and o is independently 0 to 10, provided that all of l, m, n, and o cannot be 0 simultaneously, each of l', m', and n' is independently 0 to 10, provided that all of l', m', and n' cannot be 0 at the same time, j is 1 to 10, k is 0.03 to 0.5, each of $L_1$ and $L_2$ are the same or different and are independently one of a direct bond and a $C_1$ to $C_5$ substituted or unsubstituted alkylene group, each of $X_1$ and $X_2$ are the same or different and are independently one of amide, urea, carbamate, —CO—, —OCO—, —NH—, and a combination thereof, and $Ar_1$ is a heteroaromatic group.

The polymer may have an elastic modulus of less than or equal to about 10 GPa measured by the buckling method.

The polymer may have a dichroic ratio of greater than or equal to about 1.2 at 50% strain.

The polymer may further include a metal ion.

In example embodiments, the polymer does not show any microscale cracks when subjected to a strain cycle of 0% to 100% as determined by an optical microscope.

The polymer may have a field effect mobility of at least 80% of an initial value prior to the application of stretching for 100 cycles at 100% strain, an annealing process with a chloroform vapor at a temperature of 40° C. for 10 minutes and a heating process at a temperature of about 150° C. for 30 minutes.

According to example embodiments, an electronic device includes the aforementioned polymer of example embodiments.

According to example embodiments, an organic thin film transistor includes a gate electrode, an insulating layer on the gate electrode, a semiconductor layer on the insulating layer and including the aforementioned polymer, and a source electrode and a drain electrode electrically linked to the semiconductor layer.

A field effect mobility of the polymer may be greater than or equal to about 0.1 $cm^2/VS$ and the On/off current ratio may be greater than or equal to about $10^4$.

A decrease in field effect mobility of the polymer may be less than or equal to about 30% of initial mobility prior to application of a strain of at least 20% in a channel length direction of the semiconductor layer.

A decrease in field effect mobility of the polymer may be less than or equal to about 50% of initial mobility prior to application of 100 times stretching cycle at a 25% strain in a channel length direction of the semiconductor layer.

According to example embodiments, a polymer includes a first repeating unit including a plurality of first conjugated systems and a non-conjugated hydrogen bonding moiety between adjacent ones of the first conjugated systems, the non-conjugated hydrogen bonding moiety represented by Chemical Formula 1:

*-$L_1$-$X_1$—$Ar_1$—$X_2$-$L_2$-*           Chemical Formula 1 wherein, in Chemical Formula 1, each of $L_1$ and $L_2$ are the same or different, and are independently one of a direct bond and a $C_1$ to $C_5$ substituted or unsubstituted alkylene group, each of $X_1$ and $X_2$ are the same or different, and are independently one of amide, urea, carbamate, —CO—, —OCO—, —NH—, and a combination thereof, $Ar_1$ is a heteroaromatic group, and

* is a portion that is linked to an adjacent second conjugated system.

The polymer may further include a second repeating unit including at least one second conjugated system, the second conjugated system including one of a substituted or unsubstituted phenylene group, a substituted or unsubstituted thiazoline group, a substituted or unsubstituted pyridine group, a substituted or unsubstituted naphthalene group, a substituted or unsubstituted anthracene group, a substituted or unsubstituted naphthacene group, a substituted or unsubstituted fluorene group, a substituted or unsubstituted carbazole group, a substituted or unsubstituted thienothiophene group, a substituted or unsubstituted thieno benzothiophene group, and a combination thereof.

One of the first and second conjugated systems may include at least one selected from a moiety represented by Chemical Formula 2-1, a moiety represented by Chemical Formula 2-2, a moiety represented by Chemical Formula 2-3, a moiety represented by Chemical Formula 2-4, a moiety represented by Chemical Formula 2-5, a moiety represented by Chemical Formula 2-6, a moiety represented by Chemical Formula 2-7, and a moiety represented Chemical Formula 2-8:

[Chemical Formula 2-1]

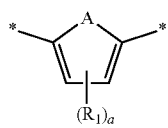

wherein, in Chemical Formula 2-1,

A is one of O, S, and NH, $R_1$ is one of a substituted or unsubstituted aliphatic hydrocarbon group, a substituted or unsubstituted aromatic hydrocarbon group, and a halogen, a is 0 to 2, and

* is a portion linked to an adjacent moiety;

[Chemical Formula 2-2]

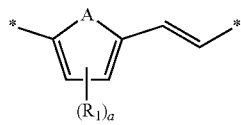

wherein, in Chemical Formula 2-2,

A is one of O, S, and NH, $R_1$ is one of a substituted or unsubstituted aliphatic hydrocarbon group, a substituted or unsubstituted aromatic hydrocarbon group, and a halogen, a is 0 to 2, and

* is a portion linked to an adjacent moiety;

[Chemical Formula 2-3]

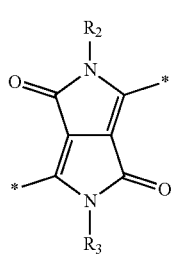

wherein, in Chemical Formula 2-3, each of $R_2$ and $R_3$ is one of hydrogen, a substituted or unsubstituted aliphatic hydrocarbon group, and a substituted or unsubstituted aromatic hydrocarbon group, and

* is a portion linked to an adjacent moiety;

[Chemical Formula 2-4]

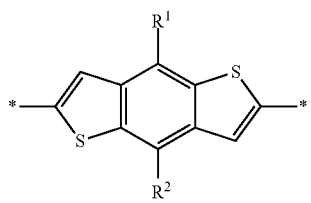

wherein, in Chemical Formula 2-4, each of $R^1$ and $R^2$ is one of hydrogen, a substituted or unsubstituted aliphatic hydrocarbon group, and a substituted or unsubstituted aromatic hydrocarbon group, and

* is a portion linked to an adjacent moiety;

[Chemical Formula 2-5]

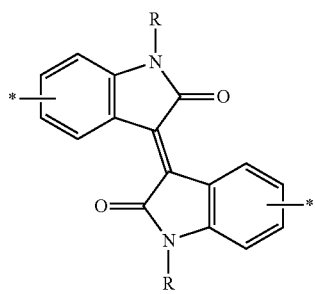

wherein, in Chemical Formula 2-5, each R is independently one of hydrogen, a substituted or unsubstituted aliphatic hydrocarbon group, and a substituted or unsubstituted aromatic hydrocarbon group, and

* is a portion linked to an adjacent moiety;

[Chemical Formula 2-6]

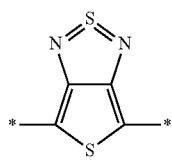

wherein, in Chemical Formula 2-6,

* is a portion linked to an adjacent moiety;

[Chemical Formula 2-7]

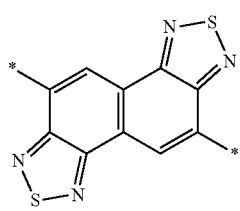

wherein, in Chemical Formula 2-7,
* is a portion linked to an adjacent moiety; and

[Chemical Formula 2-8]

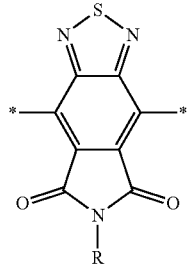

wherein, in Chemical Formula 2-8,
* is a portion linked to an adjacent moiety and R is one of independently hydrogen, a substituted or unsubstituted aliphatic hydrocarbon group, and a substituted or unsubstituted aromatic hydrocarbon group.

According to example embodiments, an electronic device includes the polymer of example embodiments.

According to example embodiments, an organic thin film transistor includes a gate electrode, an insulating layer on the gate electrode, a semiconductor layer on the insulating layer, the semiconductor layer including the polymer of example embodiments, and a source electrode and a drain electrode linked to the semiconductor layer.

According to example embodiments, conjugated polymers with a molecular design are provided as a stretchable semiconductor for a new generation of wearable electronics. The molecular design rules for relatively high charge carrier transport semiconducting polymers conflict with requirements for stretchable and mechanically robust materials. However, the aforementioned example embodiments may present a conjugated polymer design concept for enhancing the dissipation of tensile energy during stretching while maintaining a relatively high charge transport ability. Non-conjugated hydrogen bonding moieties have been inserted within the backbone of relatively high-charge carrier mobility polymers as dynamic moieties allowing the polymer to not only recover relatively high mobility (>1 $cm^2/Vs$) upon stretching but also to repair via a healing process designed to activate the hydrogen bond reformation.

Thus, the improved mechanical properties of the aforementioned stretchable semiconductors, linked to other stretchable electronic components, may lead to the fabrication of skin-inspired stretchable organic transistors including stretchable materials. The polymer according to example embodiments may open the way to future development of fully stretchable and healable devices which may play important roles in skin-inspired electronics.

BRIEF DESCRIPTION OF THE DRAWINGS

The patent or application file contains at least one drawing executed in color. Copies of this patent or patent application publication with color drawing(s) will be provided by the Office upon request and payment of the necessary fees.

The above and other advantages and features of this disclosure will become more apparent by describing example embodiments thereof in further detail with reference to the accompanying drawings, in which.

DETAILED DESCRIPTION

Figure 1:
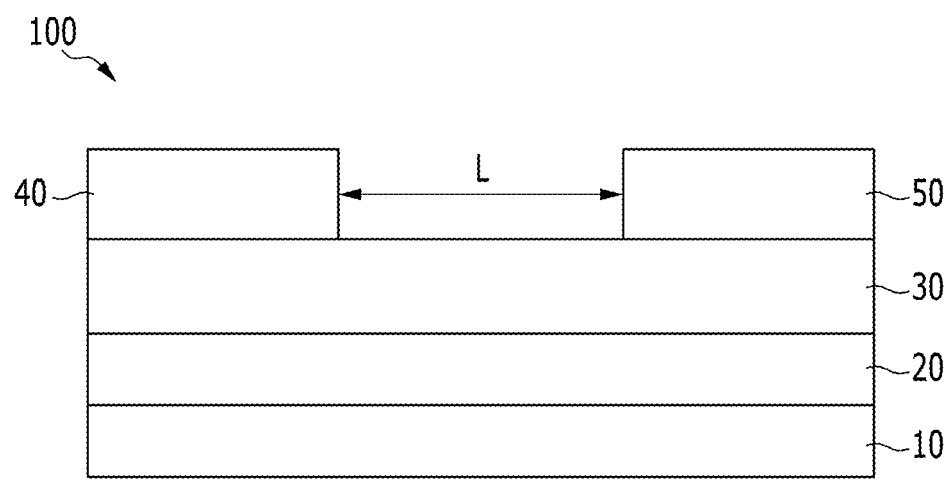
FIG. 1 is a schematic cross-sectional view of a thin film transistor according to example embodiments.

Example embodiments will now be described more fully with reference to the accompanying drawings, in which some example embodiments are shown. Example embodiments, may, however, be embodied in many different forms and should not be construed as being limited to example embodiments set forth herein; rather, these example embodiments are provided so that this disclosure will be thorough and complete, and will fully convey the scope of example embodiments of inventive concepts to those of ordinary skill in the art. Therefore, in some example embodiments, well-known process technologies may not be explained in detail in order to avoid unnecessarily obscuring of aspects of the example embodiments. If not defined otherwise, all terms (including technical and scientific terms) in the specification may be defined as commonly understood by one skilled in the art. The terms defined in a generally-used dictionary are not to be interpreted ideally or exaggeratedly unless clearly defined. It will be further understood that terms, such as those defined in commonly used dictionaries, can be interpreted as having a meaning that is consistent with their meaning in the context of the relevant art and the present disclosure, and will not be interpreted in an idealized or overly formal sense unless expressly so defined herein. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise. Thus the singular forms "a," "an," and "the" are intended to include the plural forms, including "one or more," unless the content clearly indicates otherwise.

In the drawings, the thickness of layers, films, panels, regions, etc., are exaggerated for clarity. Like reference numerals designate like elements throughout the specification.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. "Or" means "and/or." As used herein, the term "and/or" includes any and all combinations of one or more of the associated listed items. It will be further understood that the terms "comprises" and/or "comprising," or "includes" and/or "including," when used in this specification, specify the presence of stated features, regions, integers, steps, operations, elements, and/or components, but do not preclude the presence or addition of one or more other features, regions, integers, steps, operations, elements, components, and/or groups thereof. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to the case where at least one of hydrogen atoms of a given group or a compound is substituted with a substituent selected from a $C_1$ to $C_{30}$ alkyl group, a $C_2$ to $C_{30}$ alkynyl group, a $C_6$ to $C_{30}$ aryl group, a $C_7$ to $C_{30}$ alkylaryl group, a $C_1$ to $C_{30}$ alkoxy group, a $C_1$ to $C_{30}$ heteroalkyl group, a $C_3$ to $C_{30}$ heteroalkylaryl group, a $C_3$ to $C_{30}$ cycloalkyl group, a $C_3$ to $C_{15}$ cycloalkenyl group, a $C_6$ to $C_{30}$ cycloalkynyl group, a $C_2$ to $C_{30}$ heterocycloalkyl group, a halogen (one of —F, —Cl, —Br, and —I), a hydroxy group (—OH), a nitro group (—NO$_2$), a cyano group (—CN), an amino group (—NRR', wherein R and R' are independently hydrogen or a $C_1$ to $C_6$ alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a $C_1$ to $C_6$ alkyl group or a $C_6$ to $C_{12}$ aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, the term "hetero" refers to the case where one to three heteroatoms being selected from N, O, S, Si, Se, and P are included in a given group or a given compound.

As used herein, the term "alkylene group" may refer to a straight or branched saturated aliphatic hydrocarbon group that has a valence of at least two and may optionally have at least one substituent. The term "arylene group" may refer to a functional group having a valence of at least two that is obtained by removal of at least two hydrogens in at least one aromatic ring and may optionally have at least one substituent.

As used herein, the term "deformation" may refer to elastic or plastic deformation. The term "deformation" may include flexural deformation, elongational deformation, twist deformation, shear deformation, compression deformation, or a combination thereof.

As used herein, the term "conjugated system" refers to a system (a moiety) of connected p-orbitals with delocalized electrons in molecules with alternating single and multiple bonds (e.g., a double bond), which in general may lower the overall energy of the molecule and increase stability. The moiety may be cyclic, acyclic, linear, or mixed.

In example embodiments, the polymer includes a first repeating unit including at least one first conjugated system, and a second repeating unit including at least one second conjugated system and a multiple hydrogen bonding moiety that is linked to the second conjugated system. The first repeating unit may consist of the at least one first conjugated system. The first repeating unit and the second repeating unit are linked to each other to form a backbone of the polymer. The multiple hydrogen bonding moiety may be included in the backbone of the polymer.

In the polymer of example embodiments, the first conjugated system included in the first repeating unit and the second conjugated system included in the second repeating unit may provide abundant delocalized electrons with the backbone to allow the polymer to have enhanced charge carrier transport ability.

The first conjugated system and the second conjugated system may be the same or different, and may include at least one being selected from a moiety represented by Chemical Formula 2-1, a moiety represented by Chemical Formula 2-2, a moiety represented by Chemical Formula 2-3, a moiety represented by Chemical Formula 2-4, a moiety represented by Chemical Formula 2-5, a moiety represented by Chemical Formula 2-6, a moiety represented by Chemical Formula 2-7, and a moiety represented Chemical Formula 2-8:

[Chemical Formula 2-1]

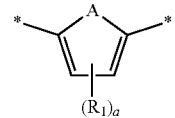

wherein A is one of O, S, and NH, $R_1$ is one of a substituted or unsubstituted aliphatic hydrocarbon group (e.g., one of a substituted or unsubstituted $C_1$ to $C_{40}$ alkyl group, a substituted or unsubstituted $C_2$ to $C_{40}$ alkenyl group, and a substituted or unsubstituted $C_2$ to $C_{40}$ alkynyl group); a substituted or unsubstituted aromatic hydrocarbon group (e.g., a substituted or unsubstituted $C_6$ to $C_{20}$ aryl group); and a halogen (e.g., F—, Cl, Br—, and I—), a is an integer of 0 to 2, and * is a portion linked to an adjacent moiety (e.g., an adjacent conjugated system or a multiple hydrogen bonding moiety);

[Chemical Formula 2-2]

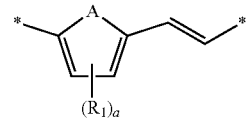

wherein A is one of O, S, and NH, $R_1$ is one of a substituted or unsubstituted aliphatic hydrocarbon group (e.g., one of a substituted or unsubstituted $C_1$ to $C_{40}$ alkyl group, a substituted or unsubstituted $C_2$ to $C_{40}$ alkenyl group, and a substituted or unsubstituted $C_2$ to $C_{40}$ alkynyl group), a substituted or unsubstituted aromatic hydrocarbon group (e.g., a substituted or unsubstituted $C_6$ to $C_{20}$ aryl group), and a halogen (e.g., F—, Cl, Br—, and I—), a is 0 to 2, and * is a portion linked to an adjacent moiety (e.g., an adjacent conjugated system or a multiple hydrogen bonding moiety);

[Chemical Formula 2-3]

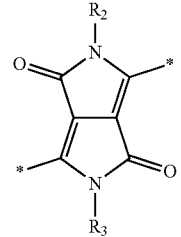

wherein each of $R_2$ and $R_3$ is one of hydrogen, a substituted or unsubstituted aliphatic hydrocarbon group (e.g., a substituted or unsubstituted $C_1$ to $C_{40}$ alkyl group, a substituted or unsubstituted $C_2$ to $C_{40}$ alkenyl group, and a substituted or unsubstituted $C_2$ to $C_{40}$ alkynyl group) and a substituted or unsubstituted aromatic hydrocarbon group (e.g., a substituted or unsubstituted $C_6$ to $C_{20}$ aryl group), and * is a portion linked to an adjacent moiety (e.g., an adjacent conjugated system or a multiple hydrogen bonding moiety);

[Chemical Formula 2-4]

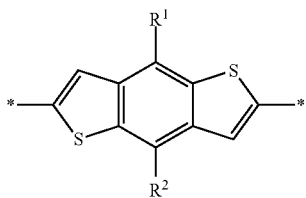

wherein each of $R^1$ and $R^2$ is independently one of hydrogen, a substituted or unsubstituted aliphatic hydrocarbon group (e.g., a substituted or unsubstituted $C_1$ to $C_{40}$ alkyl group, a substituted or unsubstituted $C_2$ to $C_{40}$ alkenyl group, and a substituted or unsubstituted $C_2$ to $C_{40}$ alkynyl group), and a substituted or unsubstituted aromatic hydrocarbon group (e.g., a substituted or unsubstituted $C_6$ to $C_{20}$ aryl group), and * is a portion linked to an adjacent moiety (e.g., an adjacent conjugated system or a multiple hydrogen bonding moiety);

[Chemical Formula 2-5]

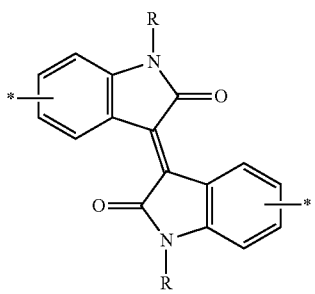

wherein each R is independently one of hydrogen, a substituted or unsubstituted aliphatic hydrocarbon group (e.g., a substituted or unsubstituted $C_1$ to $C_{40}$ alkyl group, a substituted or unsubstituted $C_2$ to $C_{40}$ alkenyl group, or a substituted or unsubstituted $C_2$ to $C_{40}$ alkynyl group), and a substituted or unsubstituted aromatic hydrocarbon group (e.g., a substituted or unsubstituted $C_6$ to $C_{20}$ aryl group), and * is a portion linked to an adjacent moiety (e.g., an adjacent conjugated system or a multiple hydrogen bonding moiety);

[Chemical Formula 2-6]

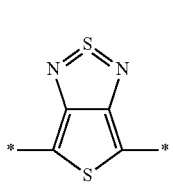

wherein * is a portion linked to an adjacent moiety (e.g., an adjacent conjugated system or a multiple hydrogen bonding moiety);

[Chemical Formula 2-7]

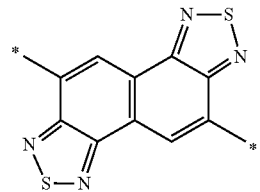

wherein * is a portion linked to an adjacent moiety (e.g., an adjacent conjugated system or a multiple hydrogen bonding moiety); and

[Chemical Formula 2-8]

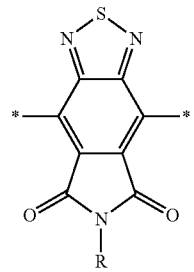

wherein * is a portion linked to an adjacent moiety (e.g., an adjacent conjugated system or a multiple hydrogen bonding moiety) and R is one of independently hydrogen, a substituted or unsubstituted aliphatic hydrocarbon group (e.g., a substituted or unsubstituted $C_1$ to $C_{40}$ alkyl group, a substituted or unsubstituted $C_2$ to $C_{40}$ alkenyl group, or a substituted or unsubstituted $C_2$ to $C_{40}$ alkynyl group), and a substituted or unsubstituted aromatic hydrocarbon group (e.g., a substituted or unsubstituted $C_6$ to $C_{20}$ aryl group).

In addition to the aforementioned moieties, the first conjugated system may further include one of a substituted or unsubstituted phenylene group, a substituted or unsubstituted thiazoline group, a substituted or unsubstituted pyridine group, a substituted or unsubstituted naphthalene group, a substituted or unsubstituted anthracene group, a substituted or unsubstituted naphthacene group, a substituted or unsubstituted fluorene group, a substituted or unsubstituted carbazole group, a substituted or unsubstituted thienothiophene group, a substituted or unsubstituted thieno benzothiophene group, and a combination thereof.

The conjugated polymer semiconductor including the first conjugated system and the second conjugated system may show enhanced charge mobility. However, the design guideline for increasing the charge mobility in the polymer conflicts with the design rules for improving the stretchability and other mechanical properties of the polymer. Therefore, most conjugated polymer semiconductors having a required level of charge mobility tend to show undesirable stretchability due to their relatively high rigidity and crystallinity. When being stretched, such conjugated polymer semiconductors may suffer a change of their backbone and a change of crystalline regions bound by the interaction between the backbones, which may be unfavorable to the charge movement and thereby lead to a decrease in their electrical properties.

The polymer according to example embodiments has the second repeating unit including a multiple hydrogen bonding moiety that may form a dynamic bond in its backbone. Accordingly, the polymer may show improved stretchability while minimizing a decrease in the electrical properties. The multiple hydrogen bonding moiety may be disposed between the second conjugated systems. The multiple hydrogen bonding moiety is represented by Chemical Formula 1:

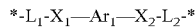   [Chemical Formula 1]

wherein each of $L_1$ and $L_2$ are the same or different, and are independently one of a direct bond and a $C_1$ to $C_5$ substituted or unsubstituted alkylene group (e.g., methylene, ethylene, propylene, or butylene), each of $X_1$ and $X_2$ are the same or different, and are independently one of amide, urea, carbamate, —CO—, —OCO—, —NH—, and a combination thereof, $Ar_1$ is a heteroaromatic group (e.g., a pyridine moiety, a bipyridine moiety, a phenanthroline moiety, a phenyl moiety, a thiophene moiety, or a pyrrole moiety), and * is a portion that is linked to an adjacent second conjugated system.

The multiple hydrogen bonding moiety may be represented by Chemical Formula 1-1:

[Chemical Formula 1-1]

wherein each R is independently one of hydrogen and a $C_1$ to $C_{10}$ alkyl group, $Ar_1$ is one of a pyridine moiety, a bipyridine moiety, a phenanthroline moiety, a phenyl moiety, a thiophene moiety, and a pyrrole moiety, and n is 0 or an integer of at least one, for example 1, 2, 3, 4, 5, or higher. In light of the electrical properties of the polymer, n may be an integer of less than or equal to about 10.

Due to the aforementioned structure, the polymer of example embodiments may control intermolecular interactions between polymer chains and guide the molecular arrangement towards a desirable morphology. Without wishing to be bound by any theory, in the polymers of example embodiments, the multiple hydrogen bonding moiety may effectively incorporate non-covalent bonding between polymer chains and this may lead to relatively high stretchability and self-healing properties. Such non-covalent interactions within materials may contribute to the formation of a dynamic network. By incorporating dynamic bonds that can be easily broken and reformed, the energy dissipation upon strain may be enhanced, thus enabling the material to be more tolerant to stress and mechanical stimuli. In the polymer of example embodiments, the dynamic hydrogen bond may be formed without the need of catalyst, additives, or external driving forces. In addition, the multiple hydrogen bonding moiety may heal mechanical damage via bond reformation. This healing ability is an essential and advantageous property for material regeneration upon damage, which is highly desirable in skin-inspired electronics.

According to example embodiments, the conjugated backbone of the polymer includes the multiple hydrogen bonding moiety of Chemical Formula 1 as a non-conjugated dynamic bond, making it possible for the polymer to maintain a relatively high level of charge carrier mobility while showing enhanced stretchability and healing properties.

The polymer may consist of the first repeating unit and the second repeating unit. The mole ratio between the first repeating unit and the second repeating unit may be from 1:0.01 to 1:30. For example, the mole ratio between the first repeating unit and the second repeating unit may be from 95:5 to 80:20. Within such a range, the polymer may show further enhanced stretchability together with relatively high electrical properties.

The polymer may include an alternating copolymer, a block copolymer, or a random copolymer. In example embodiments, the polymer may include a random copolymer.

The copolymer may be represented by Chemical Formula 3:

[Chemical Formula 3]

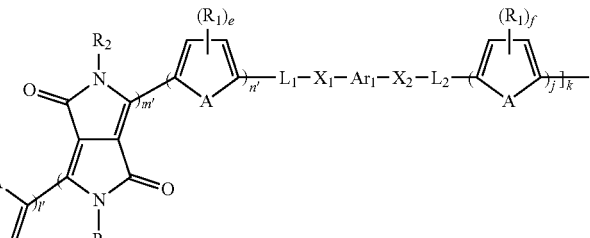
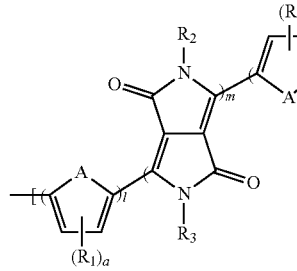

wherein each $R_1$ is independently one of a substituted or unsubstituted aliphatic hydrocarbon group (e.g., a substituted or unsubstituted $C_1$ to $C_{40}$ alkyl, a substituted or unsubstituted $C_2$ to $C_{40}$ alkenyl, or a substituted or unsubstituted $C_2$ to $C_{40}$ alkynyl), a substituted or unsubstituted aromatic hydrocarbon group (e.g., a substituted or unsubstituted $C_6$ to $C_{20}$ aryl), and a halogen (e.g., F, Cl, Br, and I), each of $R_2$ and $R_3$ is independently one of hydrogen, a substituted or unsubstituted aliphatic hydrocarbon group (e.g., a substituted or unsubstituted $C_1$ to $C_{40}$ alkyl, a substituted or unsubstituted $C_2$ to $C_{40}$ alkenyl, and a substituted or unsubstituted $C_2$ to $C_{40}$ alkynyl), and a substituted or unsubstituted aromatic hydrocarbon group (e.g., a substituted or unsubstituted $C_6$ to $C_{20}$ aryl), each A is independently one of O, S, and NH, each of a, b, c, d, e, and f is independently 0 to 2, each of l, m, n, and o is independently 0 to 10, all of l, m, n, and o cannot be 0 simultaneously, each of l', m', and n' is independently 0 to 10, all of l', m', and n' cannot be 0 simultaneously, j is 1 to 10, k is a number representing the mole ratio of the second repeating unit in the polymer and is 0.03 to 0.5, for example, 0.04 to 0.40 or about 0.05 to about 0.30, each of $L_1$ and $L_2$ are the same or different and are independently one of a direct bond and a $C_1$ to $C_5$ substituted or unsubstituted alkylene group, each of $X_1$ and $X_2$ are the same or different and are independently one of amide, urea, carbamate, —CO—, —OCO—, —NH—, and a combination thereof, and $Ar_1$ is a heteroaromatic group.

In example embodiments, the polymer may have a diketopyrrolopyrrole (DPP) unit. The DPP unit may assist the polymer to have relatively high charge mobility when the polymer is processed into a thin film. In order to generate and facilitate dynamic bonds between the polymer chains, a non-conjugated nitrogen-containing heteroarylene dicarboxamide (e.g., non-conjugated 2,6-pyridine dicarboxamide: PDCA) moiety may be directly introduced into the polymer backbone. The introduction of such a moiety as side-chains may result in undesirable solubility and difficulty in processing, however, the polymer of example embodiments includes the same directly introduced in the polymer backbone and thereby may avoid such problems. In case of the aforementioned system including the hydrogen bonding or a metal ligand, PDCA may serve as an attractive motif to promote hydrogen bonding within the polymer backbone. For example, in PDCA, the presence of a plurality (e.g., at least two) of amide functionalities may increase the amount of possible hydrogen bonding sites. Additionally, amide groups possess a relatively moderate H-bonds strength which allows bonding with PDCA units contained in nearby chains without dramatically increasing the tensile modulus of the material. Moreover, the nitrogen containing heteroarylene (e.g., the pyridine unit) may bring some polarity and rigidity, which helps optimize the geometry for efficient hydrogen bonding. Up to now, the disruption of conjugation by non-conjugated building blocks has been believed will lead to detrimental degradation of the overall device performances. However, in the polymer of example embodiments, alkylene spacer (e.g., $L_1$ and $L_2$) for example, ethyl spacers may be introduced for enhancing the flexibility of the dynamic moieties without showing any detrimental loss of the overall device performances.

The polymer of example embodiments may further include a metal ion. Examples of the metal ion may include, but are not limited to, an iron ion, a zinc ion, a manganese ion, a nickel ion, a copper ion, a palladium ion, a platinum ion, and an iridium ion. For the inclusion of the metal ion, the heteroarylene group of $Ar_1$ in the Chemical Formula 1 may include at least two heteroatoms. For example, the $Ar_1$ may include a bipyridine moiety.

The polymer according to example embodiments may show a relatively high level of electrical properties despite the presence of the second repeating unit. For example, the polymer may show field effect mobility of greater than or equal to about 0.1 $cm^2/Vs$, for example, greater than or equal to about 0.2 $cm^2/Vs$, greater than or equal to about 0.3 $cm^2/Vs$, greater than or equal to about 0.4 $cm^2/Vs$, greater than or equal to about 0.5 $cm^2/Vs$, greater than or equal to about 0.6 $cm^2/Vs$, greater than or equal to about 0.7 $cm^2/Vs$, greater than or equal to about 0.8 $cm^2/Vs$, greater than or equal to about 0.9 $cm^2/Vs$, or even greater than or equal to about 1 $cm^2/Vs$. For example, the polymer may have an on/off current ratio of greater than or equal to about $10^4$, for example, greater than or equal to about $10^5$, or even greater than or equal to about $10^6$.

In the polymer of example embodiments, the presence of the hydrogen bonding may be confirmed by X-ray crystallography (e.g., grazing incidence XRD patterns). From the X-ray crystallography, when the polymer is formed into a thin film on a substrate having a polar group (e.g., $SiO_2$), the polymer may have orientation of lamellar stacking that adopts a face-on orientation due to the affinity between the polar substrate and the amide contained in the backbone. Such structures may contribute the improvement of the polymer stretchability.

According to example embodiments, the polymer may show enhanced properties when it is prepared as a thin film. Evaluation of the stretching property of the thin film including the polymer may be conducted on a film having a thickness of about 100 nm supported on a PDMS substrate. During the evaluation of the stretching property, the polymer of example embodiments does not show any microscale cracks determined by an optical microscope when it is subjected to a strain cycle of 0% to 100%.

In addition, the polymer may show a decreased value of elastic modulus due to the introduction of the multiple hydrogen bonding moiety. In example embodiments, the polymer may have an elastic modulus of less than or equal to about 10 GPa, for example, less than or equal to about 9 GPa, or less than or equal to about 8 GPa, as measured by a buckling method. In example embodiments, the elastic modulus of the polymer may be greater than or equal to about 3 GPa, for example, greater than or equal to about 4 GPa. The intermolecular H bondings may essentially cross-link the polymers, and in theory, should increase the elastic modulus of the polymer film. However, the polymers of example embodiments may show a lower elastic modulus than that of their counterparts. Without wishing to be bound by any theory, the breaking of conjugation may result in the reduction of the rigidity of the conjugated polymer backbone, which may have an effect on the elastic modulus of the polymer film. The lowering of the elastic modulus may be attributed to the increase in the amorphous fraction in the polymer film and decrease in relative crystallinity, as characterized by GIXD analysis. A lower elastic modulus may assert a lower strain on the material under the same strain. This allows the material to be stretched to higher strains before cracks form.

In example embodiments, the polymer may have a dichroic ratio of greater than or equal to about 1.2 (e.g., about 1.25 or higher, or about 1.3 or higher) at 50% strain. The degree of polymer chain alignment under strain may be measured using polarized UV-vis spectroscopy and quantified using dichroic ratios, defined as $\alpha_{//}/\alpha_\perp$, where $\alpha_{//}$ and $\alpha_\perp$ are absorption intensity measured with the polarization direction of light parallel and perpendicular to the stretching direction, respectively. For example, a dichroic ratio of greater than 1 indicates polymer chain alignment upon strain, and its value is expected to steadily increase if no cracks are formed. When strain is released through crack formation, the rate of dichroic ratio increase will decrease, and in some cases, the dichroic ratio may relax to close to 1. In the polymer of example embodiments, the crack formation may be suppressed even under the 50% strain and thus the polymer may show a dichroic ratio of greater than or equal to about 1.2.

GIXRD analysis may further examine the molecular-level information of the polymers under strain. The change of relative degree of crystallinity (rDoC) can be used to determine the impact of strain on crystalline domains through either domain breakage due to chain sliding or increase in crystallinity due to strain-induced crystallization (calculated from the pole figure). The rDoC of the conjugated polymer that includes the same conjugated system as the polymer of example embodiments but does not include the multiple hydrogen bonding moiety may be observed to decrease with strain of up to 25%. This observation indicates that the tensile strain applied on the thin film was initially released through breakage of the crystalline regions until cracks started to form at above 25% strain. In contrast, however, as measured by GIXRD, the rDoC of the polymer of example embodiments (e.g., the polymer of example embodiments with 10 mol % multiple hydrogen bonding moieties, for example, PDCA moieties) may be decreased steadily from 0% to 100% strain. When strain was released and the film returns to 0% strain, the rDoC may be partially recovered, indicating some of the crystalline domains may be permanently broken apart due to strain. On the other hand, the crystallite coherence length calculated from the full-width at half maximum (FWHM), the orientation of crystallites and crystalline packing spacings may not be unchanged by stretching. This observation, combined with the steady increase in dichroic ratio observed by polarized UV-vis spectroscopy, suggests that the polymer of example embodiments may have multiple mechanisms for energy dissipation during strain: stretching and alignment of polymer chains in amorphous regions and breaking of some of the crystalline domains.

In the polymer of example embodiments, an additional energy dissipation mechanism may be expected through H-bonding breakage. The polymer according to example embodiments includes the non-conjugated, multiple hydrogen bonding moiety between the conjugated system and thus may show an increase in dichroic ratio under a strain even as high as 100%. In contrast, introduction of the non-conjugated system having no hydrogen bonding moiety may show an increase of dichroic ratio up to a given or predetermined (e.g., about 30%) strain, above which the dichroic ratio does not increase due to the occurrence of the crack. In addition, the conjugated polymer including the non-conjugated moiety with no hydrogen bonding site shows a decrease in the relative crystallinity. This result implies that in the conjugated polymer including the non-conjugated moiety with no hydrogen bonding site, the energy is dissipated mostly through the breaking of crystallites.

The molecular weight of the polymer may be appropriately selected and is not particularly limited. For example, the number average molecular weight of the copolymer may be greater than or equal to about 3 kDa, for example, greater than or equal to about 5 kDa, or greater than or equal to about 10 kDa, but is not limited thereto. The number average molecular weight of the copolymer may be less than or equal to about 1000 kDa, for example, less than or equal to about 500 kDa, less than or equal to about 100 kDa, less than or equal to about 50 kDa, less than or equal to about 40 kDa, or less than or equal to about 30 kDa, but is not limited thereto. The number average molecular weight may be determined by relatively high temperature size exclusion chromatography (SEC).

The polymer may be prepared by a method that includes: preparing a first monomer for the first repeating unit; preparing a second monomer for the second repeating unit; and conducting a polymerization reaction of the first monomer and the second monomer.

The first monomer may be any compound having a first conjugated system and having a reactive group capable of reacting with the first monomer and the second monomer. Such compounds may be prepared in any known method or are commercially available. Examples of the first monomer may include, but are not limited to, the compounds represented by any of Chemical Formulae M1-1 to M1-8:

[Chemical Formula M1-1]

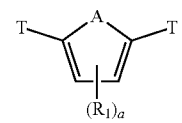

wherein A, $R_1$, and a are the same as defined in Chemical Formula 2-1, and T is a reactive group;

[Chemical Formula M1-2]

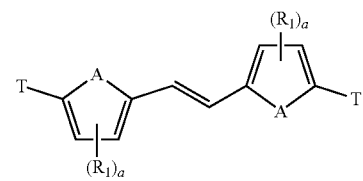

wherein A, $R_1$, and a are the same as defined in Chemical Formula 2-2, and T is a reactive group;

[Chemical Formula M1-3]

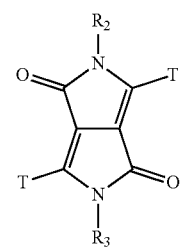

wherein $R_2$ and $R_3$ are the same as defined in Chemical Formula 2-3, and T is a reactive group;

[Chemical Formula M1-4]

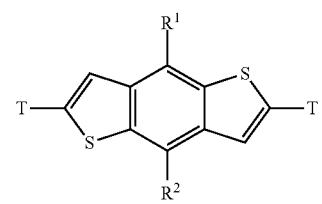

wherein $R^1$ and $R^2$ are the same as defined in Chemical Formula 2-4, and T is a reactive group;

[Chemical Formula M1-5]

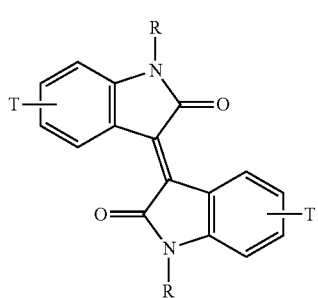

wherein R is the same as defined in Chemical Formula 2-5, and T is a reactive group;

[Chemical Formula M1-6]

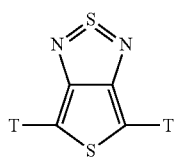

wherein T is a reactive group;

[Chemical Formula 1-7]

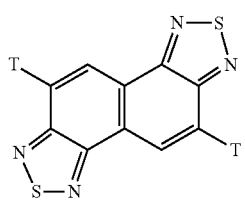

wherein T is a reactive group; and

[Chemical Formula M1-8]

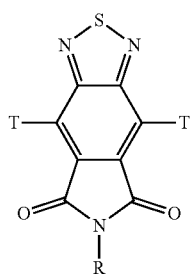

wherein R is the same as defined in Chemical Formula 2-8, and T is a reactive group.

The reactive group of the first monomer may include a halide (—F, —Cl, —Br, or —I) and/or R(Sn) [wherein R is a $C_1$ to $C_{10}$ alkyl group].

The second monomer may be any compound including the second conjugated system and the multiple hydrogen bonding moiety. Such compounds may be prepared in any known method or are commercially available. Examples of the second monomer may include a compound represented by Chemical Formula M2-1, but are not limited thereto:

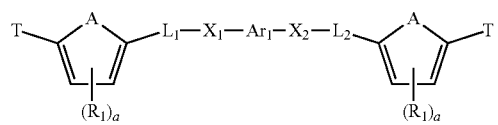

wherein $L_1$, $L_2$, $X_1$, $X_2$, and $Ar_1$ are the same as defined in Chemical Formula 1-1, A, $R_1$, and a are the same as defined in Chemical Formula 2-1, and T is a reactive group.

The reactive group of the second monomer may include a halide (—F, —Cl, —Br, or —I) and/or R(Sn) [wherein R is a $C_1$ to $C_{10}$ alkyl group].

The polymerization reaction may involve Stille reaction. The Stille reaction, also called Migita-Kosugi-Stille coupling, is a chemical reaction widely used in organic synthesis which involves the coupling of an organotin compound (also known as organostannanes) with a variety of organic electrophiles, for example, via palladium-catalyzed coupling reaction. Specific conditions (e.g., a catalyst, a temperature, a solvent, a reaction time, an atmosphere, etc.) for the Stille reaction may be appropriately selected. For example, the polymerization catalyst for the polymerization involving the Stille reaction may include tetrakis(triphenylphosphine), tris (dibenzylidene aceton)dipalladium, tri(o-toyl)phosphine, or a combination thereof, but is not limited thereto. The solvent for polymerization may include chlorobenzene, but is not limited thereto. For example, the polymerization involving the Stille reaction may be conducted at a temperature of about 100° C. to about 180° C. for a time of greater than or equal to about 10 min and less than or equal to about 48 h, but is not limited thereto. The conditions for the polymerization may be adjusted and selected appropriately in light of types of the monomer, a desired molecular weight of the polymer, etc.

In example embodiments, the polymer may be prepared into a thin film. The thin film may be included in a semiconductor layer of an electronic device (e.g., an organic thin film transistor).

As an example of the electronic device, the organic thin film transistor may include a gate electrode, an insulating layer disposed on the gate electrode, a semiconductor layer disposed on the insulating layer and including the aforementioned polymer, a source electrode, and a drain electrode, wherein the source electrode and the drain electrode are electrically connected to the semiconductor layer.

In non-limiting examples, referring to FIG. 1, the organic thin film transistor 100 includes a substrate 10, an insulator 20, a semiconductor layer 30, a source electrode 40, and a drain electrode 50.

The substrate 10 may be in contact with the gate electrode. The substrate may serve as a gate electrode as a whole. Alternatively, a portion of the substrate may be doped to form the gate electrode. The gate electrode may include a liquid metal. Alternatively, the gate electrode may be an electrically conductive layer (e.g., a CNT layer) disposed on an electrically insulating substrate (e.g., a polymer substrate such as PDMS, SEBS, polyester, polycarbonate, polyimide, etc).

The semiconductor layer 30 may have a first surface and a second surface opposing each other. The source electrode and the drain electrode may be disposed on the first surface of the semiconductor layer, and the second surface may face the insulating layer. The semiconductor layer includes the aforementioned polymer according to example embodiments. The semiconductor layer may further include a binder, a solvent, or a compound such as dopants, all of which may be used in the semiconductor layer of the organic thin film transistor. In the semiconductor, the amount of the aforementioned polymer of example embodiments may be greater than or equal to about 1 vol %, for example, greater than or equal to about 10 vol %, greater than or equal to about 50 vol %, or even 100 vol %.

In non-limiting examples, the polymer of example embodiments may be dissolved in a suitable solvent (e.g., chloroform) to obtain a solution, which is then applied on an insulating layer via any appropriate methods (e.g., spin coating) to form a semiconductor layer. The semiconductor layer thus formed may be dried at a given or predetermined temperature.

The semiconductor layer may have a channel having a length (L) (corresponding to a gap between the source and the drain electrodes) and a width (W) (corresponding to a size perpendicular to the length).

In the organic thin film transistor, the size of each element may be appropriately selected and is not particularly limited. For example, the substrate has a thickness of about 10 μm to about 10 mm or higher, but is not limited thereto. In case of a flexible plastic substrate, the thickness may be between about 50 um and about 100 um. In case of a rigid substrate such as glass or silicon, the thickness may be from about 1 mm to about 10 mm, but is not limited thereto.

The thickness of the semiconductor layer may be greater than or equal to about 10 nm, for example, greater than or equal to about 20 nm and less than or equal to about 1 mm, for example, less than or equal to about 200 nm, but is not limited thereto. The width (W) of the channel of the semiconductor layer may be less than or equal to about 5 mm, for example, less than or equal to about 1 mm and greater than or equal to about 10 um, for example, greater than or equal to about 100 um, but is not limited thereto. The length of the channel of the semiconductor layer may be greater than or equal to about 0.1 um, for example, greater than or equal to about 1 um and less than or equal to about 1 mm, for example, less than or equal to about 100 um, but is not limited thereto.

The gate electrode, the source electrode, and the drain electrode may include an appropriate conductive material. For example, the gate electrode may include a metal thin film, a conductive polymer film, a conductive film fabricated from a conductive ink or paste, or doped silicon, but is not limited thereto. Examples of the gate electrode material may include, but are not limited to, aluminum, gold, silver, chrome, indium oxide, tin, a conductive polymer such as polystyrene-poly(3,4-ethylene dioxythiophene) (PSS-PEDOT), carbon black/graphite in a polymeric binder, or a conductive ink/paste such as a colloidal silver dispersion or a Ag ink, etc. A layer of the gate electrode may be prepared via vacuum vapor deposition or sputtering of a metal or a conductive metal oxide, coating of a conductive polymer solution or a conductive ink via spin coating, casting, or printing, or a doping of a substrate. The thickness of the gate electrode is not particularly limited, and may be appropriately selected. For example, the thickness of the gate electrode including the metal thin film may be greater than or equal to about 10 nm and less than or equal to about 200 nm, but is not limited thereto. The thickness of the gate electrode including a polymeric conductor may be greater than or equal to about 1 um and less than or equal to about 10 um, but is not limited thereto. The thickness of the gate electrode including a carbon composite such as CNT may be greater than or equal to about 100 nm (e.g., greater than or equal to about 1 um) and less than or equal to about 10 um, but is not limited thereto.

Examples of materials for a source electrode and a drain electrode may include, but are not limited to, a metal such as gold, nickel, aluminum, and platinum, a conductive polymer, and a conductive ink. The thickness of the source and drain electrodes may be appropriately selected. For example, the thickness of the source (or drain) electrode may be greater than or equal to about 40 nm, for example, greater than or equal to about 100 nm and less than or equal to about 400 um, but is not limited thereto.

The insulating layer 20 separates the gate electrode 10 from the semiconductor layer 30, the source electrode 40, and the drain electrode 50. The insulating layer 20 may include an inorganic material thin film or an organic polymer film. Examples of the inorganic material may include, but are not limited to, silicon oxide, silicon nitride, aluminum oxide, barium titanate, and barium titanate zirconium. Examples of the organic polymer may include, but are not limited to, polyester, polycarbonate, poly(vinyl phenol), polyimide, polystyrene, poly(methacrylate), poly(acrylate), and an epoxy resin. The thickness of the insulating layer may vary with types of the insulating material, and the thickness is not particularly limited. For example, the thickness of the insulating layer may be greater than or equal to about 10 nm, for example, greater than or equal to about 50 nm, or greater than or equal to about 100 nm, but is not limited thereto. The conductivity of the insulating layer may be about $10^{-12}$ S/cm of less, but is not limited thereto.

The gate electrode, the semiconductor layer, the insulating layer, the source electrode, and the drain electrode may be formed in any order without any particular limitation. Specific methods for preparing the same may be appropriately selected.

As an example of the electronic device, the organic thin film transistor has been explained in detail above, but the polymer of example embodiments may be used in any electronic device including a flexible semiconductor layer such as various diodes or organic solar energy conversion devices. In example embodiments, the electronic device may be a stretchable electronic device. For example, the electronic device may be a stretchable organic light emitting diode (OLED) display, a stretchable human motion sensor, a stretchable artificial muscle, a stretchable actuator, or a stretchable semiconductor.

The field effect mobility of the polymer in the electronic device may be greater than or equal to about 0.01 cm$^2$/VS, for example, greater than or equal to about 0.1 cm$^2$/VS, greater than or equal to about 0.5 cm$^2$/VS, greater than or equal to about 0.6 cm$^2$/VS, greater than or equal to about 0.7 cm$^2$/VS, greater than or equal to about 0.8 cm$^2$/VS, greater than or equal to about 0.9 cm$^2$/VS, or greater than or equal to about 1.0 cm$^2$/VS. In the electronic device, the on/off current ratio of the polymer may be greater than or equal to about $10^3$, for example, greater than or equal to about $10^4$, or greater than or equal to about $10^5$.

In addition to such electrical properties, the polymer of example embodiments may have improved stretchability so that the polymer may be stretched by 100% while not completely losing its electrical properties.

Therefore, when the organic thin film transistor of example embodiments is subjected to at least 20% strain (e.g., even 100% strain) in a channel length direction of the semiconductor layer and is released therefrom, a decrease in the field effect mobility of the polymer may be less than or equal to about 30% of its initial mobility prior to being subjected to the strain.

When the organic thin film transistor of example embodiments is subjected to 25% strain for 100 cycles in a channel length direction of the semiconductor layer, a decrease in the field effect mobility of the polymer may be less than or equal to about 50% of its initial mobility prior to being subjected to the strain.

In case of damage to the polymer of example embodiments, the deteriorated properties thereof may be recovered via a given or predetermined treatment. For example, when the polymer is damaged by 100 cycles at 100% and is subjected to at least 10 min of annealing with a vapor including chloroform, dichloromethane, or a combination thereof at a temperature of about 40° C. to about 100° C. and to at least 30 min of heating at a temperature of about 150° C. to about 250° C., the polymer may have field effect mobility of at least 80% of an initial value prior to being damaged.

The dynamic bonds (i.e., the hydrogen bonds) incorporated in the polymer enable the possibility of healing or self-repairing. In addition to increased intrinsic stretchability due to conjugation breaking and incorporation of H bondings, the polymer may have the healing ability for mechanically damaged polymers. However, the polymer of example embodiments is not able to self-heal due to the restricted polymer chain motion as a result of relatively high rigidity from the large fraction of conjugated polymers. Therefore, to facilitate healing ability for damaged polymer films, post-treatments by heating and/or solvent annealing may be required to promote polymer chain movement. According to example embodiments, non-autonomous healing of a relatively high field-effect mobility conjugated polymer after mechanical damage may be confirmed. Without wishing to be bound by any theory, the mechanism of healing is a combination of physical rearrangement of the polymer chains and recovery of the H-bonding site, which enabled the polymer film to recover its ability to tolerate strain. The healed polymer film may present a relatively high dichroic ratio after healing treatments.

Hereinafter, example embodiments are illustrated in more detail with reference to examples. These examples, however, are not in any sense to be interpreted as limiting the scope of this disclosure.

EXAMPLES

Measurement and Characterization

Nuclear magnetic resonance (NMR) spectra are recorded on a Varian Mercury console spectrometer ($^1$H 400 MHz, $^{13}$C 100 MHz). Polymer NMR spectra are recorded at 120° C. in deuterated 1,1,2,2-tetrachloroethane (TCE-$d_2$). Chemical shifts are given in parts per million (ppm) with respect to tetramethylsilane as an internal standard. Number average molecular weight ($M_n$), weight average molecular weight ($M_w$), and polydispersity index (PDI) are evaluated by relatively high temperature size exclusion chromatography (SEC) using 1,2,4-trichlorobenzene and performed under 200° C. on Tosoh High-temperature EcoSEC equipment equipped with a single TSKgel GPC column (GMH$_{HR}$-H; 300 mm×7.8 mm) also calibrated by monodisperse polystyrene standards. Thermogravimetric analyses (TGA) are performed on a TA Instrument Q100 and a Mettler Toledo AG-TGA/SDTA851$^e$ model, respectively. Dynamic mechanical analysis (DMA) is performed on TA Instrument Q800 equipment equipped with a gas cooling accessory and a fiber/film tension modulus. UV Visible spectroscopy is performed with a UV/Visible/NIR Cary 6000i spectrophotometer. The surface structure of the polymer film is obtained with a Nanoscope 3D controller atomic force micrograph (AFM, Digital Instruments) operated in the tapping mode at room temperature. Grazing incidence X-ray diffraction (GIXD) patterns are measured at the Stanford Synchrotron Radiation Lightsource on beamline 11-3 with photon energy of 12.73 keV. To enhance the diffraction intensity and reduce substrate scattering, the angle of incidence is fixed at 0.12°.

All the measurements of the transistors are conducted using a Keithley 4200 semiconductor parameter analyzer (Keithley Instruments Inc., Cleveland, Ohio, USA) under a dry $N_2$ (glovebox) and ambient atmosphere at room temperature.

Materials: Commercial reactants are used without further purification unless stated otherwise. All the solvents used in the reaction are taken out of a solvent purification system. A tris(dibenzylidene acetone)dipalladium(0)-chloroform adduct ($Pd_2(dba)_3.CHCl_3$) is purchased from Sigma Aldrich and recrystallized following the reported procedure. (E)-1,2-bis(5-(trimethylstannyl)thiophen-2-yl)ethene (TVT) and 3,6-bis(5-bromothiophen-2-yl)-2,5-bis(4-decyltetradecyl)-2,5-dihydropyrrolo[3,4-c]pyrrole-1,4-dione are synthesized according to the previous known methods.

Materials Synthesis and Characterization

Synthesis of DPP-based conjugated polymers containing non-conjugated PDCA units in the backbone is carried out via Stille polymerization using different ratios of the second monomer (i.e., PDCA-containing monomers) (see Synthesis Scheme 1 and Synthesis Scheme 2). Branched alkyl chains are installed on the DPP monomer in order to increase solubility and π-π stacking. (E)-2-(2-(thiophenyl-2-yl)vinyl) thiophene (TVT) is selected as a co-monomer. The non-conjugated monomer is reacted with the brominated DPP monomer and the distannylated thienovinylthiophene (TVT) under Stille polymerization conditions to afford polymer P1, polymer P2, polymer P3, and polymer P4.

These polymers are purified by precipitation in methanol followed by Soxhlet extraction using methanol, acetone, hexane, and chloroform. Polymers presented good solubility in different solvents such as chloroform and chlorobenzene. An increase in the non-conjugated moiety content within the backbone also increases the solubility in polar solvents such as THF and DMF. Synthetic procedure for precursors, monomers, and polymers are described in detail as below. Molecular weight, polydispersity index, and characterization of monomers and polymers are summarized below. Thermogravimetric analysis, optical properties, and electronic properties of P1 to P4 are also provided below.

1. Polymer Synthesis
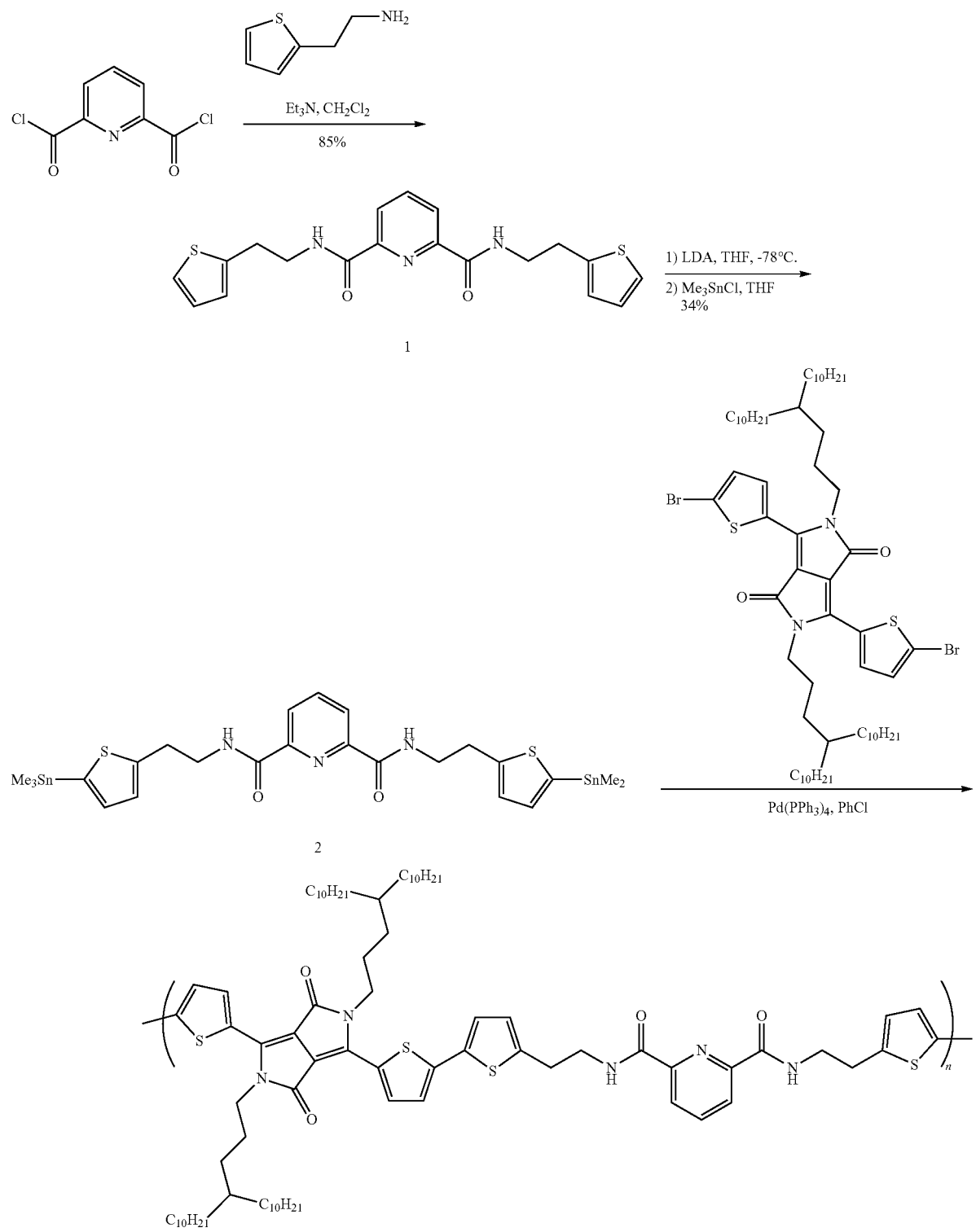
Reaction Scheme 1. Synthetic route for Second Monomer 2 and Model Compound M1

Reaction Scheme S2. Synthetic route for Polymers P1 to P4

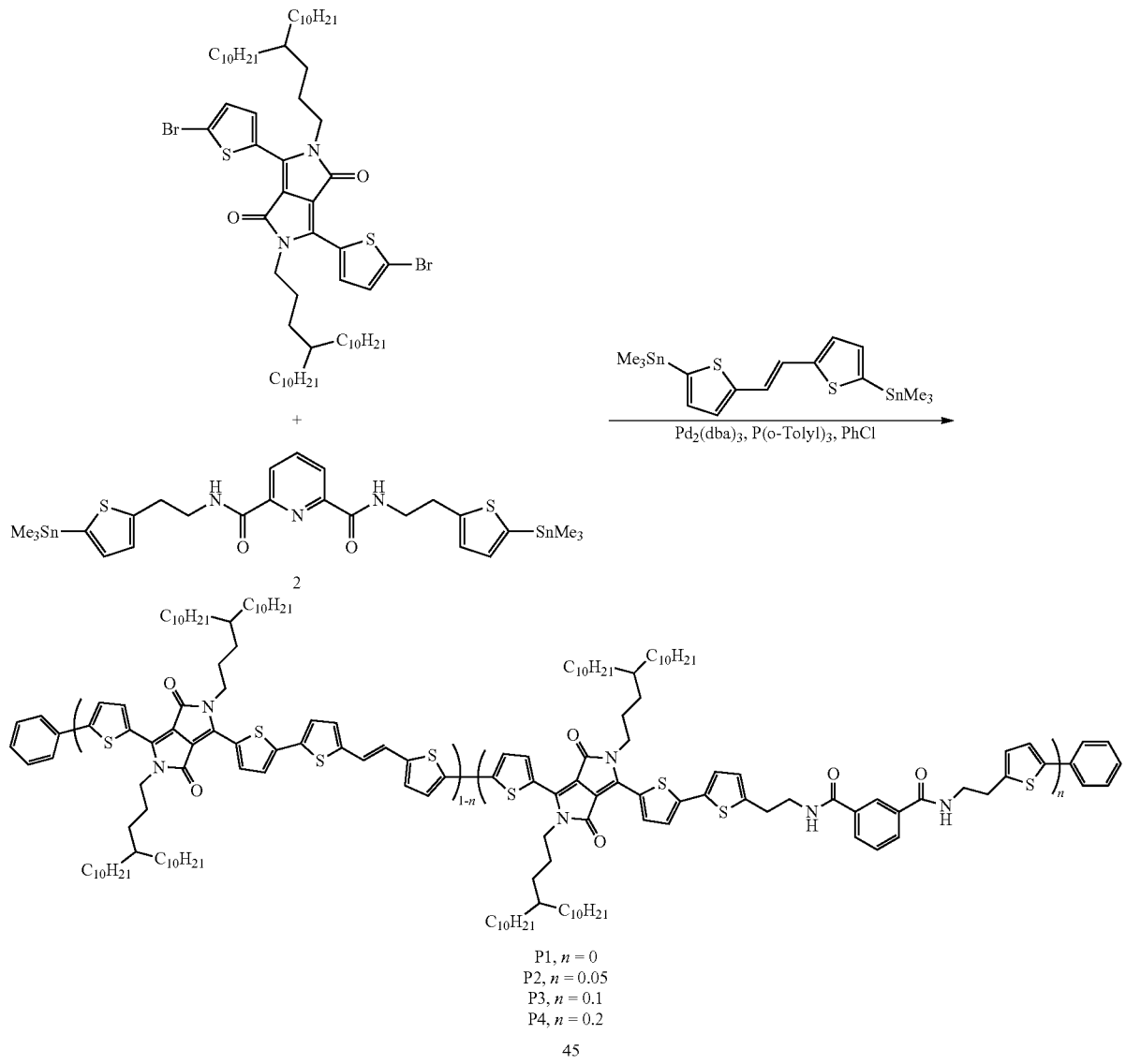

P1, n = 0
P2, n = 0.05
P3, n = 0.1
P4, n = 0.2

Synthesis of Compound 1

A round-bottom flask equipped with a magnetic stir bar is charged with 2,6-pyridinedicarbonyl chloride (3.00 g, 14.7 mmol) and $CH_2Cl_2$ (36 mL). A solution of 2-thiopheneethylamine (4.10 g, 3.78 mmol) and $Et_3N$ (6.4 mL) in $CH_2Cl_2$ (36 mL) is then added dropwise to the previous solution. The mixture is stirred overnight at room temperature and is diluted with $CH_2Cl_2$. Upon completion of the reaction, the organic layer is extracted with $H_2O$ and is washed with a brine solution. The organic layer is then dried with $Na_2SO_4$ and the solvents are removed under reduced pressure. The mixture is purified by flash chromatography on silica gel using hexanes to 30% acetone/hexanes to afford compound 1 having the following structure as a white solid (2.87 g, 85% yield).

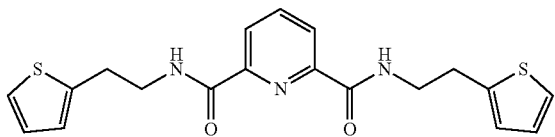 [SMILES: O=C(NCCc1cccs1)c1cccc(C(=O)NCCc2cccs2)n1]

$^1$H NMR (400 MHz, $CDCl_3$, 298 K): 8.45 (t, J=6.5 Hz, 2H), 8.29 (d, J=7.3 Hz, 2H), 7.94 (t, J=7.7 Hz, 1H), 7.04 (dd, J=2.6 Hz, 2H), 6.83 (q, J=4.2 Hz, 2H), 6.72 (d, J=2.1 Hz, 2H), 3.62 (q, J=9.0 Hz, 4H), 3.03 (t, J=7.1 Hz); $^{13}$C NMR (100 MHz, $CDCl_3$, 298 K): 163.7, 148.8, 141.3, 139.4, 127.4, 125.8, 125.2, 124.4, 41.1, 30.2. HRMS (ESI) Calcd for $C_{19}H_{19}N_3O_2S_2$ [M+H]$^+$=386.0991, found 386.0981.

Synthesis of Compound 2

A round-bottom flask equipped with a magnetic stir bar is charged with Compound 1 (500 mg, 0.92 mmol) and THF (9 mL). The solution is cooled to −78° C. and freshly prepared 2.0 M LDA solution in THF (3.9 mL, 7.80 mmol) is added dropwise. The reaction mixture is stirred for 1 h at −78° C. and a $SnMe_3Cl$ 1.0 M solution in THF (7.8 mL, 7.8 mmol) is added. The mixture is warmed at room temperature and stirred overnight. The reaction is then quenched with $H_2O$ and the organic layer is extracted with $CH_2Cl_2$. The organic layer is dried with $Na_2SO_4$ and the solvents are removed under reduced pressure. The crude mixture is purified by flash chromatography on basic Al$_2$O$_3$ using 20% acetone/hexanes as an eluent to afford Compound 2 having the following structure as a white solid (468 mg, 34% yield).

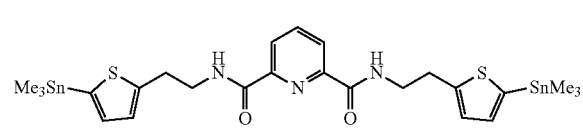

$^1$H NMR (CDCl$_3$, 400 MHz, 298 K): 8.35 (d, J=4.0 Hz, 2H), 8.03 (t, J=7.8 Hz, 1H), 7.83 (t, J=5.0 Hz, 2H), 7.02 (d, J=1.7 Hz, 2H), 6.96 (d, J=1.7 Hz, 2H), 3.75 (q, J=9.0 Hz, 4H), 3.21 (t, J=6.9 Hz, 4H), 0.35 (s, 18H); $^{13}$C NMR (100 MHz, CDCl$_3$, 298 K): 163.5, 148.8, 147.0, 139.2, 136.9, 135.3, 127.0, 125.1, 41.1, 30.1, −8.1; HRMS (ESI) Calcd for C$_{25}$H$_{35}$N$_3$O$_2$S$_2$Sn$_2$ [M+H]$^+$: 714.0288, found 714.0291.

Synthesis of Compound 3

Compound 3 having the following chemical formula is prepared in the same manner as for Compound 1, except that bipyridine dicarbonyl chloride is used instead of 2,6-pyridinedicarbonyl chloride.

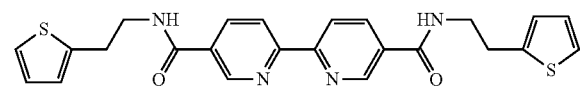

Synthesis of Compound 4

Compound 4 having the following chemical formula is prepared in the same manner as for Compound 2, except that Compound 3 is used instead of Compound 1.

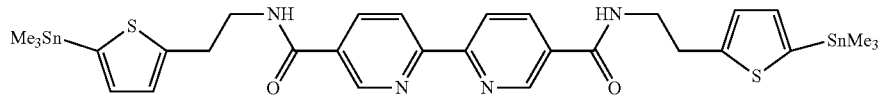

Synthesis of Model Compound M1

A microwave vessel equipped with a stir bar is charged with 3,6-bis(5-bromothiophen-2-yl)-2,5-bis(4-decyltetradecyl)-2,5-dihydropyrrolo[3,4-c]pyrrole-1,4-dione (176 mg, 0.16 mmol) and Compound 2 (50.0 mg, 0.07 mmol), followed by the addition of anhydrous chlorobenzene (1 mL). The resulting solution is bubbled with argon for 30 min, and Pd(PPh$_3$)$_4$ is quickly added under N$_2$. The vessel is then sealed with a snap cap and subjected to the following reaction conditions in a microwave reactor (Microwave Setups: CEM Discover Automatic Microwave Reactor; Power, 300 W; Temperature, 180° C.; Time, 155 min; Pressure, 250 psi; Stirring, high). Upon completion, the mixture is diluted with CHCl$_3$ and the organic layer is extracted three times with H$_2$O. The organic layer is dried with Na$_2$SO$_4$ and the solvents are removed under reduced pressure. The crude mixture is purified by recycling GPC using CHCl$_3$ as an eluent. The medium molecular weight fraction is collected and the solvents are removed under reduced pressure to afford compound M1 as a deep purple amorphous powder. Molecular weight estimated from MALDI-ToF (positive) for n=2, Calcd for C$_{162}$H$_{240}$N$_{10}$O$_8$S$_8$ [M+4H]$^{4+}$: 2713.67, found 2714.04.

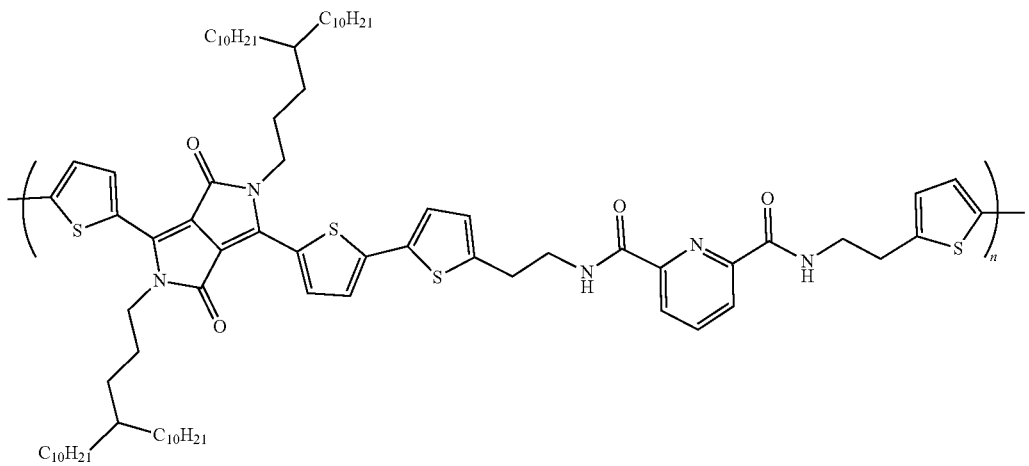

General Procedure for Stille Polymerization

A microwave vessel equipped with a stir bar is charged with an appropriate quantity of (E)-1,2-bis(5-(trimethylstannyl)thiophen-2-yl)ethene (TVT), 3,6-bis(5-bromothiophen-2-yl)-2,5-bis(4-decyltetradecyl)-2,5-dihydropyrrolo[3,4-c]pyrole-1,4-dione, and Compound 2, followed by the addition of anhydrous chlorobenzene. The resulting solution is bubbled with argon for 30 min, followed by quick addition of Pd$_2$(dba)$_3$ and P(o-tolyl)$_3$ under N$_2$. The vessel is then sealed with a snap cap and subjected to the following reaction conditions in a microwave reactor (Microwave Setups: CEM Discover Automatic Microwave Reactor; Power, 300 W; Temperature, 180° C.; Time, 155 min; Pressure, 250 psi; Stirring, high). After the completion, the polymer is successively end-capped with trimethylphenyl tin and bromobenzene. The reaction is cooled to room temperature and the mixture is dissolved in 1,1,2,2-tetrachloroethane (TCE). The polymer is precipitated in MeOH and the solid is collected by filtration through a relatively high quality glass thimble. The thimble is left inside a Soxhlet extractor and the solids are successively extracted with methanol, acetone, hexane, and chloroform. The chloroform fraction is concentrated and precipitated into methanol, yielding fiber-like precipitates. The polymer is filtered and dried in vacuo overnight.

Polymer P1

(E)-1,2-bis(5-(trimethylstannyl)thiophen-2-yl)ethene (46 mg, 0.088 mmol), 3,6-bis(5-bromothiophen-2-yl)-2,5-bis(4-decyltetradecyl)-2,5-dihydropyrrolo[3,4-c]pyrrole-1,4-dione (100 mg, 0.088 mmol), chlorobenzene (3.5 mL), Pd$_2$(dba)$_3$ (1.6 mg, 0.002 mmol), P(o-tolyl)$_3$ (2.2 mg, 0.008 mmol), trimethylphenyl tin (21 mg, 0.088 mmol), and bromobenzene (14 mg, 0.088 mmol) are used to prepare Polymer 1 having the following structure.

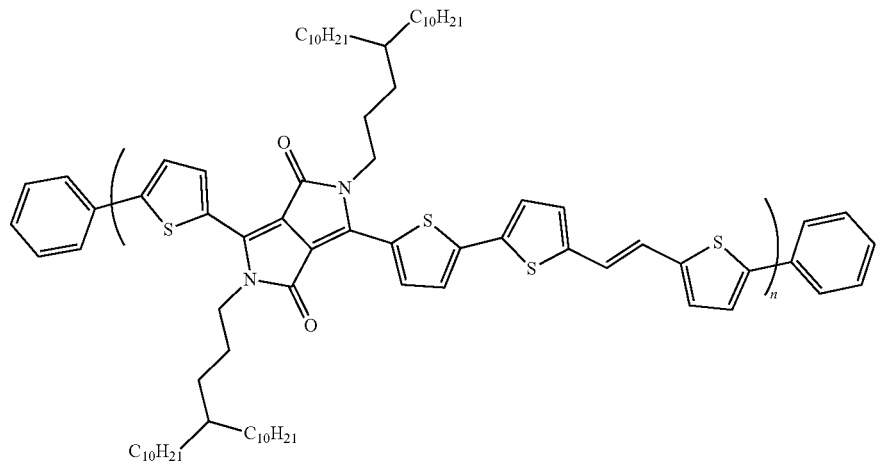

Figure 12A:
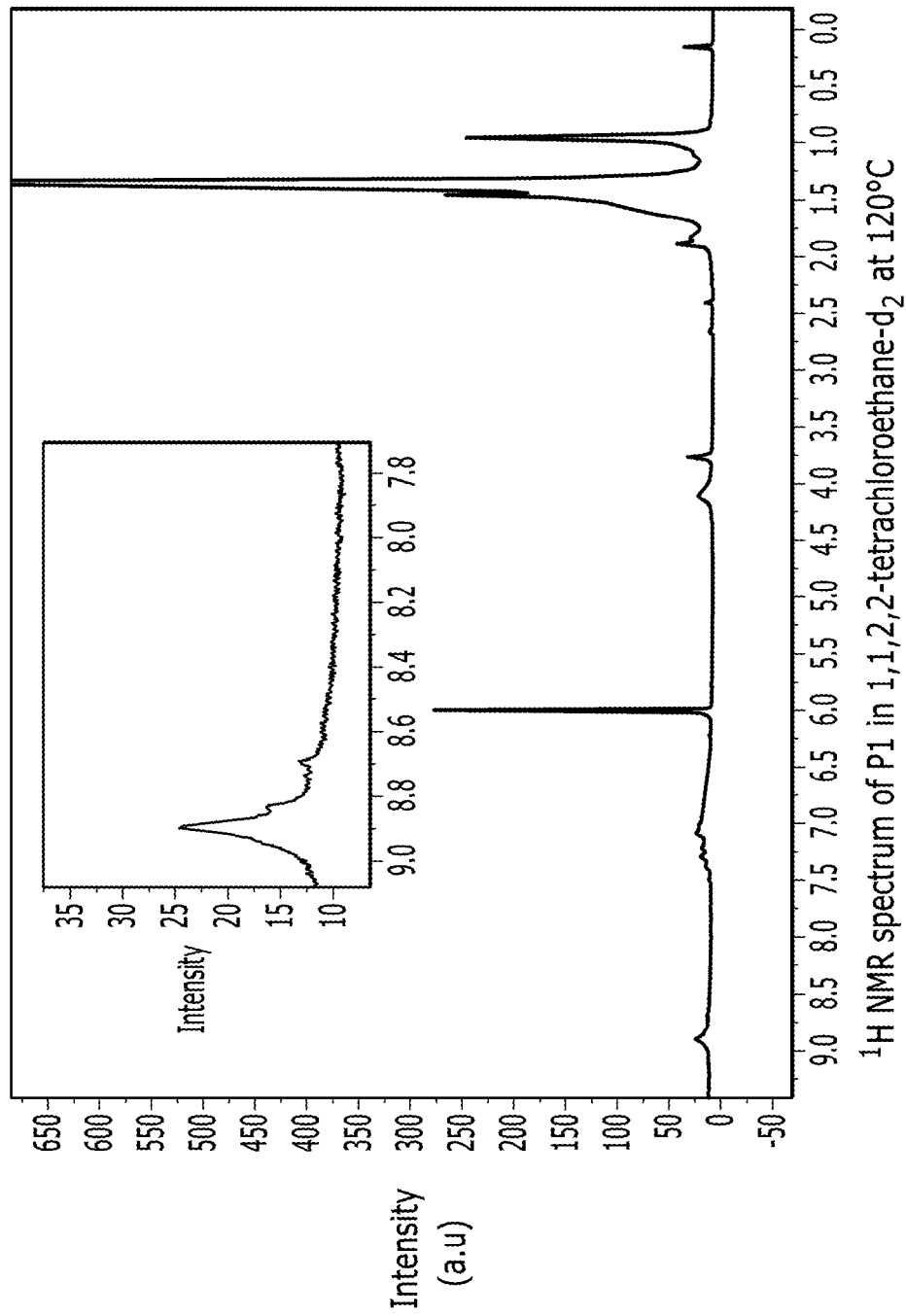
FIG. 12a to FIG. 12d show NMR data for each of the polymers prepared in the examples, respectively.

The NMR data for Polymer P1 are shown in FIG. 12a.

Polymer P2

(E)-1,2-bis(5-(trimethylstannyl)thiophen-2-yl)ethene (43 mg, 0.084 mmol), 3,6-bis(5-bromothiophen-2-yl)-2,5-bis(4-decyltetradecyl)-2,5-dihydropyrrolo[3,4-c]pyrrole-1,4-dione (100 mg, 0.088 mmol), Compound 2 (3.0 mg, 0.005 mmol), chlorobenzene (3.5 mL), Pd$_2$(dba)$_3$ (1.6 mg, 0.002 mmol), P(o-tolyl)$_3$ (2.2 mg, 0.008 mmol), trimethylphenyl tin (21 mg, 0.088 mmol), and bromobenzene (14 mg, 0.088 mmol) are used to prepare Polymer P2 having the following structure.

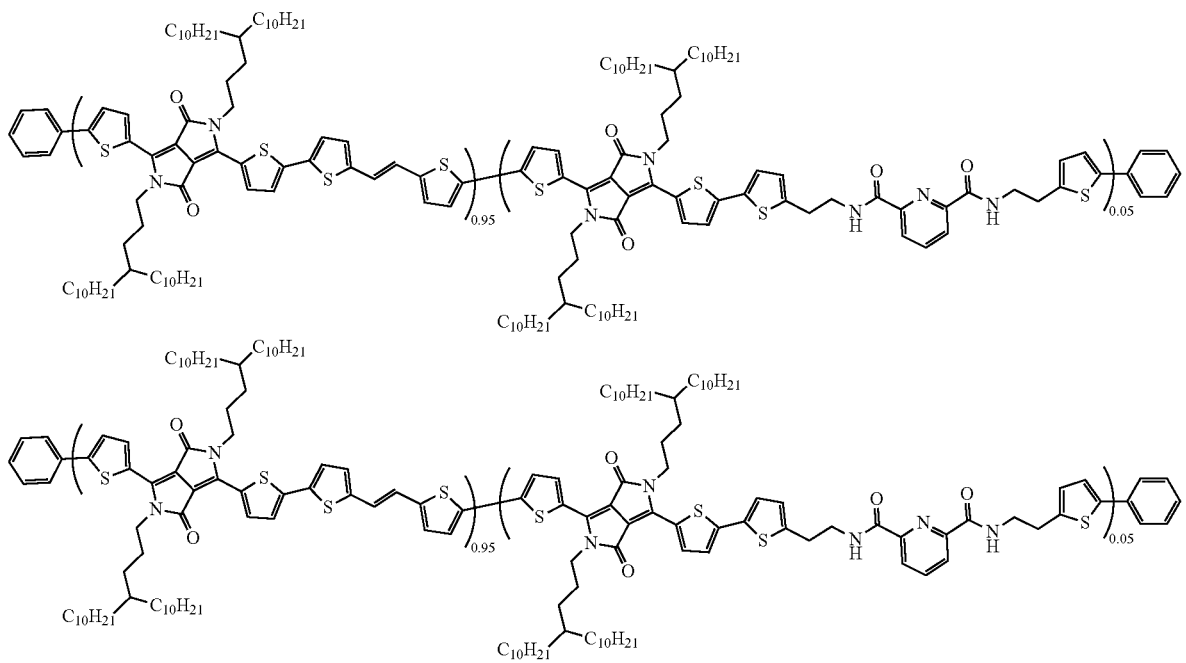

Figure 12B:
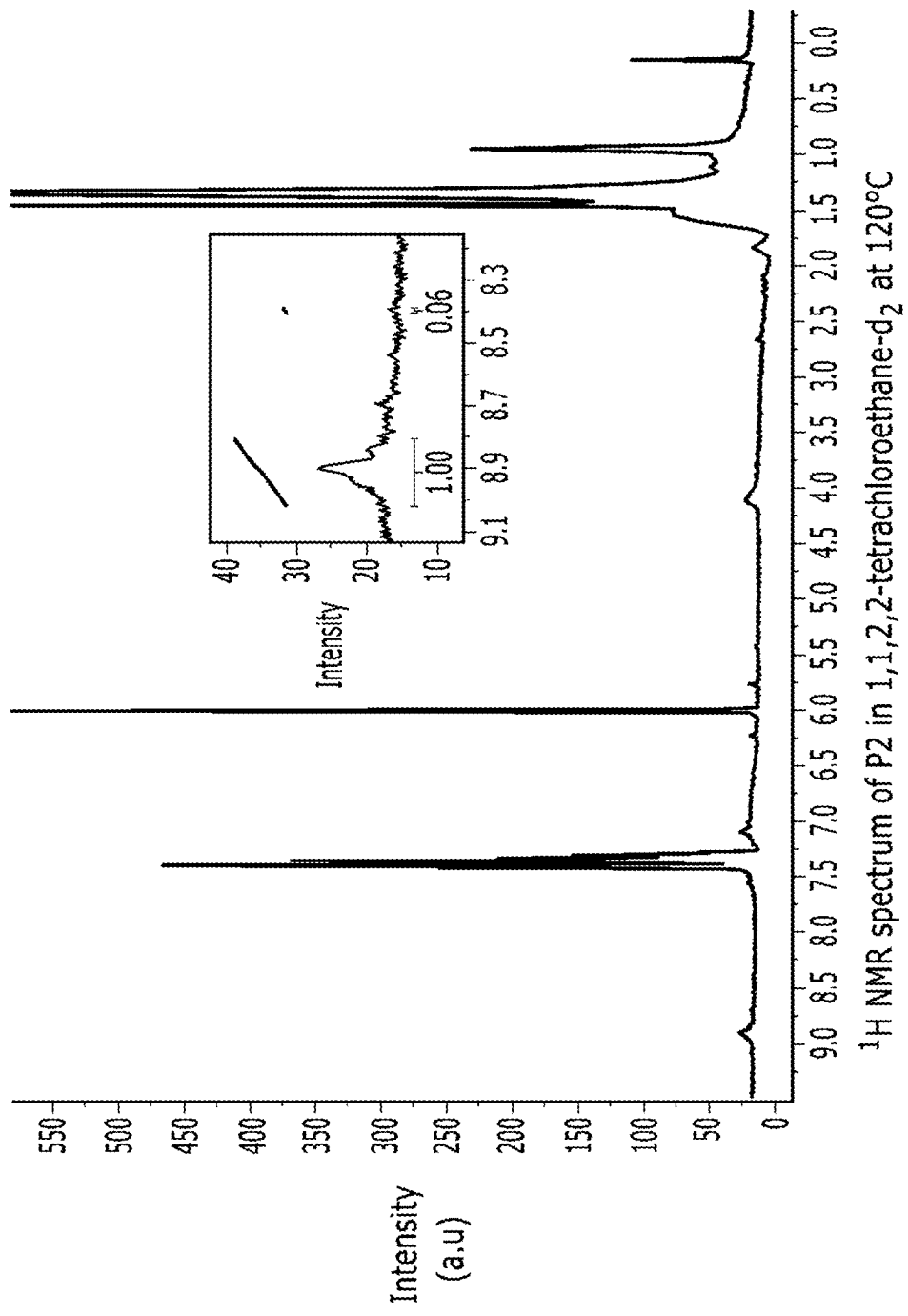

The NMR data for Polymer P2 are shown in FIG. 12b.

Polymer P3

(E)-1,2-bis(5-(trimethylstannyl)thiophen-2-yl)ethene (41 mg, 0.080 mmol), 3,6-bis(5-bromothiophen-2-yl)-2,5-bis(4-decyltetradecyl)-2,5-dihydropyrrolo[3,4-c]pyrrole-1,4-dione (100 mg, 0.088 mmol), Compound 2 (6.0 mg, 0.008 mmol), chlorobenzene (3.5 mL), $Pd_2(dba)_3$ (1.6 mg, 0.002 mmol), $P(o\text{-tolyl})_3$ (2.2 mg, 0.008 mmol), trimethylphenyl tin (21 mg, 0.088 mmol), and bromobenzene (14 mg, 0.088 mmol) are used to prepare Polymer P3 having the following structure.

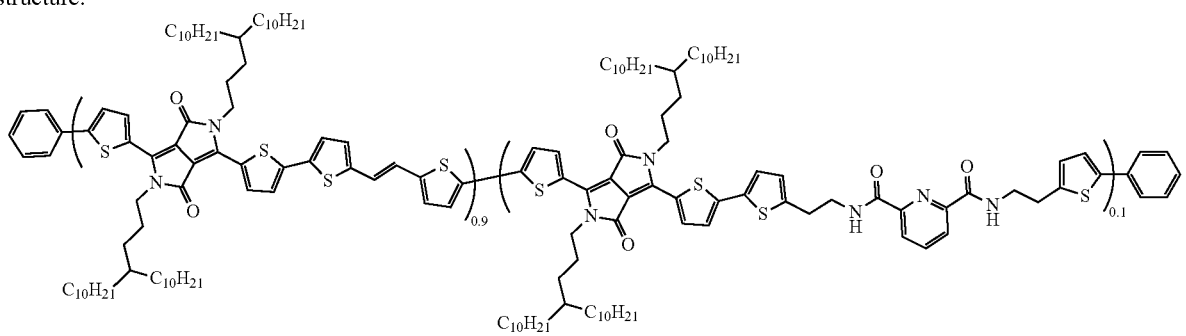

Figure 12C:
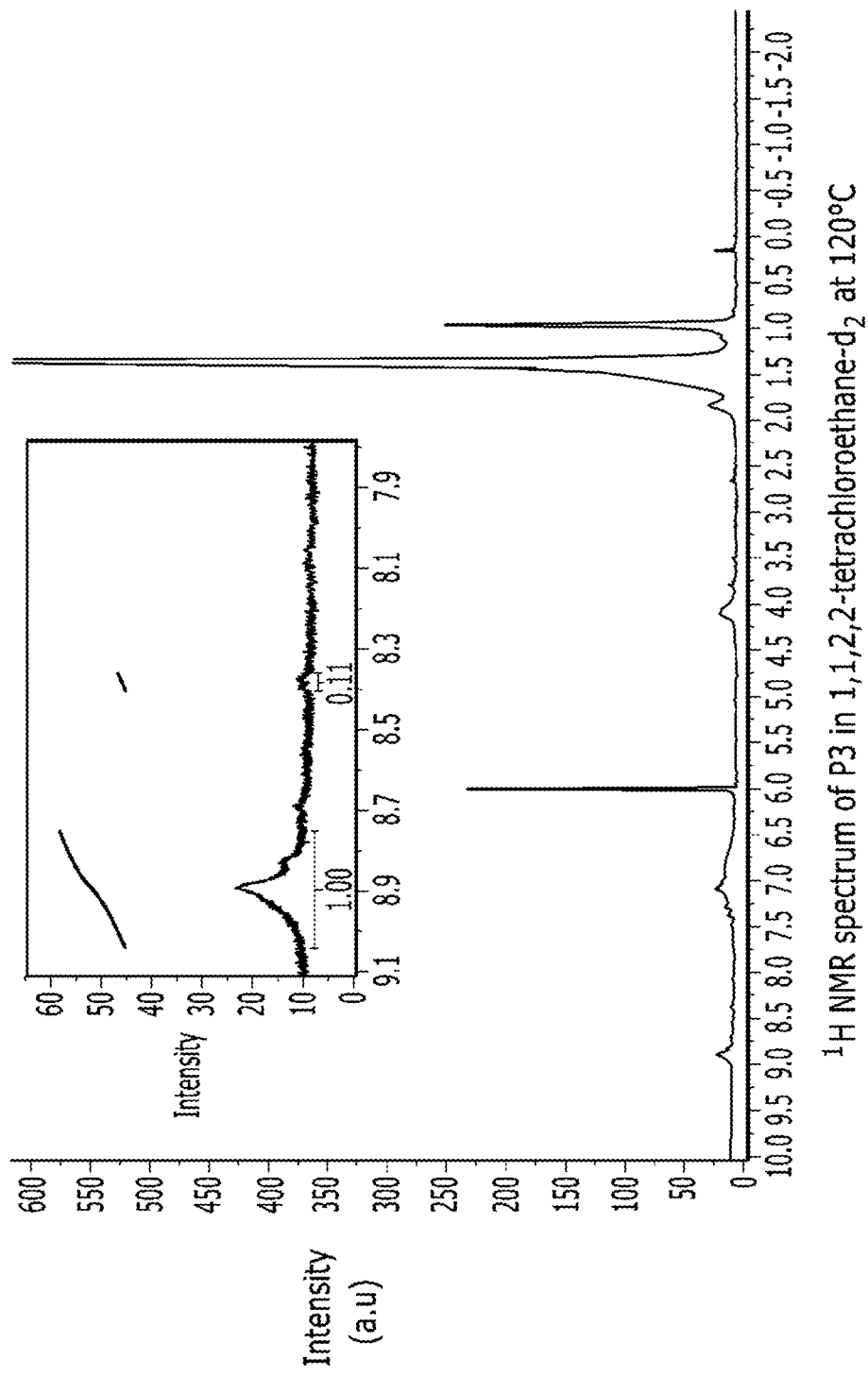

The NMR data for Polymer P3 are shown in FIG. 12c.

Polymer P4

(E)-1,2-bis(5-(trimethylstannyl)thiophen-2-yl)ethene (37 mg, 0.071 mmol), 3,6-bis(5-bromothiophen-2-yl)-2,5-bis(4-decyltetradecyl)-2,5-dihydropyrrolo[3,4-c]pyrrole-1,4-dione (100 mg, 0.088 mmol), Compound 2 (13 mg, 0.018 mmol), chlorobenzene (3.5 mL), $Pd_2(dba)_3$ (1.6 mg, 0.002 mmol), $P(o\text{-tolyl})_3$ (2.2 mg, 0.008 mmol), trimethylphenyl tin (21 mg, 0.088 mmol), and bromobenzene (14 mg, 0.088 mmol) are used to prepare Polymer 4 having the following structure.

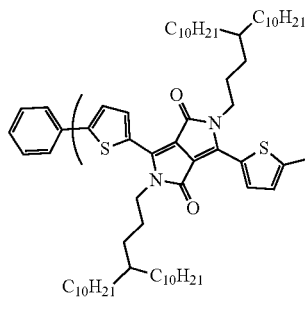

Figure 12D:
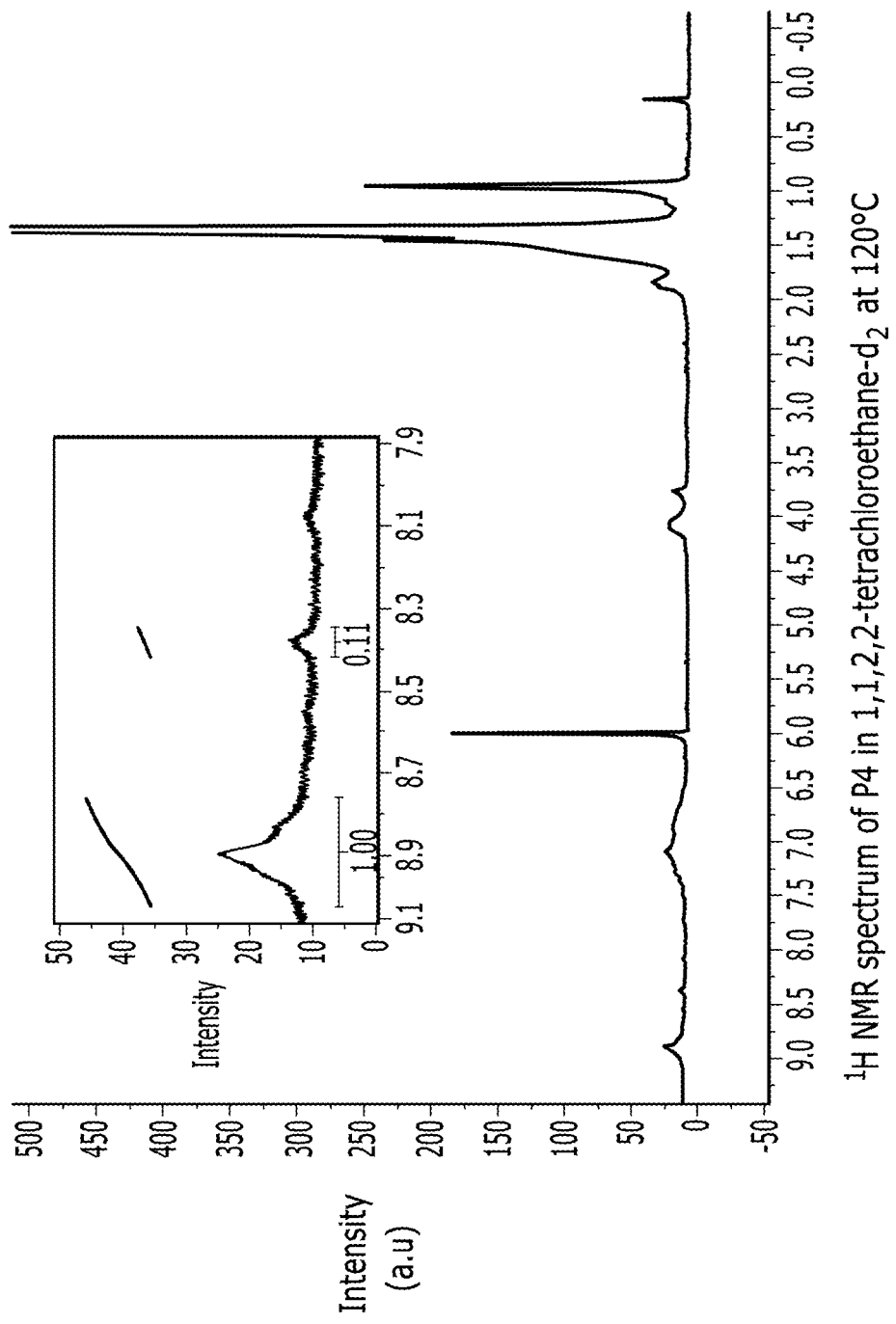

The NMR data for Polymer P4 are shown in FIG. 12d.

Polymer P5

The general procedure for Stille polymerization is followed using (E)-1,2-bis(5-(trimethylstannyl)thiophen-2-yl)ethene (41 mg, 0.080 mmol), 3,6-bis(5-bromothiophen-2-yl)-2,5-bis(4-decyltetradecyl)-2,5-dihydropyrrolo[3,4-c]pyrrole-1,4-dione (100 mg, 0.088 mmol), 1,6-bis(5-(trimethylstannyl)thiophen-2-yl)hexane (5.0 mg, 0.008 mmol), chlorobenzene (3.5 mL), $Pd_2(dba)_3$ (1.6 mg, 0.002 mmol), P(o-tolyl)$_3$ (2.2 mg, 0.008 mmol), trimethylphenyl tin (21 mg, 0.088 mmol), and bromobenzene (14 mg, 0.088 mmol). Molecular weight estimated from high temperature SEC: $M_n$=24.0 kDa, $M_w$=59.8 kDa, PDI=2.5.

Polymer P6

(E)-1,2-bis(5-(trimethylstannyl)thiophen-2-yl)ethene (41 mg, 0.080 mmol), 3,6-bis(5-bromothiophen-2-yl)-2,5-bis(4-decyltetradecyl)-2,5-dihydropyrrolo[3,4-c]pyrrole-1,4-dione (100 mg, 0.088 mmol), Compound 4 (0.008 mmol), chlorobenzene (3.5 mL), $Pd_2(dba)_3$ (1.6 mg, 0.002 mmol), P(o-tolyl)$_3$ (2.2 mg, 0.008 mmol), trimethylphenyl tin (21 mg, 0.088 mmol), and bromobenzene (14 mg, 0.088 mmol) are used to provide Polymer 6 having the following structure.

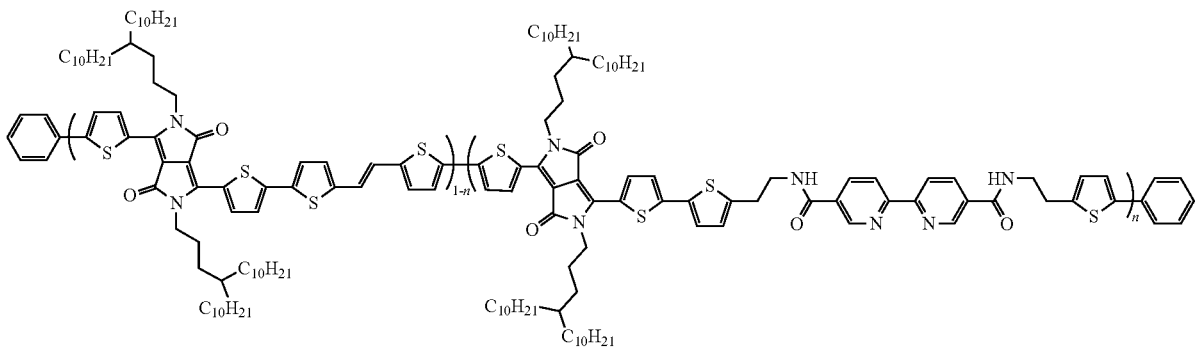

To Polymer 6 thus prepared, an Fe solution including iron ions (solvent: Chlorobenzene and the mole ratio of Fe ions:polymer being about 1:1 to about 1:10) is added dropwise to introduce $Fe^{2+}$ ions, obtaining the ion-introduced Polymer 6.

2. Polymer Characterization

For Polymers P1 to P4, the number average molecular weight, the weight average molecular weight, the polydispersity (PDI), the degradation temperature determined from thermo gravitational analysis, UV maximum absorption wavelength (Sol), UV maximum absorption wavelength (film), HOMO, and bandgap are measured. The results are summarized in Table 1.

TABLE 1

| | $M_n$ (kDa) | $M_w$ (kDa) | PDI | $T_d$ (° C.) | $\lambda_{max}$ sol (nm) | $\lambda_{max}$ film (nm) | HOMO (eV) | Bandgap (eV) |
|---|---|---|---|---|---|---|---|---|
| P1 | 20.4 | 65.4 | 3.2 | >350 | 803, 738 | 801, 740 | 5.17 | 1.35 |
| P2 | 19.7 | 61.4 | 3.3 | >350 | 803, 738 | 801, 739 | 5.22 | 1.35 |
| P3 | 16.2 | 49.1 | 3.0 | >350 | 803, 738 | 801, 738 | 5.23 | 1.35 |
| P4 | 13.4 | 35.5 | 2.6 | >350 | 803, 738 | 801, 734 | 5.17 | 1.37 |

Thin-Films Characterizations (1) The morphology of the polymer film is measured by optical microscopy and AFM. Molecular stretchability of the polymer film is investigated by polarized UV-vis spectroscopy. The elastic modulus of the polymer film is measured by the buckling method as below.

The polymer film is spin-coated on a passivated glass slide and then transferred to a poly(dimethylsiloxane) (PDMS) substrate having 10% pre-strain. After being transferred, the PDMS substrate is relaxed to generate a sinusoidal buckle in the polymer film. The wavelength of the buckle $\lambda_b$ has the following relationship with the film thickness $d_f$, the elastic modulus of the film and the substrate, $E_f$ and $E_s$, and the Poisson's ratios of these two materials, $v_f$ and $v_s$:

$$E_f = 3E_s \left(\frac{1-v_f^2}{1-v_s^2}\right)\left(\frac{\lambda_b}{2\pi d_f}\right)^3.$$

Grazing incidence X-ray diffraction (GIXRD) is conducted at beamline 11-3 of the Stanford Synchrotron Radiation Lightsource. The incidence angle is 0.12 and the X-ray wavelength is 0.9758 Å, corresponding to a beam energy of 12.7 keV. All of GIXRD images are collected in reflection mode with a two-dimensional area detector and the sample in a helium atmosphere. All of samples are spin-cast on $SiO_2$/Si or OTS-treated $SiO_2$/Si substrates at a spin rate of 1000 rpm for 60 s from prepared polymer solutions in chlorobenzene (5 mg/mL).

Device Fabrications (1) Conventional organic transistors: A semiconducting polymer layer (35 nm) is spin coated on an OTS-treated $SiO_2$/Si substrate in a glove box and is thermally annealed at 150° C. for 10 min. Each of source and drain electrodes (Au, 40 nm) is thermally evaporated under $5.0 \times 10^6$ torr, respectively.

Figure 2:
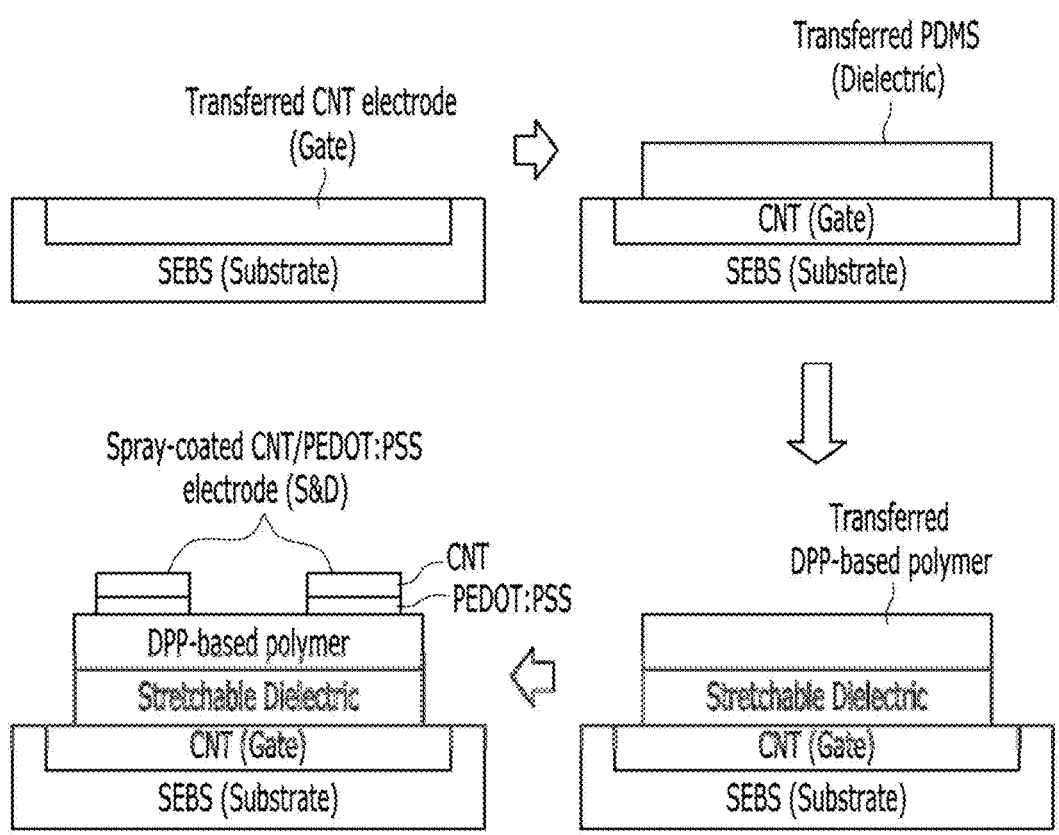
FIG. 2 is a view schematically showing a production process of a skin-inspired organic thin film transistor according to example embodiments.

(2) Skin-inspired organic transistor: A carbon nanotube (CNT, 100 nm) film as a gate electrode is transferred onto an SEBS elastomer. A PDMS layer (1.8 um) is then transferred onto the CNT/SEBS substrate. A semiconducting polymer layer (35 nm) is subsequently transferred onto the PDMS dielectric layer. Finally, a PEDOT:PSS (30 nm)/CNT (100 nm) bilayer as source and drain electrodes is spray coated on the semiconducting layer. The transferring method for the device fabrication is schematically illustrated in FIG. 2.

Experimental Results

1. Polymer Properties—1

Figure 3A:
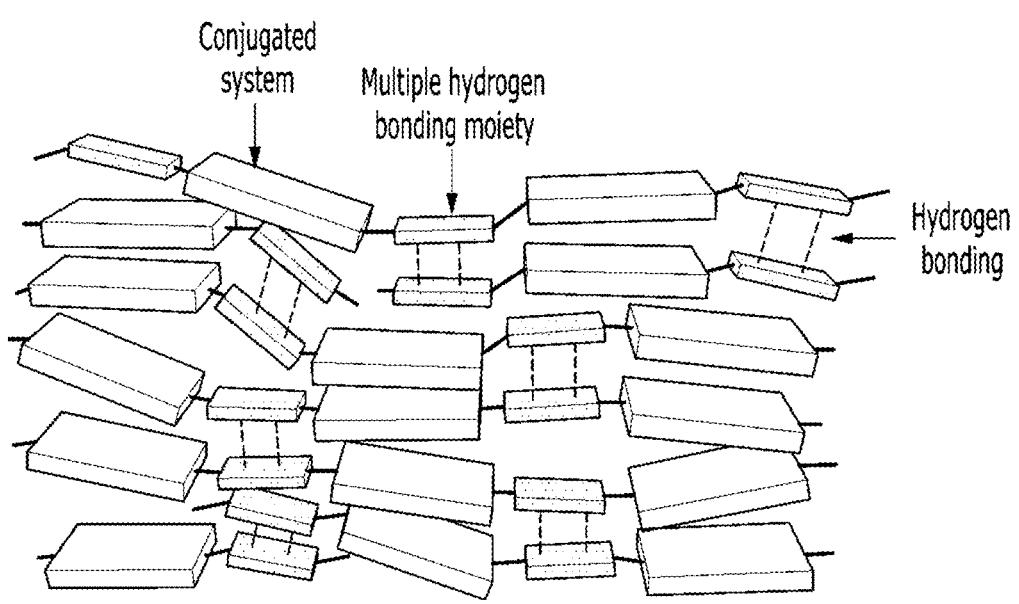
FIG. 3a is a view schematically illustrating intermolecular hydrogen bonding between adjacent PDCA units of the prepared polymers.
Figure 3B:
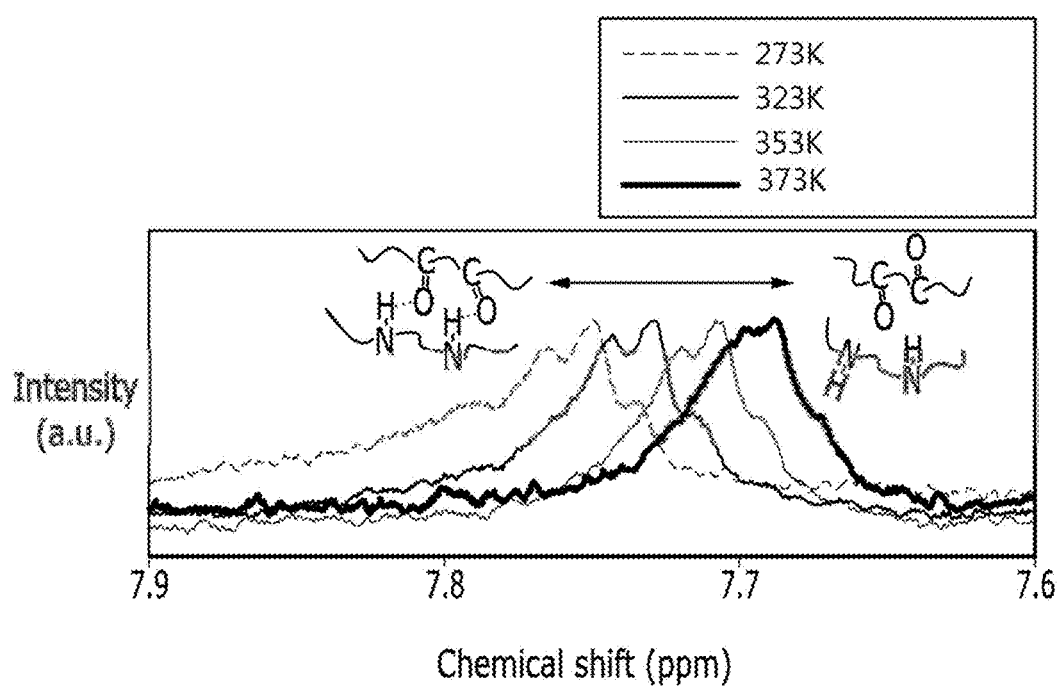
FIG. 3b is a zoomed variable temperature $^1$H NMR spectrum of amide protons of the PDCA units embedded between the DPP units in model oligomer M1.
Figure 3C:
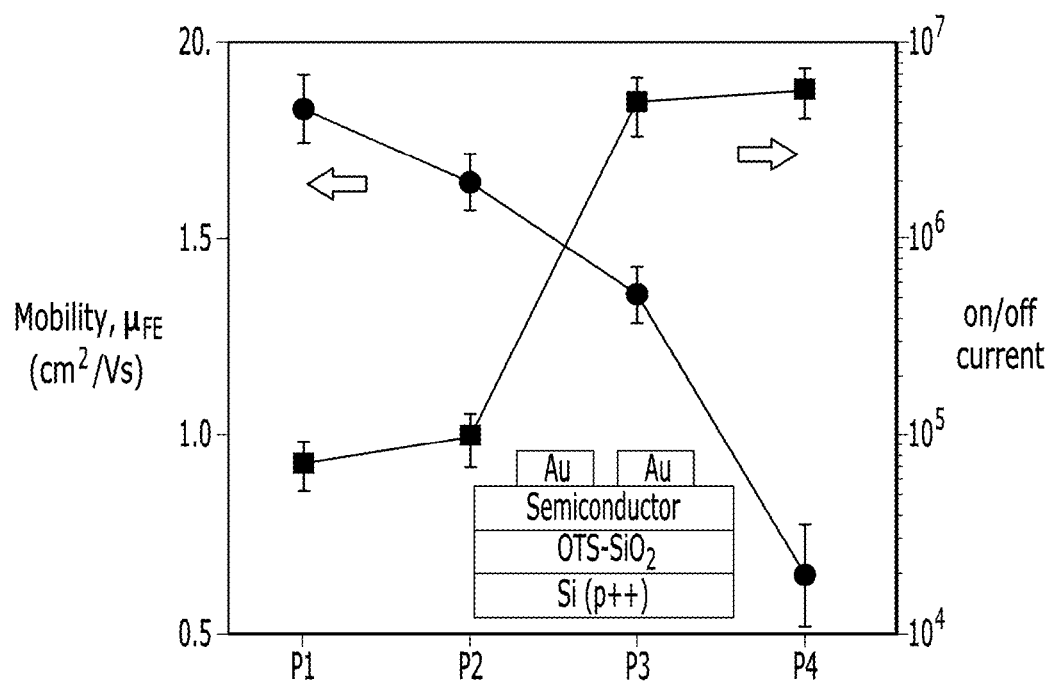
FIG. 3c shows field-effect mobility and an on/off current ratio of polymers having various amounts of PDCA.

In Synthesis Scheme 2, the chemical structure of the new DPP-based polymers containing non-conjugated the PDCA moieties Polymer P1 to P4 is shown. FIG. 3a is a schematic representation of intermolecular hydrogen bonding between adjacent PDCA units; FIG. 3b is zoomed variable temperature $^1$H NMR spectra of amide protons of a PDCA unit embedded between DPP units (model oligomer, M1); FIG. 3c shows the field-effect mobility and on/off current ratio of Polymers P1 to P4; and FIG. 3d shows a relative degree of crystallinity (rDoC) and crystallite size of Polymers P1 to P4.

(2) Referring to Synthesis Scheme 2, Polymers P1 to P4 are based on 3,6-di(thiophen-2-yl)-2,5-dihydropyrrolo[3,4-c]pyrrole-1,4-dione (DPP) repeating units, and in case of Polymers P2 to P4, non-conjugated 2,6-pyridine dicarboxamide (PDCA) moieties have been introduced directly in the polymer backbone.

Initial evaluation of the electrical properties of P1 to P4 is carried out by OTFTs device characterization (see FIG. 3c). Surprisingly, even with introduction of as much as 20 mol % of non-conjugated monomers in Polymer P4, the field-effect mobility is maintained to be as high as 0.64 $cm^2$/Vs. With 10 mol % PDCA, mobility is 1.37 $cm^2$/Vs and the on/off current ratio $>10^6$.

Figure 3D:
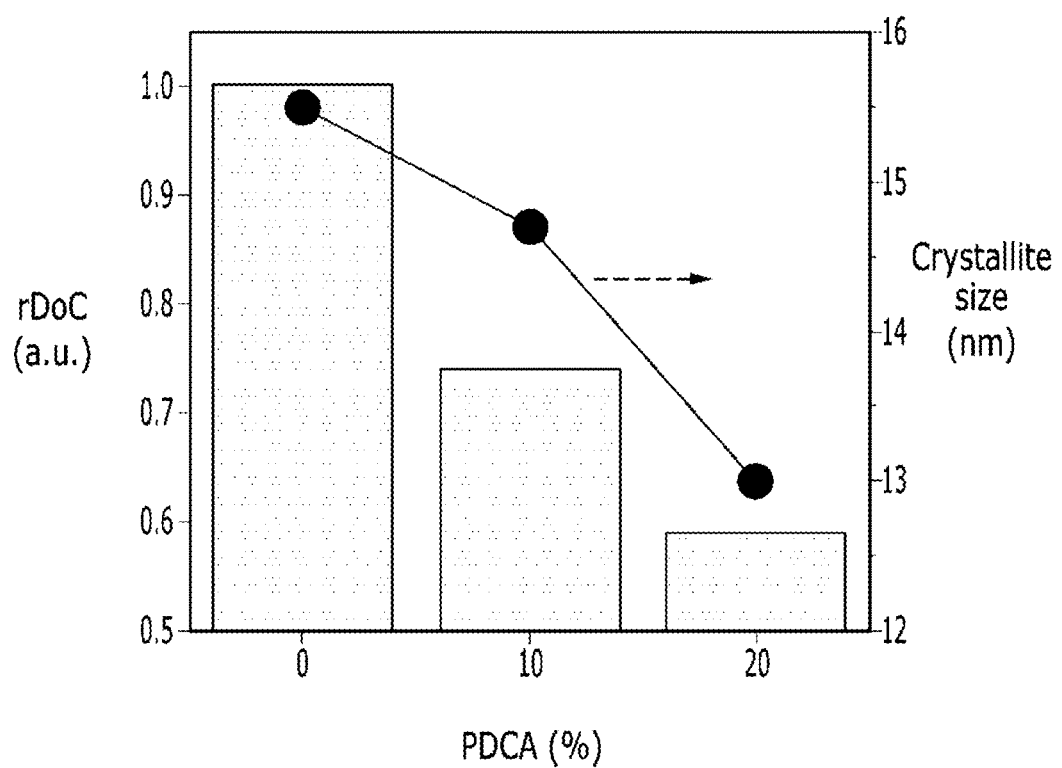
FIG. 3d is a view showing a relative degree of crystallinity (rDoC) and crystallite sizes of the prepared polymers.

The relative degree of crystallinity (rDoC) is calculated according to the pole figures extracted from the (200) diffraction peak of the grazing incidence X-ray diffraction (GIXRD) patterns of the polymer thin films (see FIG. 3d). The rDoC decreases whilst full width at half maximum (FWHM) values increase with higher amount of PDCA incorporated in the polymer. This finding indicates an increase in fraction of amorphous regions and also a slight reduction of the mean size of crystallites (15.5 nm, 14.7 nm, and 13.0 nm for P1, P3, and P4, respectively) with increased PDCA mol %.

2. Polymer Properties—2

Figure 4A:
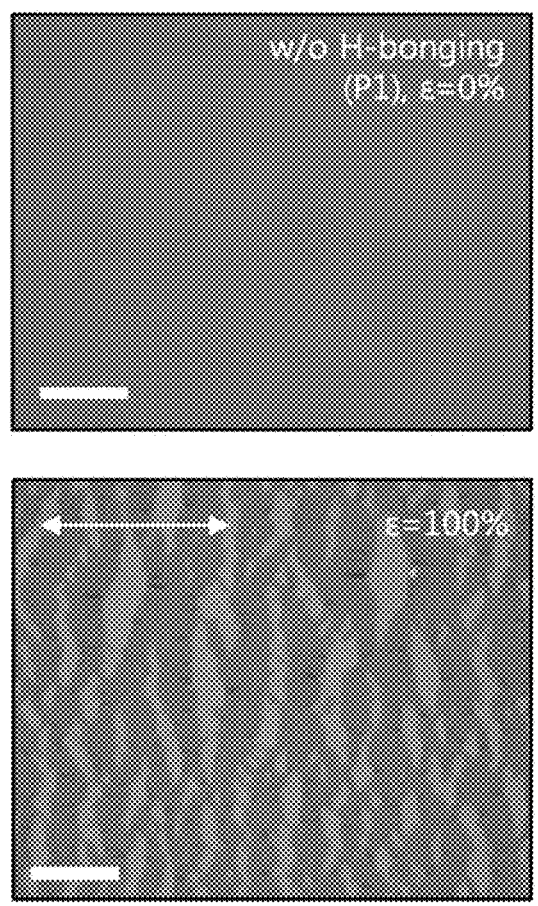
FIG. 4a and FIG. 4b are optical microscope images of films including the prepared polymer at 0% and 100% strain, respectively.
Figure 4B:
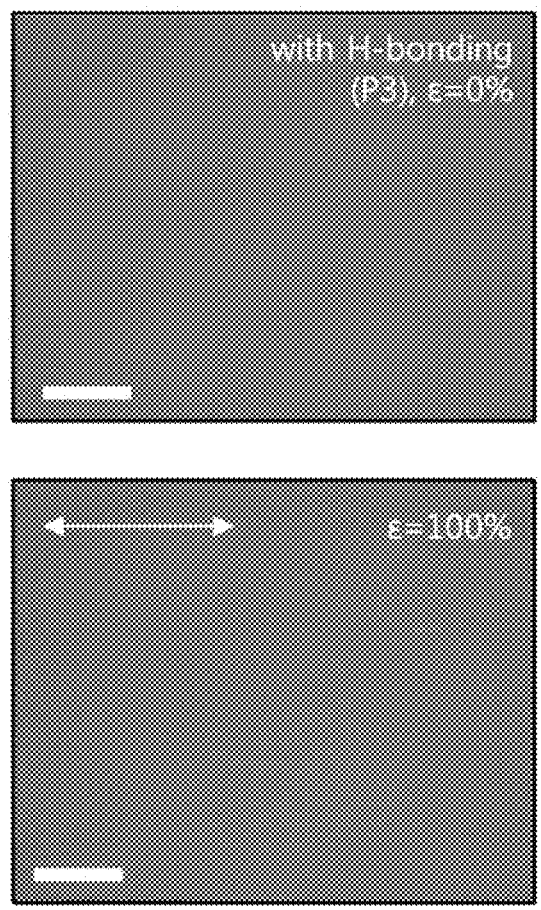
Figure 4C:
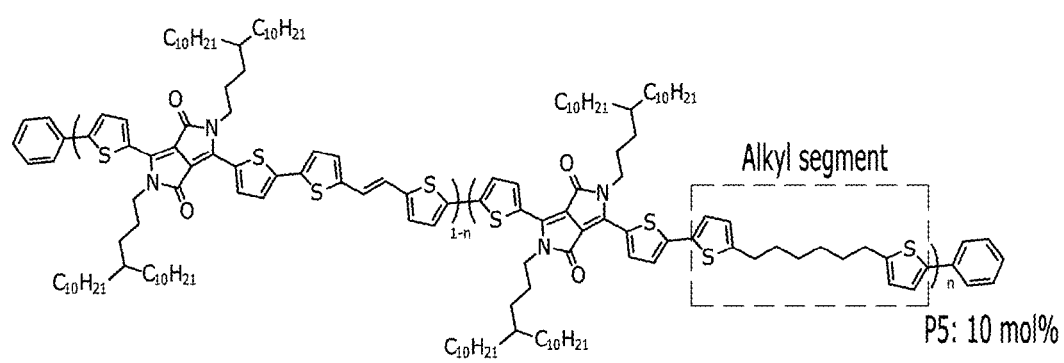
FIG. 4c shows a chemical structure of polymer P5, the DPP polymer having an alkyl spacer.
Figure 4D:
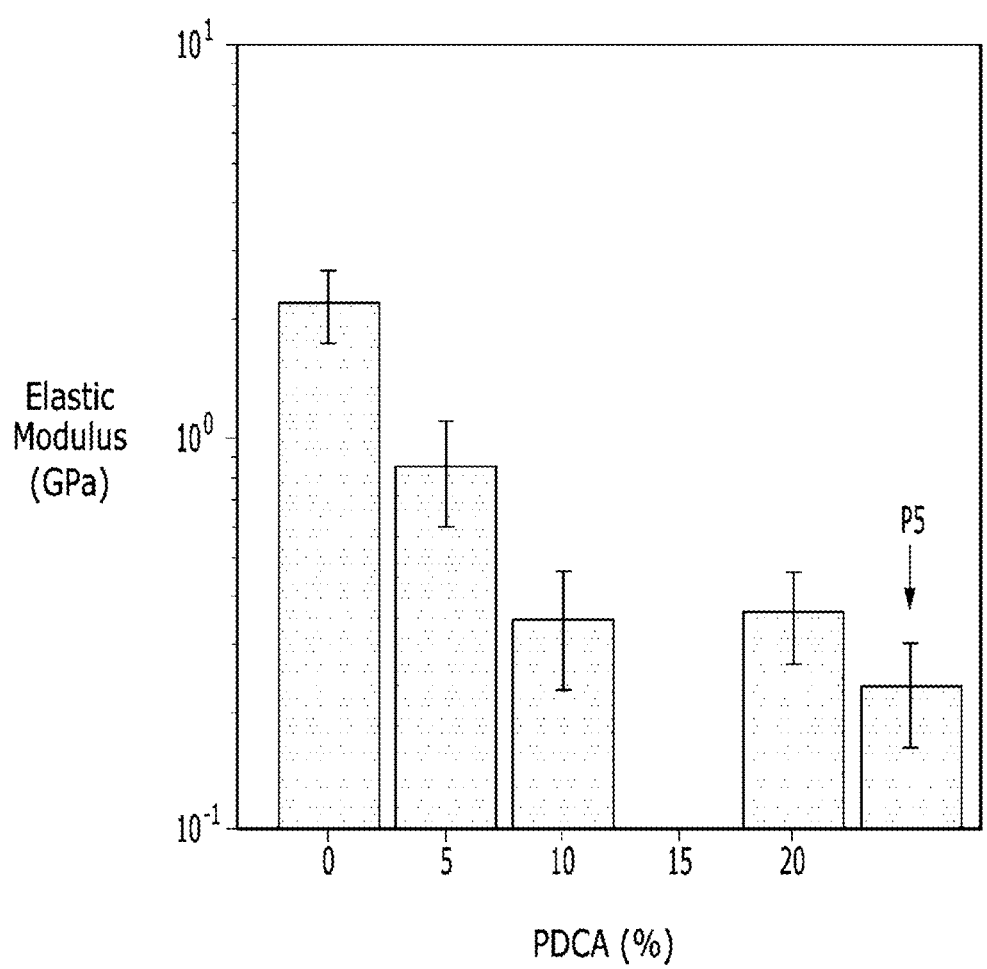
FIG. 4d is a view showing an influence of the hydrogen bonding moiety amount on elastic behavior.
Figure 4E:
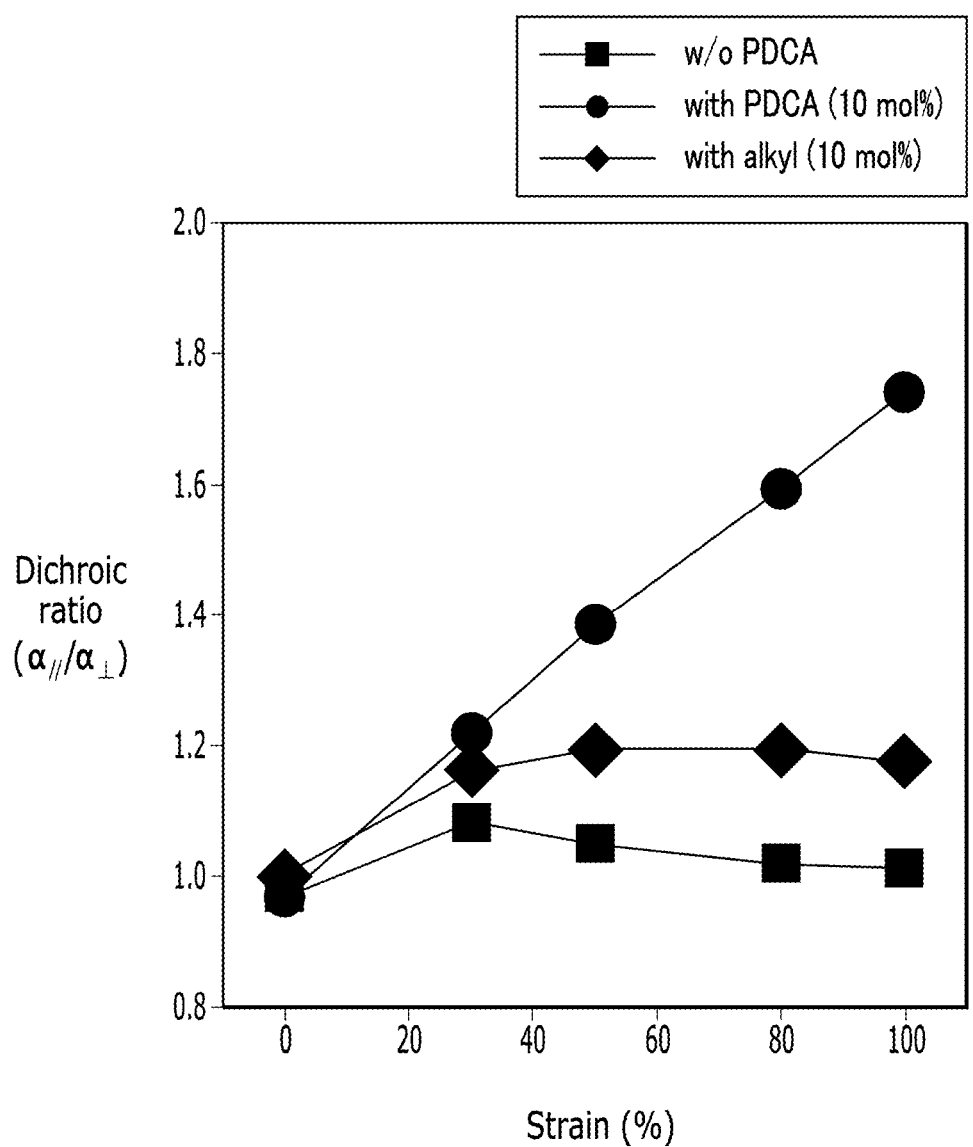
FIG. 4e shows a change in dichroic ratio of polymers P1, P3, and P5 under various strains.
Figure 4F:
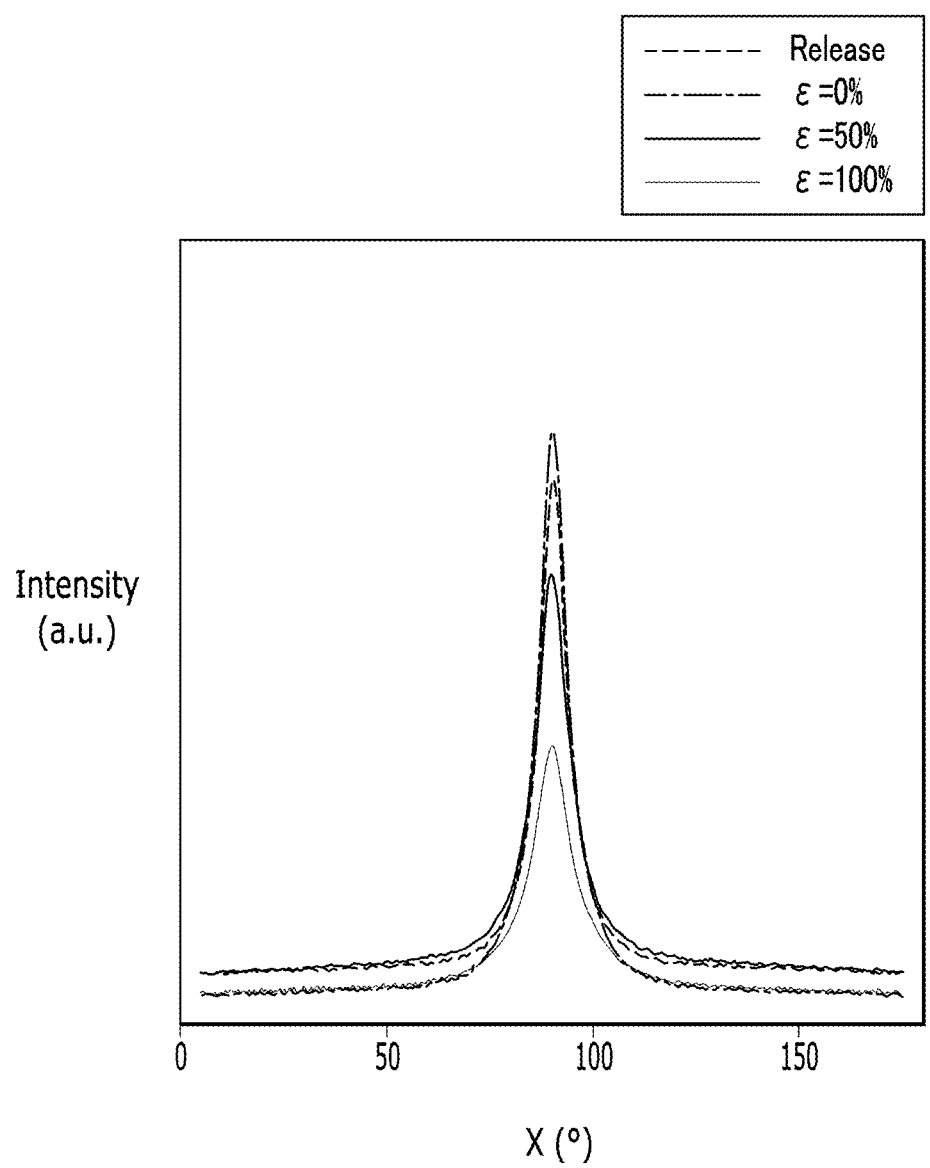
FIG. 4f shows pole figures for the (200) reflection peak at different strain ratios from the "parallel" directions of P3.
Figure 4G:
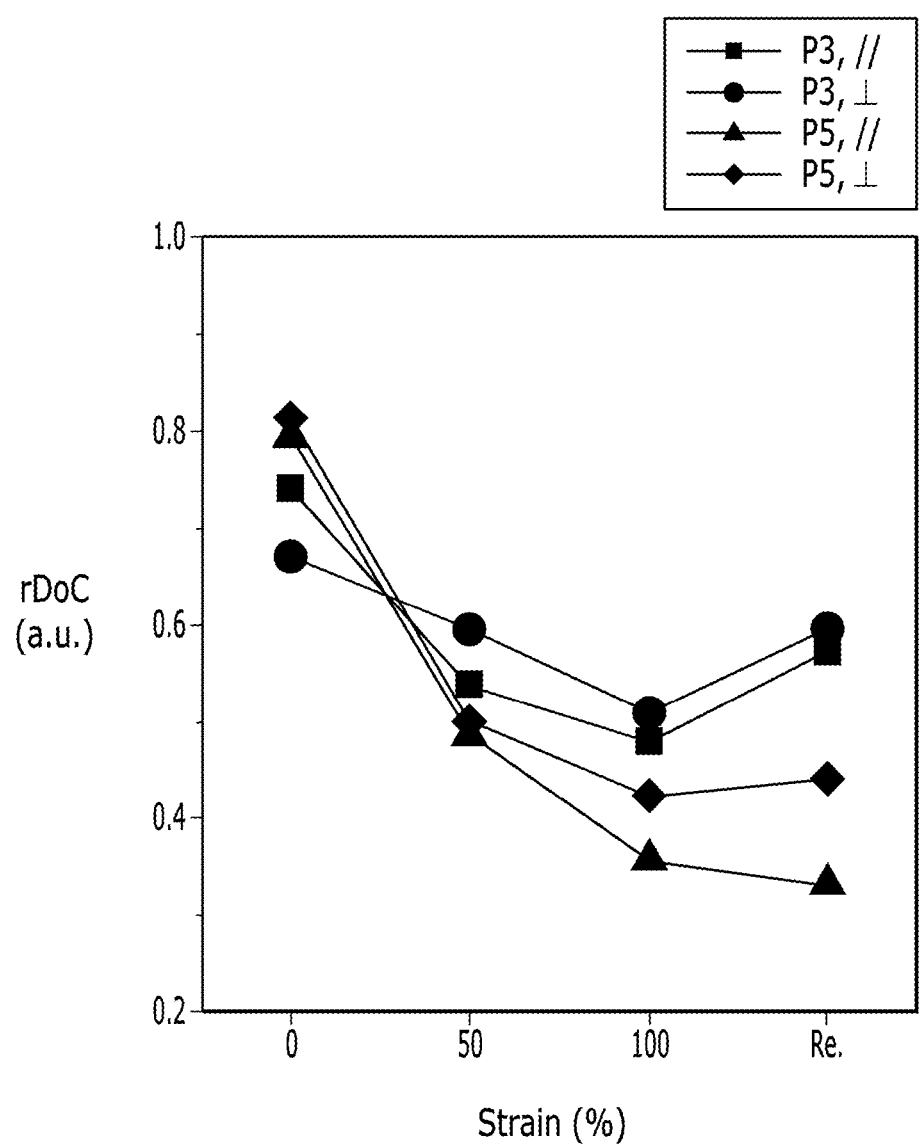
FIG. 4g shows an influence of the strain ratio on the relative degree of crystallinity extracted from peak (200) for both "parallel" and "perpendicular" directions of P3.
Figure 4H:
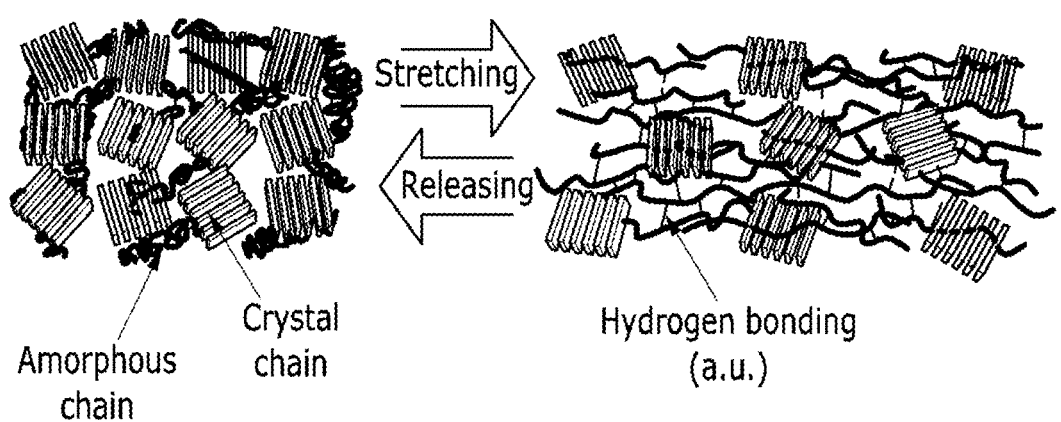
FIG. 4h is a view schematically illustrating a mechanism for enhancement of stretchability in conjugated polymers via dynamic bonding.

(1) FIG. 4a and FIG. 4b are optical microscope images of P1 and P3 at 0% and 100% strain (scale bar=20 um), respectively; FIG. 4c is a view showing a chemical structure of DPP-based polymers containing alkyl spacer of Polymer P5; FIG. 4d is a view showing an influence of the hydrogen bonding moiety amount on elastic modulus; FIG. 4e is a graph showing dichroic ratio of Polymers P1, P3, and P5 under various strains; FIG. 4f is a view showing pole figures for the (200) reflection peak at different strain ratios from the "parallel" directions of Polymer P3; FIG. 4g is a graph showing an influence of the strain ratio on the relative degree of crystallinity extracted from peak (200) for both "parallel" and "perpendicular" directions of Polymer P3; and FIG. 4h is a view schematically illustrating a general mechanism for enhancement of stretchability in conjugated polymers via dynamic bonding.

(2) To qualitatively evaluate the stretching properties of the polymers, thin films are supported on PDMS substrates and stretched to different strain ratios (0 to 100% strain). Severe microscale cracks are observed in a film including Polymer P1 at 100% strain by optical microscopy imaging (see FIG. 4a), and small cracks became visible under an optical microscope at 10% strain. Furthermore, the microscale cracks remain in the film after the strain is released. In contrast, Polymer P3 with 10 mol % non-conjugated moieties does not show any observable microscale cracks or wrinkles during a stretching cycle from 0% to 100%, even after the strain is released to the initial state, which clearly indicates that breaks of conjugation and incorporation of dynamic bonding sites are beneficial in enabling relatively high stretchability in polymer thin films (see FIG. 4b).

The results of measuring the elastic modulus of the polymers are shown in FIG. 4d. All the polymers with PDCA moieties exhibit a lower elastic modulus in comparison to the polymer without a H bonding moiety (i.e., Polymer P1).

The degree of polymer chain alignment under strain is measured using polarized UV-vis spectroscopy and quantified using dichroic ratios (see FIG. 4e), In case of a film including Polymer P1, a maximum dichroic ratio of only 1.1 at 30% strain is observed, indicating minimum polymer chain alignment due to strain. The dichroic ratio in fact gradually decreases to 1 from 30%-100% strain, which indicates that Polymer P1 is hardly stretchable and crack formation starts at low strain levels, consistent with optical microscopic observations. On the other hand, the dichroic ratio of a film including Polymer P3 linearly increases to 1.8 as strain increases to 100%. Again, this is consistent with the observation that no large cracks form for Polymer P3 at strain as high as 100% indicating that the strain energy is, at least, partially dissipated through polymer chain alignment.

According to the results of GIXRD analysis, the rDoC of Polymer P1 is observed to decrease with strain up to 25%. This observation indicates that the tensile strain applied on the thin film is initially released through breakage of the crystalline regions until cracks start to form at above 25% strain. In sharp contrast, the rDoC of Polymer P3 with 10 mol % PDCA moieties decreases steadily from 0%-100% strain (see FIG. 4f).

The benefits of incorporation of H-bonding sites are confirmed by comparison with Polymer P5, incorporating 10 mol % of non-conjugated alkyl spacers into the polymer backbone. In terms of mechanical properties, Polymer P5 shows slight improvements in achieving a maximum strain of 30% before crack formation. However, this value is still much lower than that of Polymer P3. Furthermore, the maximum dichroic ratio is found to be only 1.16 at 30% strain and levels off at this value as the strain increases, consistent with a strain value for onset of crack formation. Since the hexyl chain incorporated in Polymer P5 breaks the conjugation and presents higher flexibility, the elastic modulus of the Polymer P5 thin film is much lower than that of P1 (see FIG. 4d). Furthermore, the relative crystallinity of Polymer P5 is 0.8, which is lower than that of Polymer P1, indicating an increase in the amorphous regions fraction within the polymer thin film. To support the mechanism for stretchability enhancement, the dissipation energy of Polymer P5 upon stretching is determined. When strain is applied on the film to 100% strain, the rDoC drastically decreases from 0.80 to 0.35. This decrease in rDoC shows that the tensile energy in a film including Polymer P5 is dissipated mostly through the breaking of crystallites and shows the importance of the hydrogen bond moieties as strain releasing moieties (see FIG. 4h).

Figure 5A:
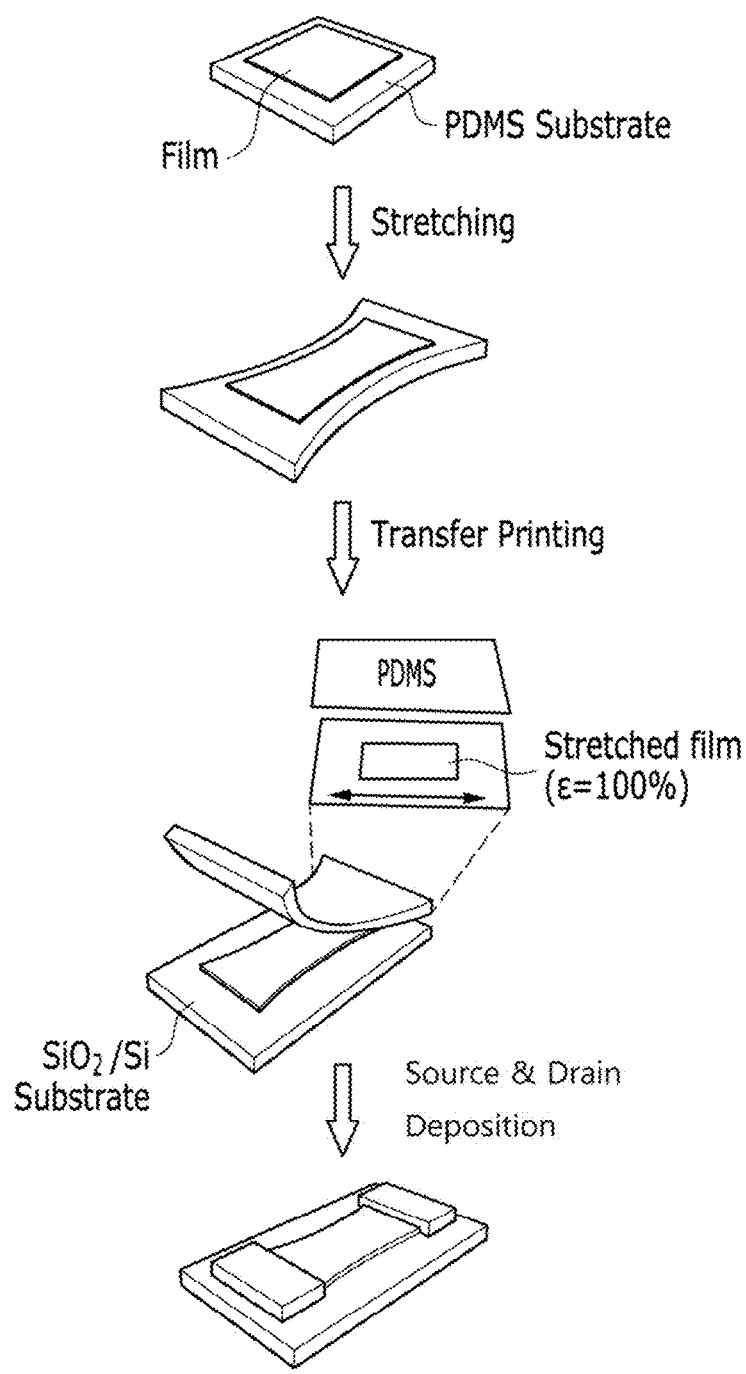
FIG. 5a is a view showing a fabrication process towards organic transistors with stretched polymer thin films.
Figure 5B:
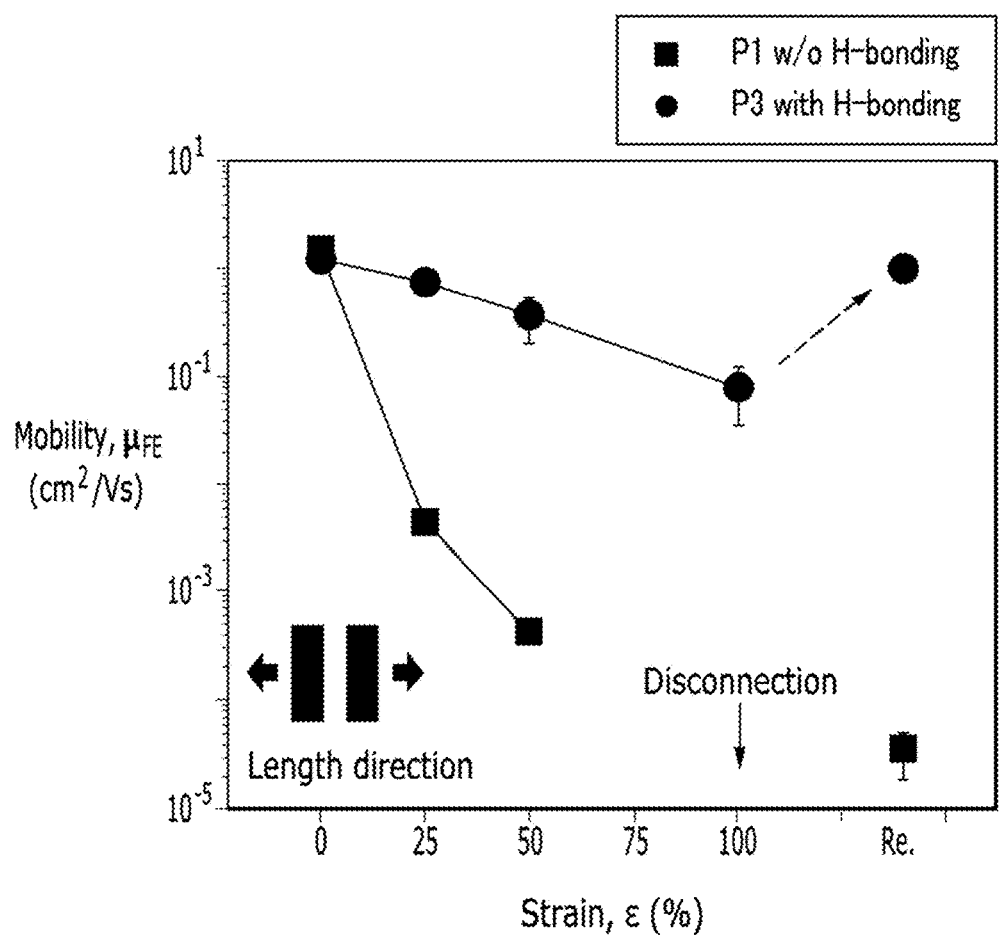
FIG. 5b and FIG. 5c show field-effect mobility and an on/off current ratio of the OTFTs versus various strain ratios in a length direction.
Figure 5C:
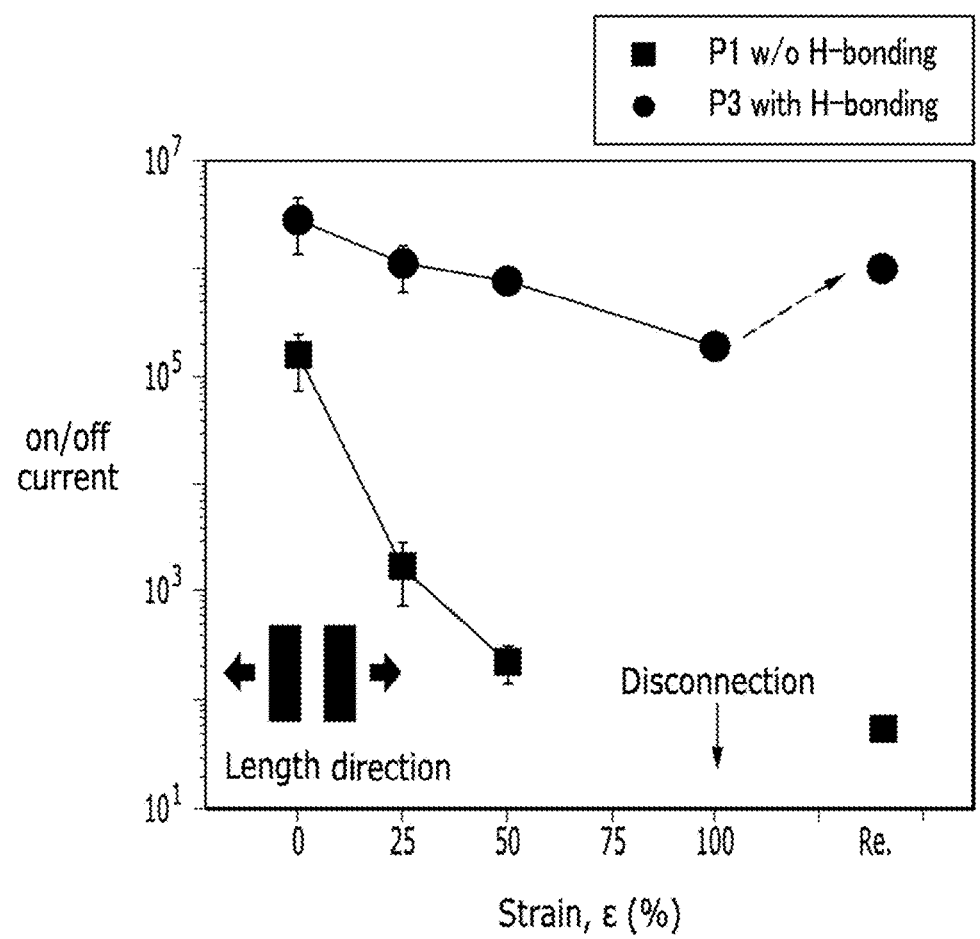
Figure 5D:
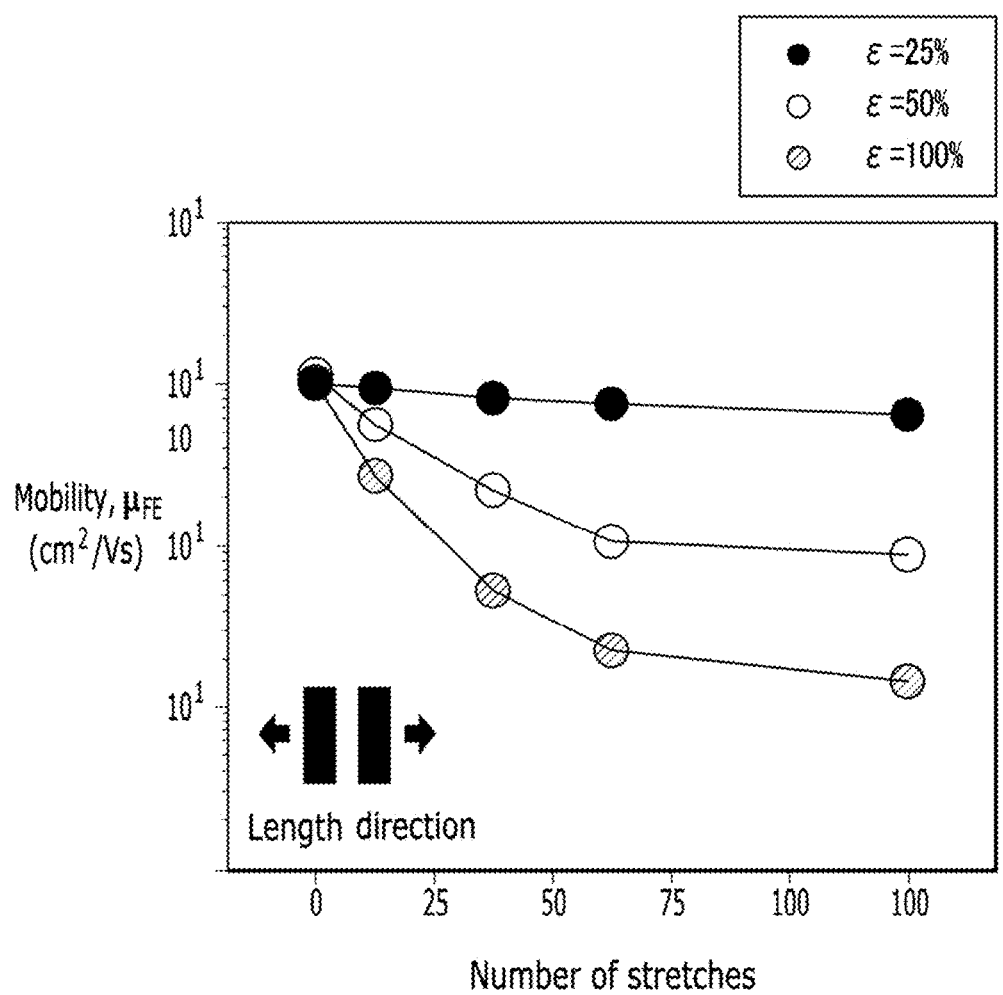
FIG. 5d is a view showing field-effect mobility versus a number of stretching cycles performed in the length direction at various strain ratios.
Figure 5E:
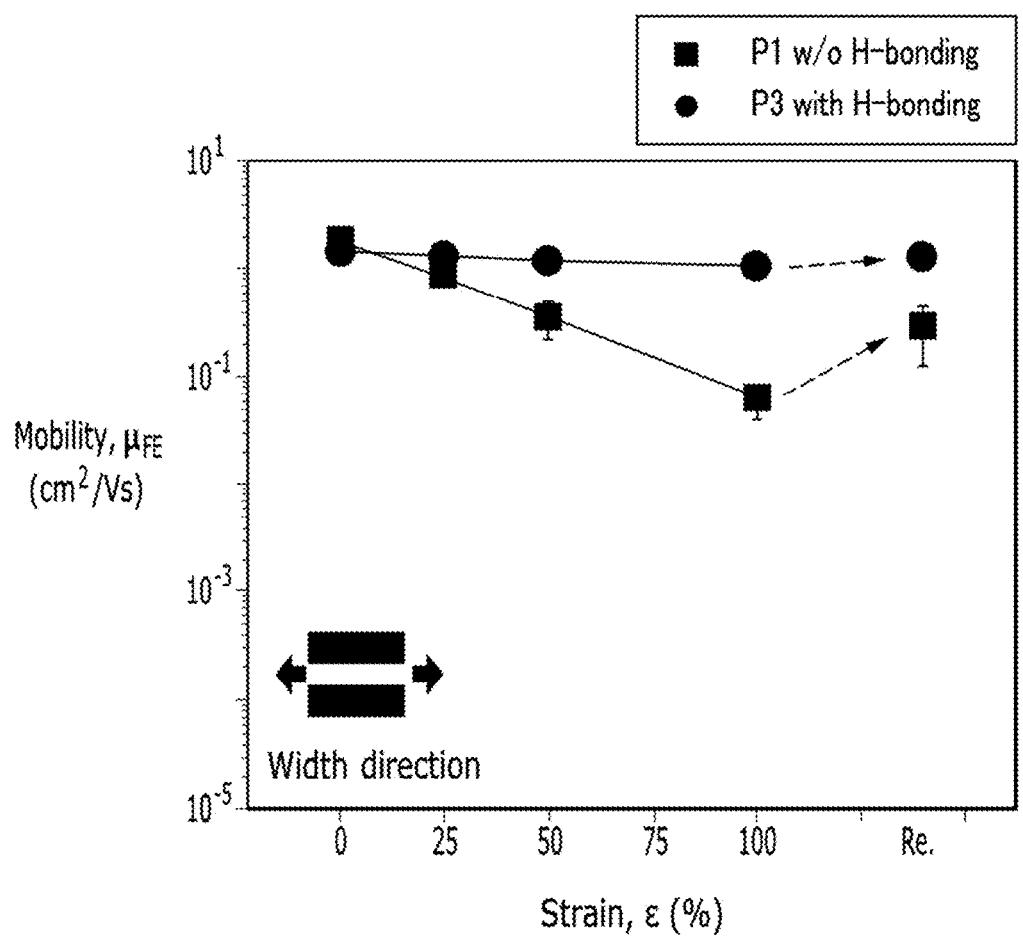
FIG. 5e and FIG. 5f are views showing field-effect mobility and an on/off current of the OTFTs versus various strain ratio in a width direction, respectively.
Figure 5F:
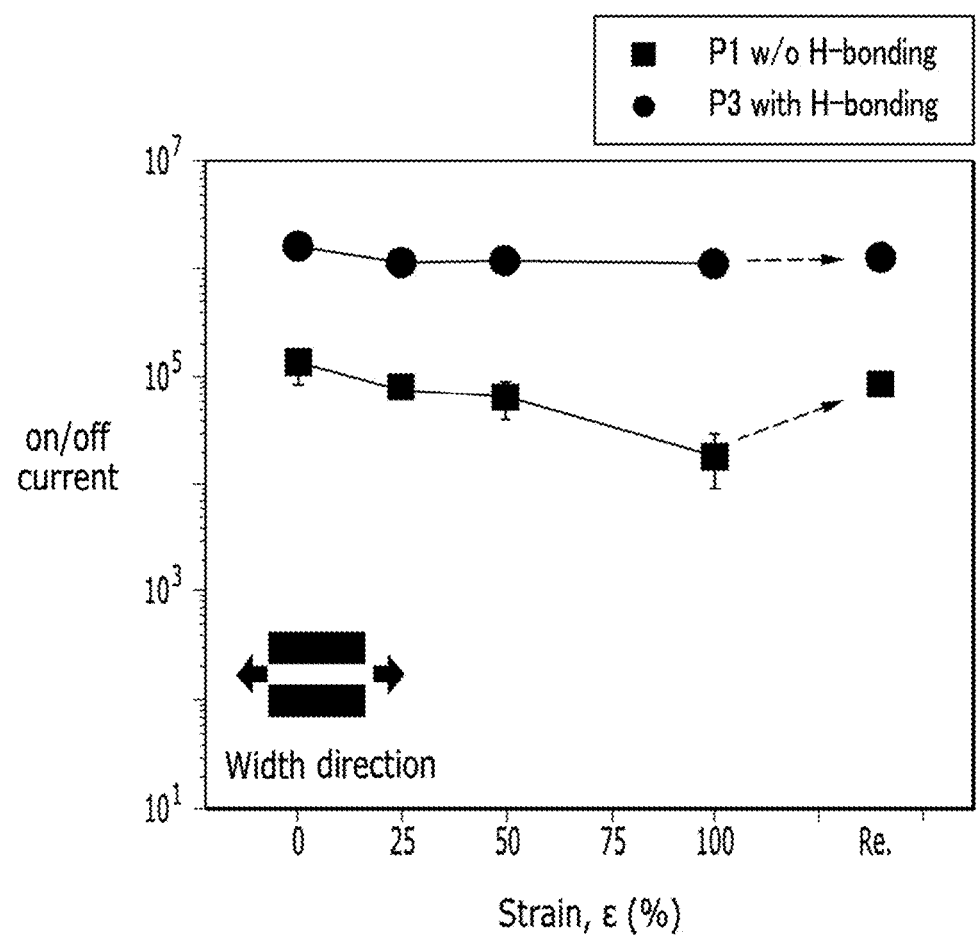
Figure 5G:
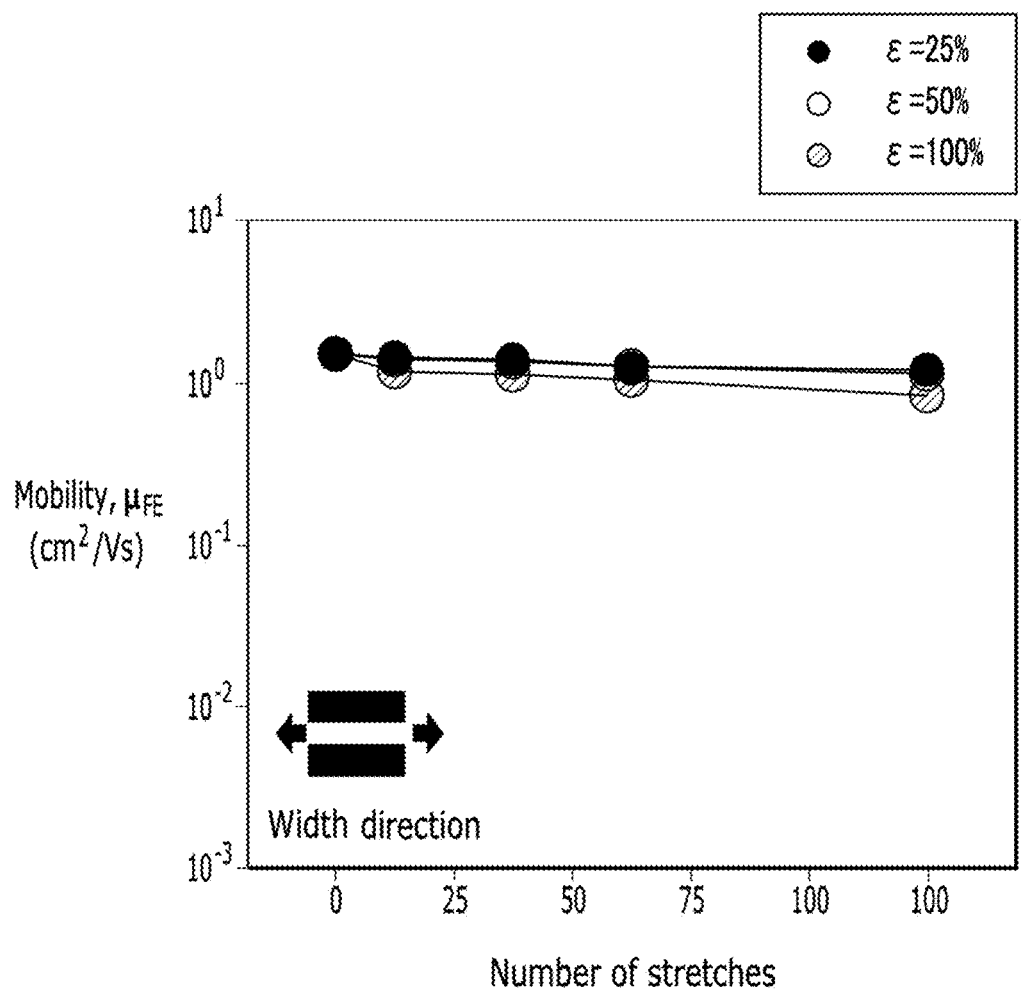
FIG. 5g is a view showing field-effect mobility versus a number of stretching cycles performed in the width direction at various strain ratios.

3. Fabrication of OTFT and Properties Thereof (1) FIG. 5a represents a fabrication process towards organic transistors with stretched polymer thin films; FIG. 5b and FIG. 5c are views showing field-effect mobility and on/off current of the OTFTs versus various strain ratios in a length direction, respectively; FIG. 5d is a view showing field-effect mobility versus number of stretching cycles performed in the length direction at various strain ratios; FIG. 5e and FIG. 5f are views showing field-effect mobility and on/off current of the OTFTs versus various strain ratio in a width direction, respectively; and FIG. 5g is a view showing field-effect mobility versus a number of stretching cycles performed in the width direction at various strain ratios.

(2) Referring to FIG. 5a, polymer semiconductor thin films are supported on a PDMS substrate. These films are then transferred onto OTS-treated $SiO_2$/Si substrates while being stretched at various strains. The source and drain electrodes (Au) are subsequently deposited on the transferred semiconductor films.

FIG. 5b shows the field-effect mobility as a function of various strains along the stretching direction. At up to 100%, the charge-carrier mobility of Polymer P3 only decreases modestly, from 1.22 $cm^2$/Vs to 0.078 $cm^2$/Vs. However, the mobility is recovered to 1.00 $cm^2$/Vs after the strain is released. The decrease in mobility may be attributed to morphological changes. In contrast, the mobility of Polymer P1 degrades even with 25% strain, and no working device may be obtained with films maintained at 100% strain. Unlike Polymer P3, the mobility of Polymer P1 does not recover upon stress release, due to a relatively high density of microscale cracks formed during film stretching as observed in spectroscopy results. Referring to FIG. 5c, the on/off current ratio shows a similar trend.

Referring to FIG. 5e and FIG. 5f, the mobility and on/off current ratio are presented as functions of strain perpendicular to the strain direction. The mobility of the device fabricated with Polymer P3 maintains almost its initial value even at 100% strain and after releasing of strain. Polymer P1 also shows less degradation of the device performance in the perpendicular direction. This is due to compressive strain introduced in the direction perpendicular to stretching due to the Poisson's ratio effect, which results in less morphological changes in the case of Polymer P3 (see FIG. 4f) and cracks do not disrupt the continuous current pathways in the case of Polymer P1.

To gain further insight into the stretching reliability of Polymer P3, stretching cycle tests are performed at various strains, and the results are compiled in FIG. 5d and FIG. 5g. The mobility along the stretching direction is decreased by almost 40% (1.1 $cm^2$/Vs to 0.66 $cm^2$/Vs) after stretching for 100 cycles between 0 and 25% strain.

However, the mobility is decreased at 50 stretching cycles up to 50% strain. After 100 stretching cycles to 100% strain, the mobility of Polymer P3 is reduced from its initial value of 1.2 $cm^2$/Vs to 0.014 $cm^2$/Vs. Along the perpendicular direction to stretching, the devices may show higher durability and robustness towards fatigue. Even after 100 cycles up to 100% strain, only a 26% decrease in mobility is observed while a 19% decrease is observed for 100 cycles up to 25% strain.

4. Film Damage and Healing Performance

Figure 6A:
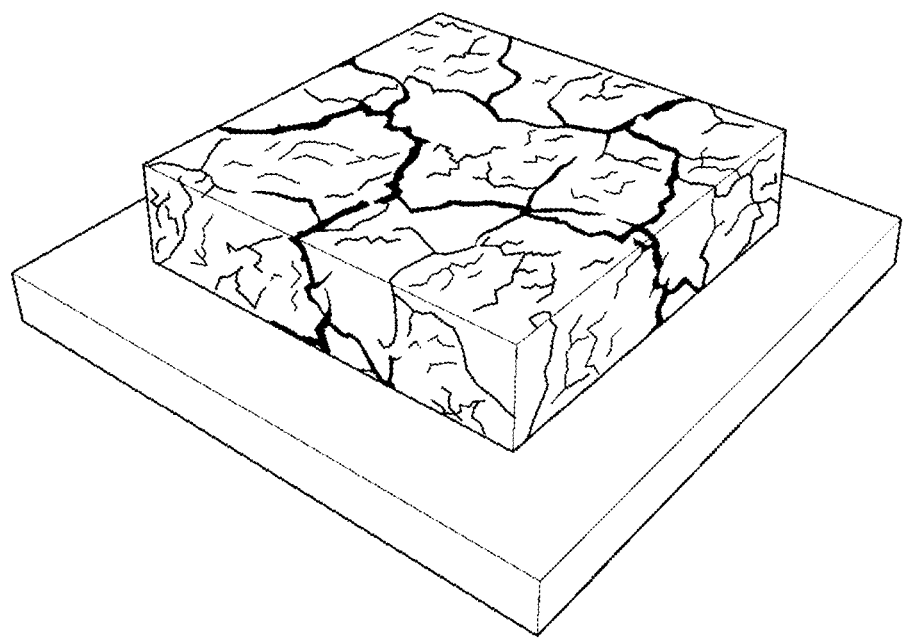
FIG. 6a and FIG. 6b are views schematically representing a heating treatment and a solvent-vapor treatment used for healing the conjugated polymer films.
Figure 6B:
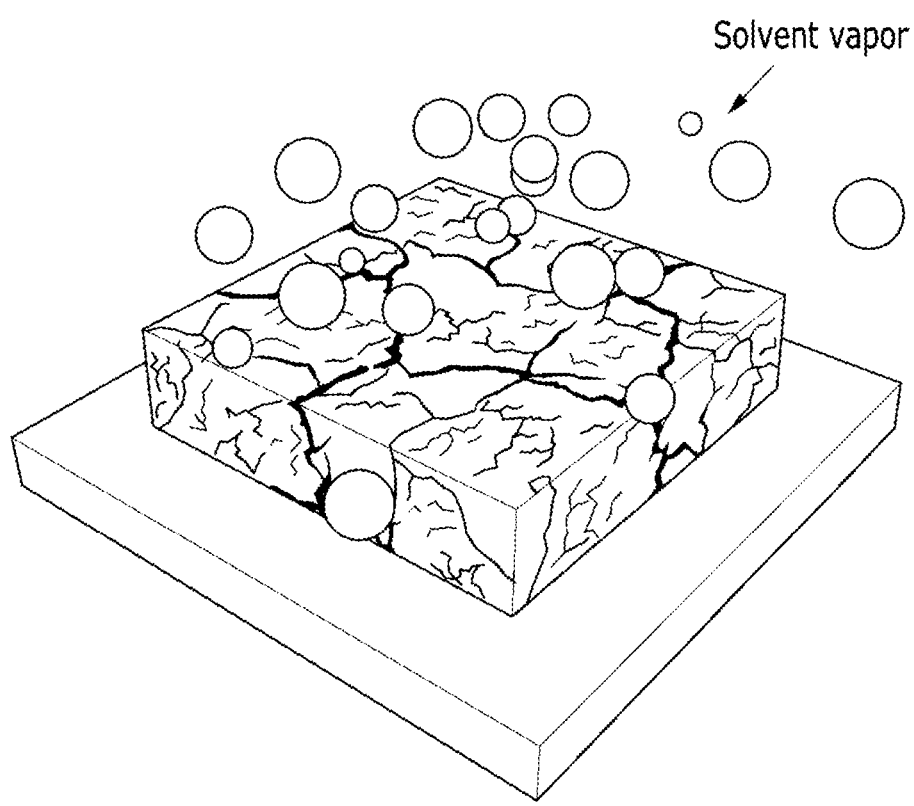
Figure 6C:
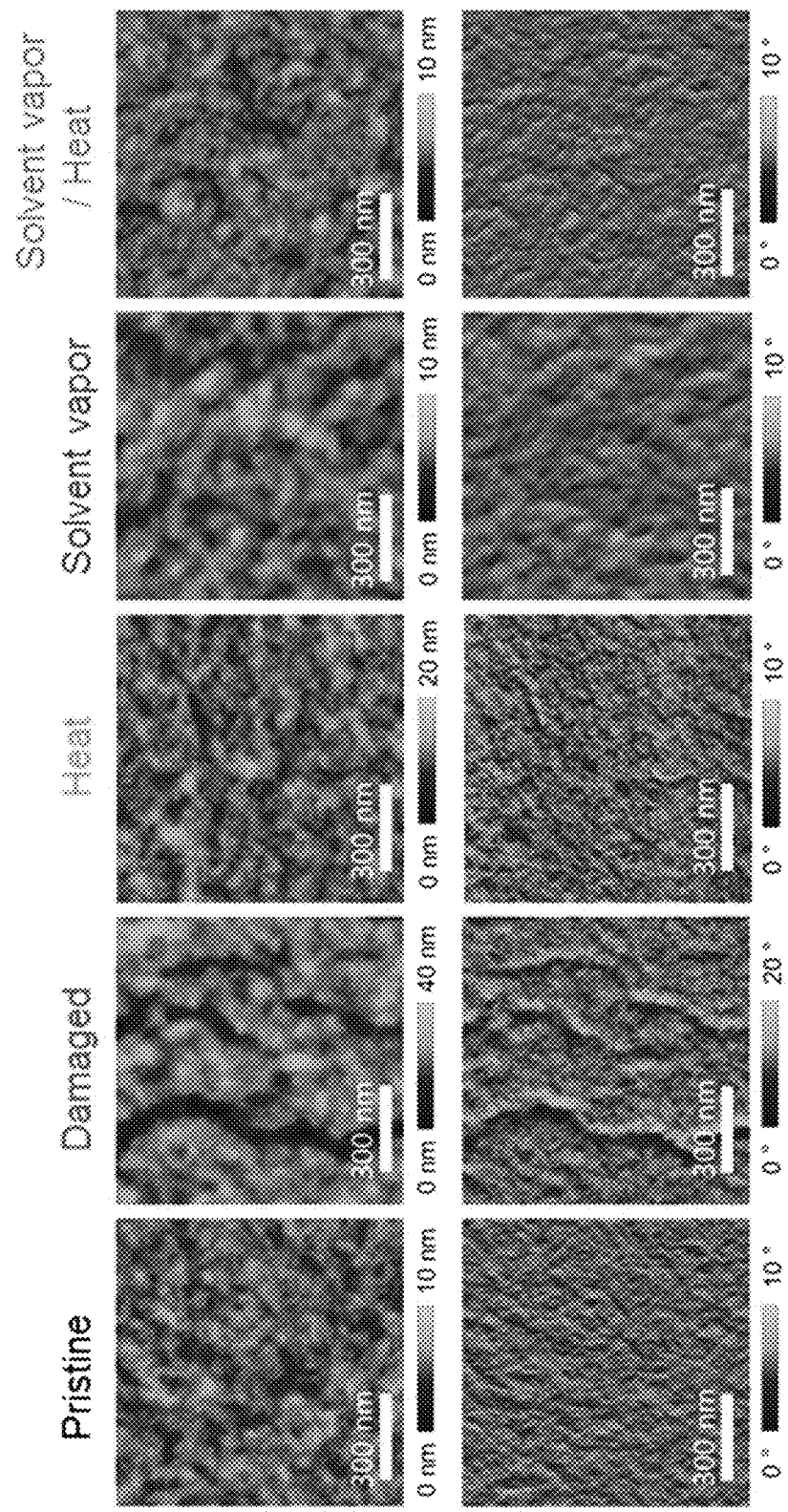
FIG. 6c is a view showing height and phase AFM profiles for damaged films and various healing conditions (P3)
Figure 6D:
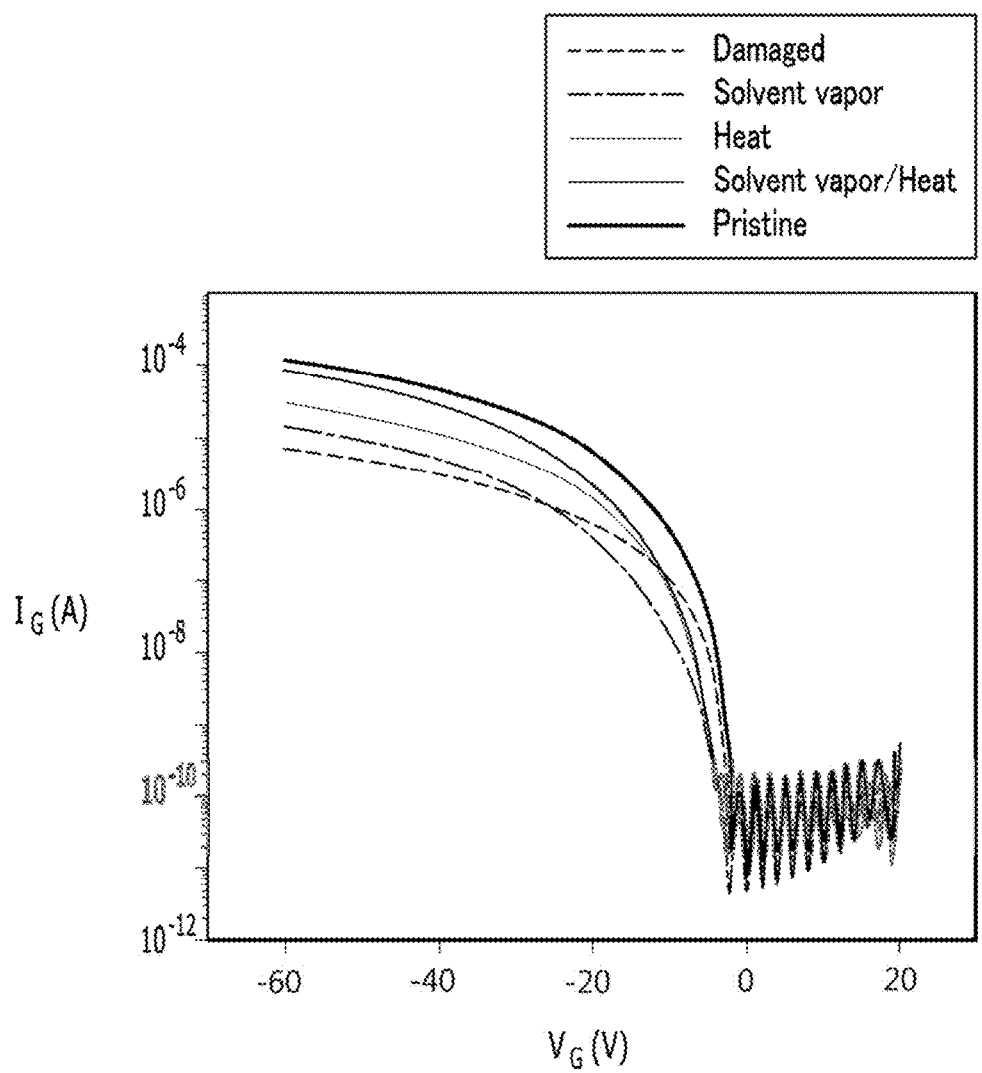
FIG. 6d and FIG. 6e are views showing transfer curves and field-effect mobility of damaged and healed OTFTs, respectively.
Figure 6E:
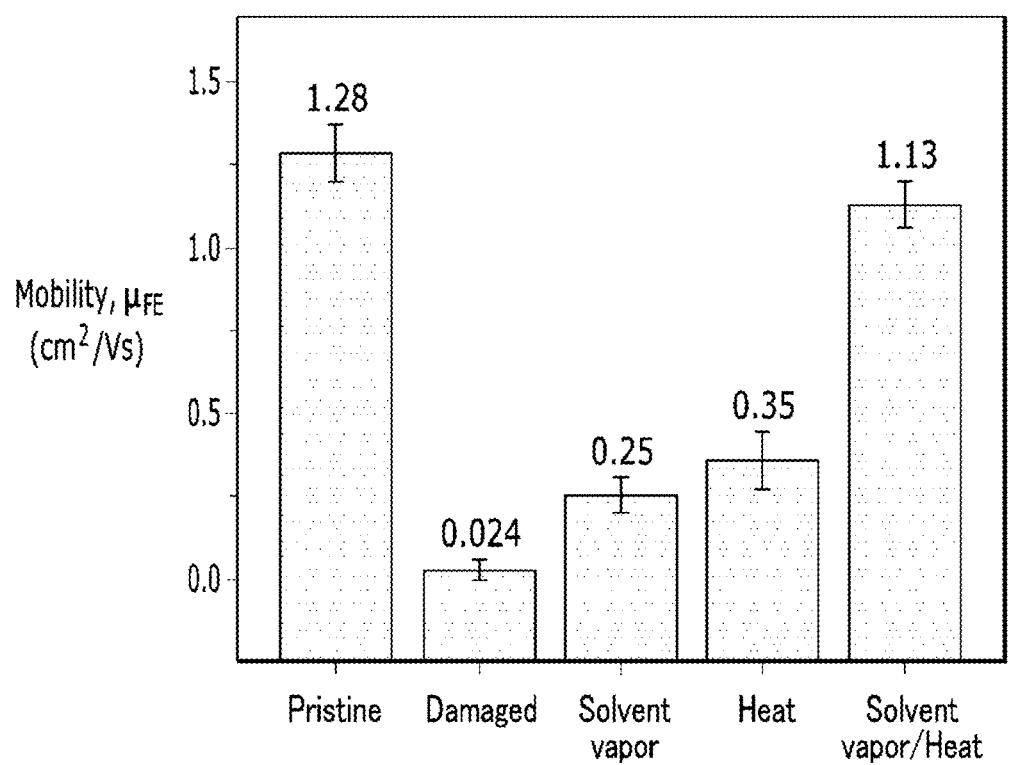

FIG. 6a and FIG. 6b are views schematically illustrating the heating treatment and the solvent-vapor treatment used for healing the conjugated polymer films; FIG. 6c is a view showing height and phase AFM profiles for damaged films and various healing conditions (Polymer P3); and FIG. 6d and FIG. 6e are views showing transfer curves and field-effect mobility of damaged and healed OTFTs.

The films after 100 cycles at 100% strain are further examined by AFM. Nanoscale cracks with their long axes perpendicular to the stretching direction were observed (FIG. 6c) even though no macroscopic cracks were observed by high-resolution optical microscopy. Consequently, the nanocracks interrupt the current flow as they cut off conduction pathways along the stretching direction.

To facilitate healing ability for damaged P3 films, post treatments by heating and/or solvent annealing are required to promote polymer chain movement. FIG. 6c shows AFM images of damaged polymer films after thermal annealing at 150° C. for 30 min, $CHCl_3$ vapor annealing at 40° C. for 10 min, and a sequential combination of $CHCl_3$ vapor annealing and thermal annealing. Both thermal and solvent annealings may reduce the size and density of the nanocracks, but some remained in the film. As a result, the charge carrier mobility is only slightly recovered. However, solvent annealing combined with thermal annealing allows the most efficient healing of the polymer films, resulting in a complete disappearance of the nanocracks within the damaged films and a recovery of the field-effect mobility to 1.13 $cm^2$/Vs, which is an 88% recovery of the initial mobility (1.28 $cm^2$/Vs).

Figure 7A:
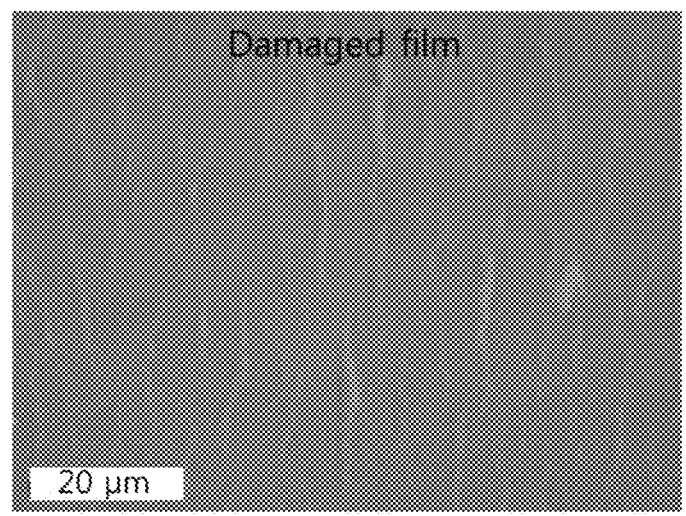
FIG. 7a and FIG. 7b are optical microscope images of damaged P1 thin films before and after sequential healing processes, respectively.
Figure 7B:
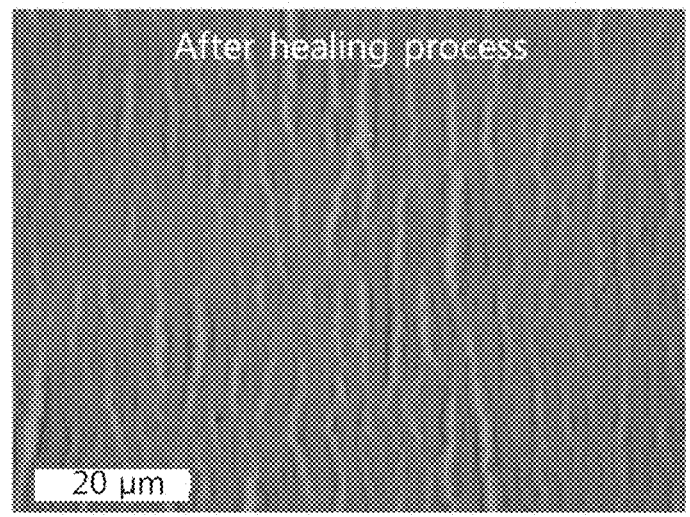
Figure 7C:
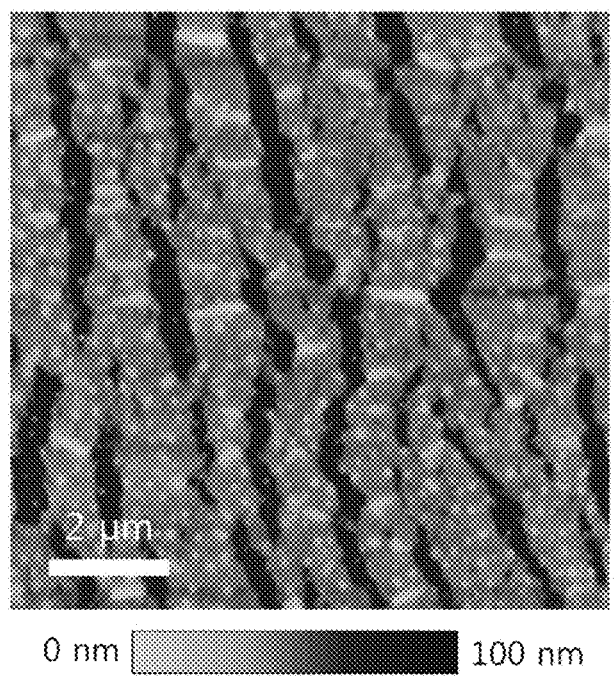
FIG. 7c and FIG. 7d are AFM images of P1 before and after healing processes, respectively.
Figure 7D:
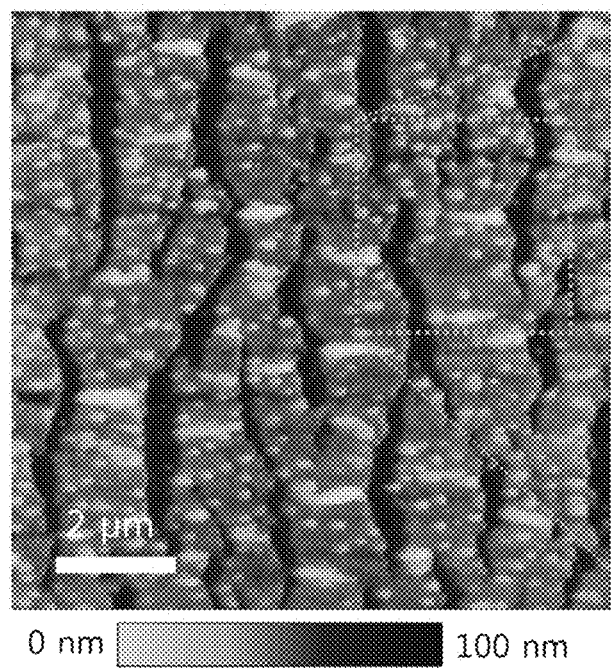
Figure 7E:
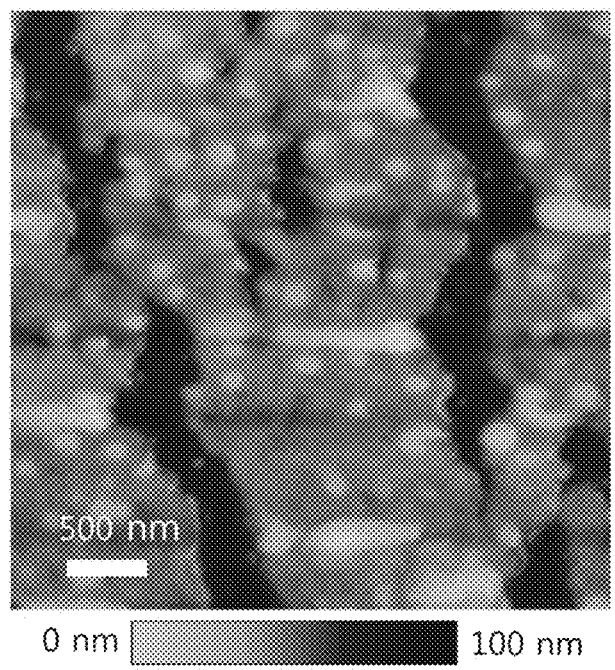
FIG. 7e is a magnified AFM image of FIG. 7d.

In contrast, the various healing conditions do not affect the damaged P1 film. FIG. 7a and FIG. 7b show the optical microscopic images prior to and after the sequential heating process of a thin film including Polymer P1, respectively. FIGS. 7c and FIG. 7d show the AFM images prior to and after the sequential heating processes of a thin film including Polymer P1, respectively, and FIG. 7e is a magnified view of FIG. 7d.

Figure 8A:
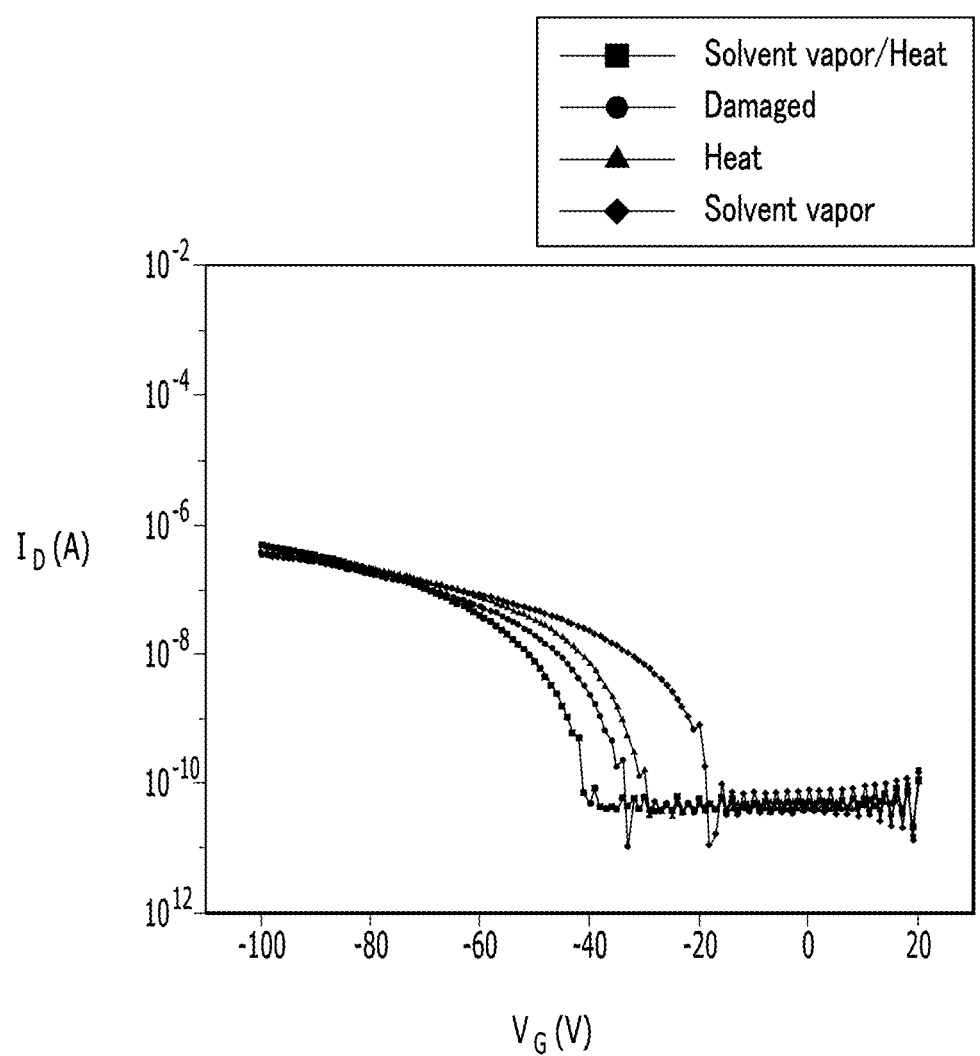
FIG. 8a and FIG. 8b are views showing transfer curves and field-effect mobilities of OTFTs fabricated with damaged P1 thin films before and after various healing conditions.
Figure 8B:
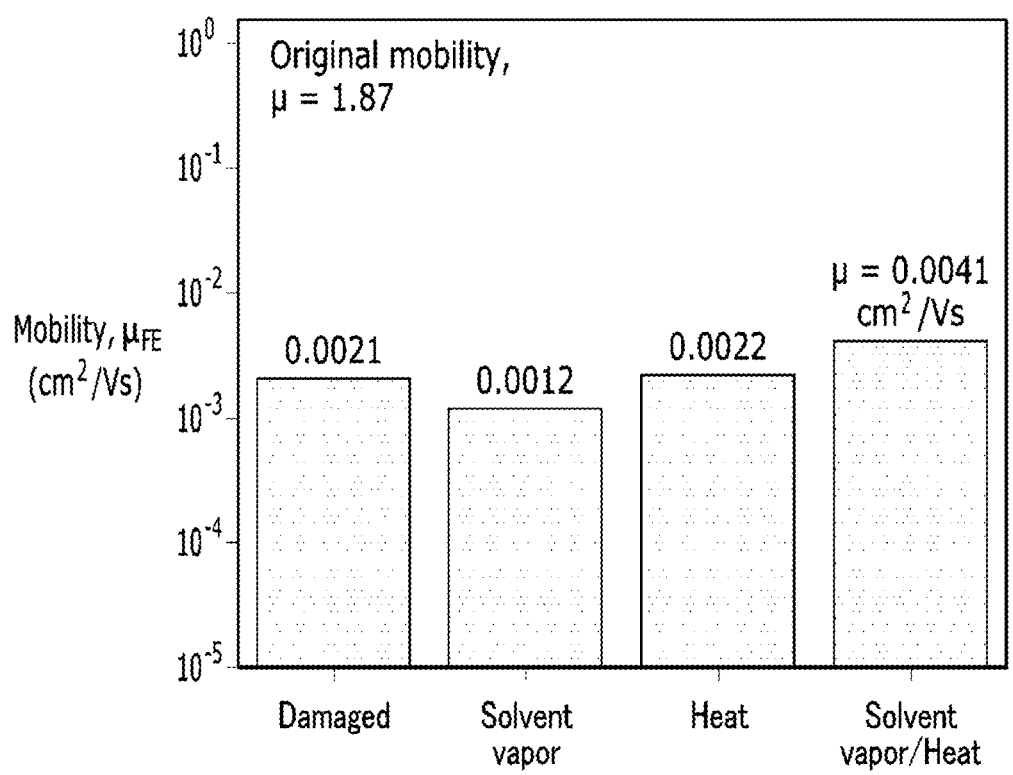

FIG. 8a and FIG. 8b show transfer curves and a view showing the filed effect mobility of the damaged thin film including Polymer P1 prior to and after the sequential heating processes.

In comparison to the crystal motif and relative crystallinity of the pristine film of Polymer P3, the lamellar packing of the P3 damaged thin film (100 stretching cycles at 100% strain) maintains four-order diffraction peaks without an arc tail in the out-of-plane direction which indicates that the crystal orientation has not being hauled or rearranged by the uninterrupted and intense tensile stress. However, the damaged film shows a relative low rDoC of 0.58, which can be attributed to the breaking of H bonds between neighboring chains or inside crystallites and causing low charge mobility. As a result, the P3 thin film displays healing properties via external stimuli (thermal- and solvent-annealing treatments). Therefore, the rDoC of the P3 thin film can be recovered gradually to almost its original value of 0.72.

5. Fabrication of Stretchable Organic Transistor and Characterization Thereof (I)

Figure 9A:
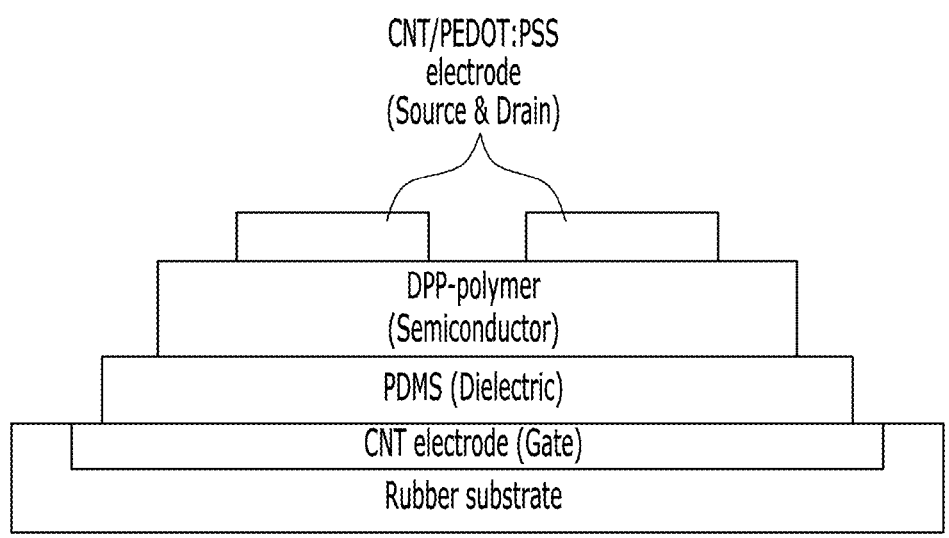
FIG. 9a is a cross-sectional view showing an architecture of fully stretchable organic transistors incorporating the stretchable conjugated polymers.
Figure 9B:
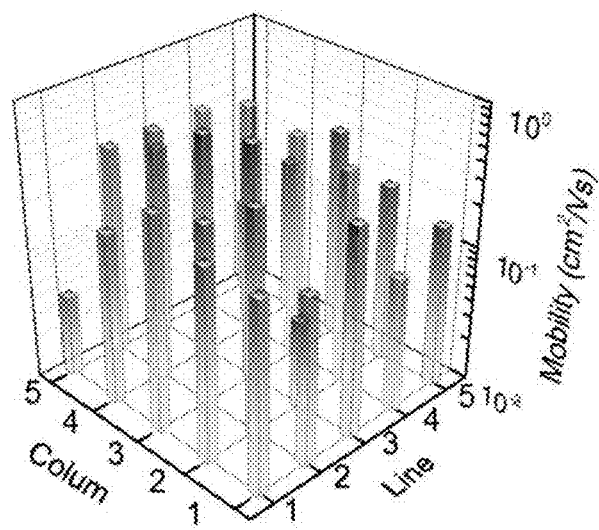
FIG. 9b and FIG. 9c are views showing mapping and a statistical distribution of the charge-carrier mobility in the transistor array, respectively.
Figure 9C:
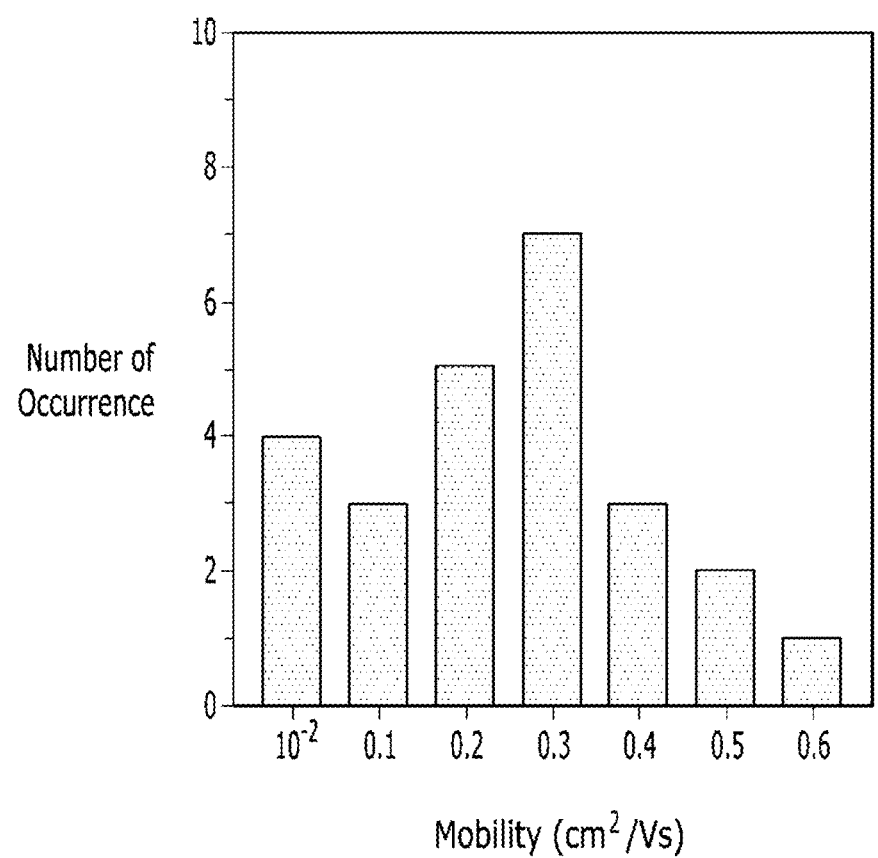
Figure 9D:
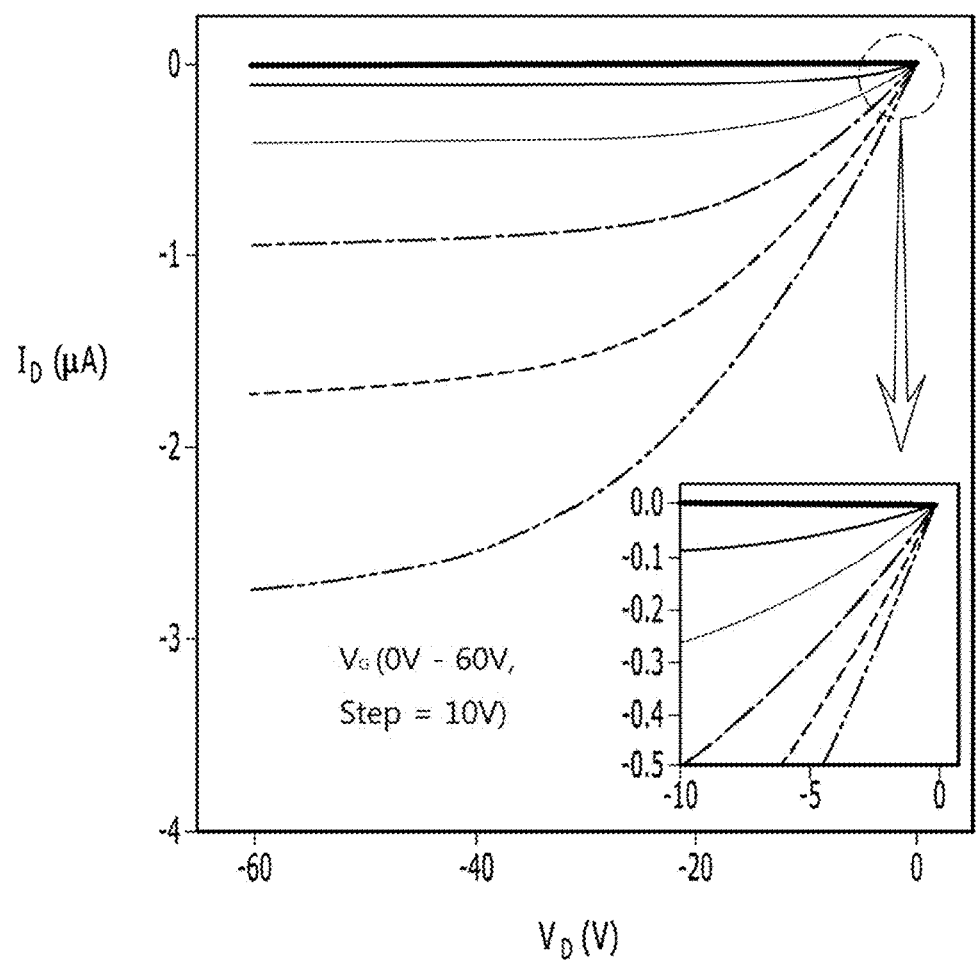
FIG. 9d and FIG. 9e are output and transfer curves of fully stretchable organic transistors, respectively.
Figure 9E:
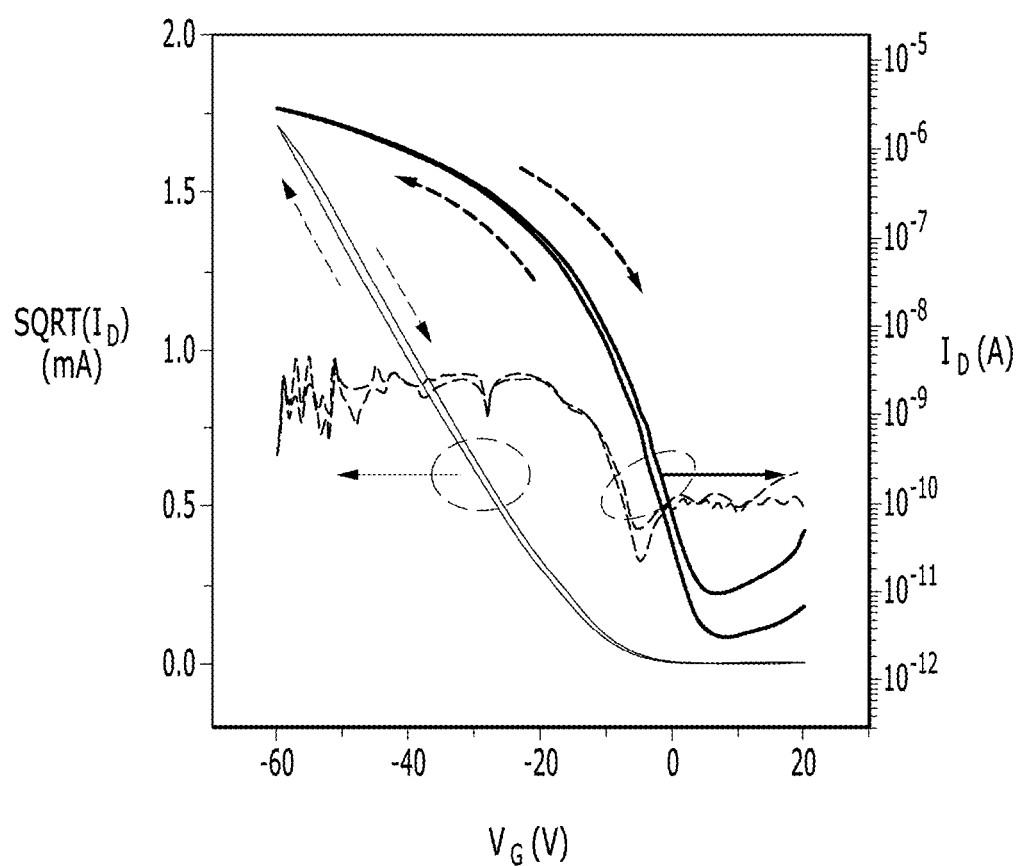

FIG. 9a is a view showing an architecture of fully stretchable organic transistors (5 by 5 arrays) incorporating the stretchable conjugated polymers; FIG. 9b and FIG. 9c are views showing the mapping results and statistical distribution of the charge-carrier mobility in the transistors array; and FIG. 9d and FIG. 9e are views showing output and transfer curves of fully stretchable organic transistors (5 by 5 arrays).

With the availability of both relatively high mobility and relatively high stretchability polymer semiconductors, the fully stretchable OTFTs (5 by 5 arrays) incorporating a polymer semiconductor thin film are fabricated. The fabricated devices utilize solid non-ionic elastic dielectric PDMS, which addresses issues associated with stretchable dielectrics used in most other stretchable transistor work on current-voltage hysteresis and relatively slow operating frequency. Referring to FIG. 9a, carbon nanotubes (CNTs) are used as the stretchable gate electrode, while a CNT/PEDOT: PSS bilayer is used as a stretchable source and drain electrodes. The fabricated devices are functional with good switching performance (see FIGS. 9b to 9e). Most of the devices exhibit field-effect mobilities in the range of $10^{-1}$ cm$^2$/Vs with an on/off current ratio of over $10^5$. The highest value obtained for the mobility is 0.6 cm$^2$/Vs, while the mobility value with a highest frequency is 0.3 cm$^2$/Vs. The fully stretchable OTFTs may exhibit lower mobility than conventional OTFTs mainly due to a thick PDMS dielectric layer. The transistors show little hysteresis and low gate-leakage currents. These performance parameters represent the best among the few reported stretchable organic semiconductors and fully stretchable OTFTs.

6. Fabrication of Stretchable Organic Transistor and Characterization Thereof (II)

Figure 10A:
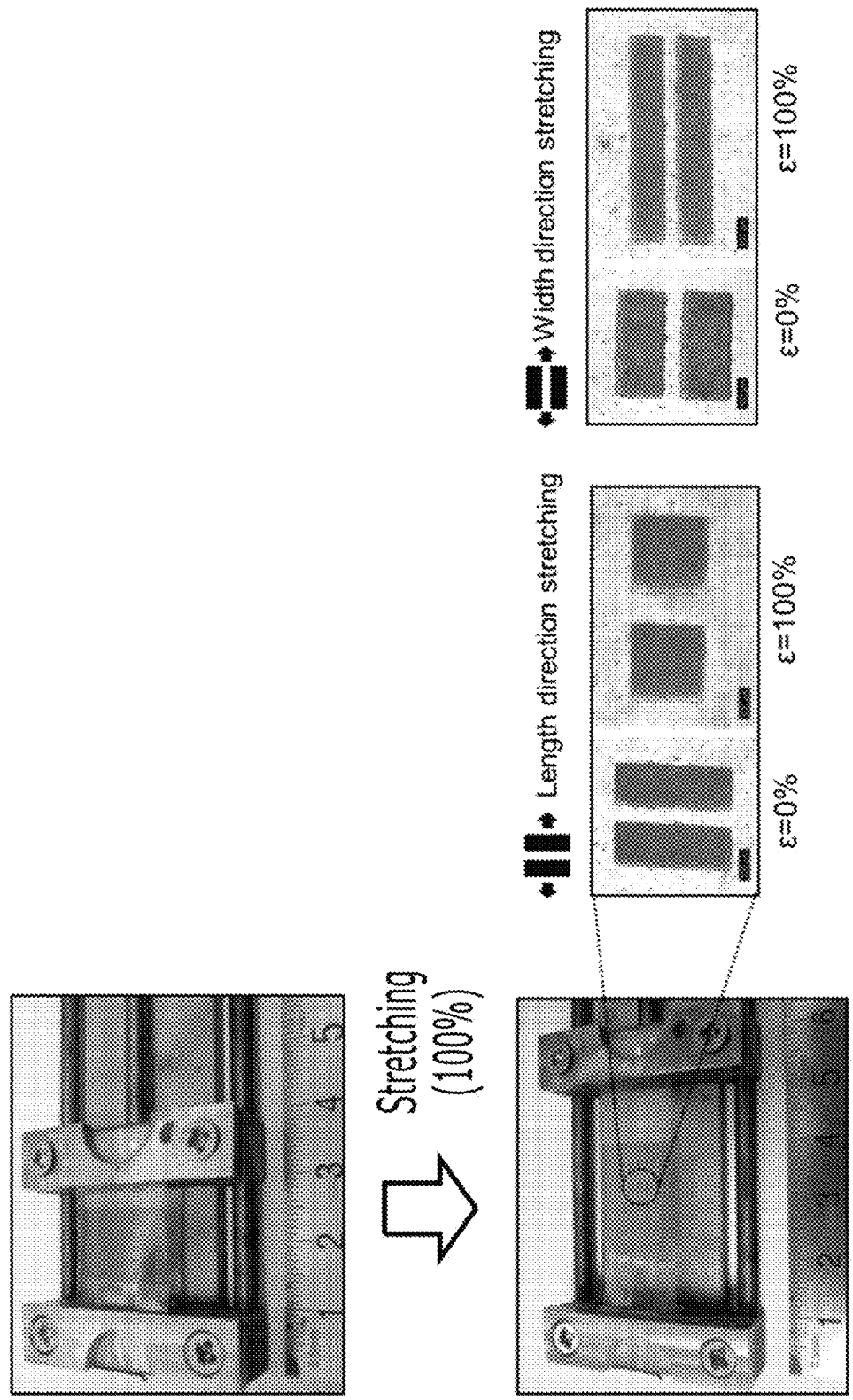
FIG. 10a is a view showing In-situ stretching images of stretchable OTFT with 100% strain in length and width directions.
Figure 10B:
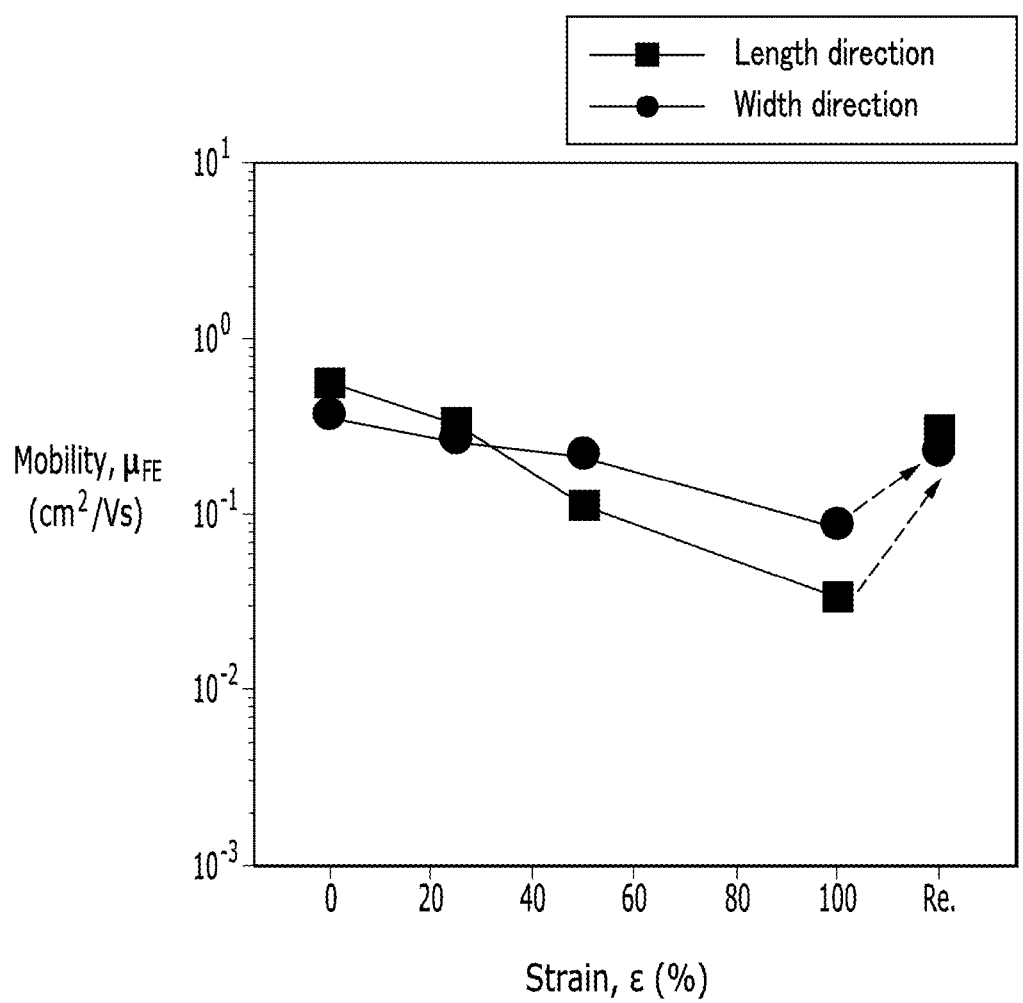
FIG. 10b is a view showing mobility of stretchable OTFT during a stretching cycle.
Figure 10C:
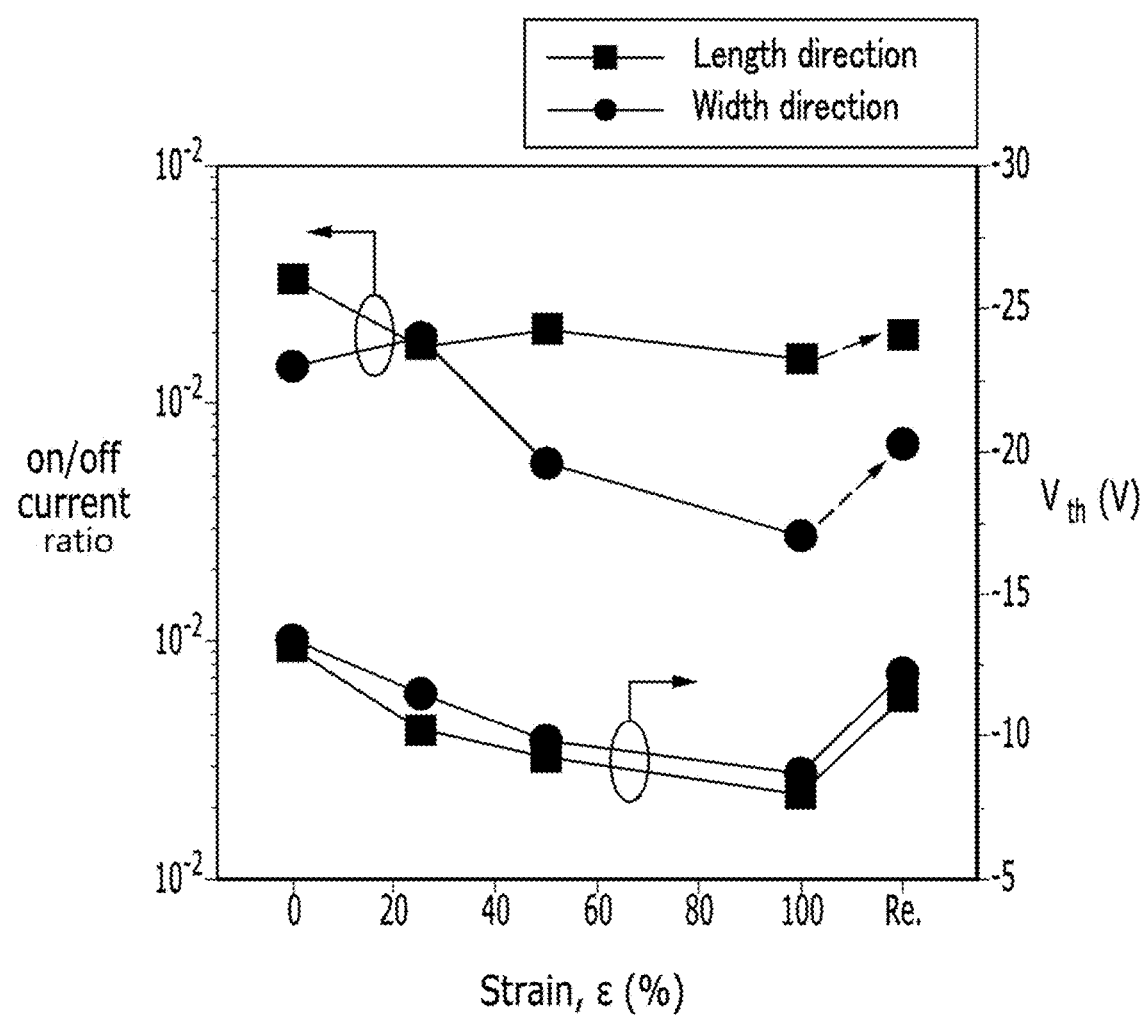
FIG. 10c is a view showing an on/off current ratio and a threshold voltage of stretchable OTFT during a stretching cycle.
Figure 10D:
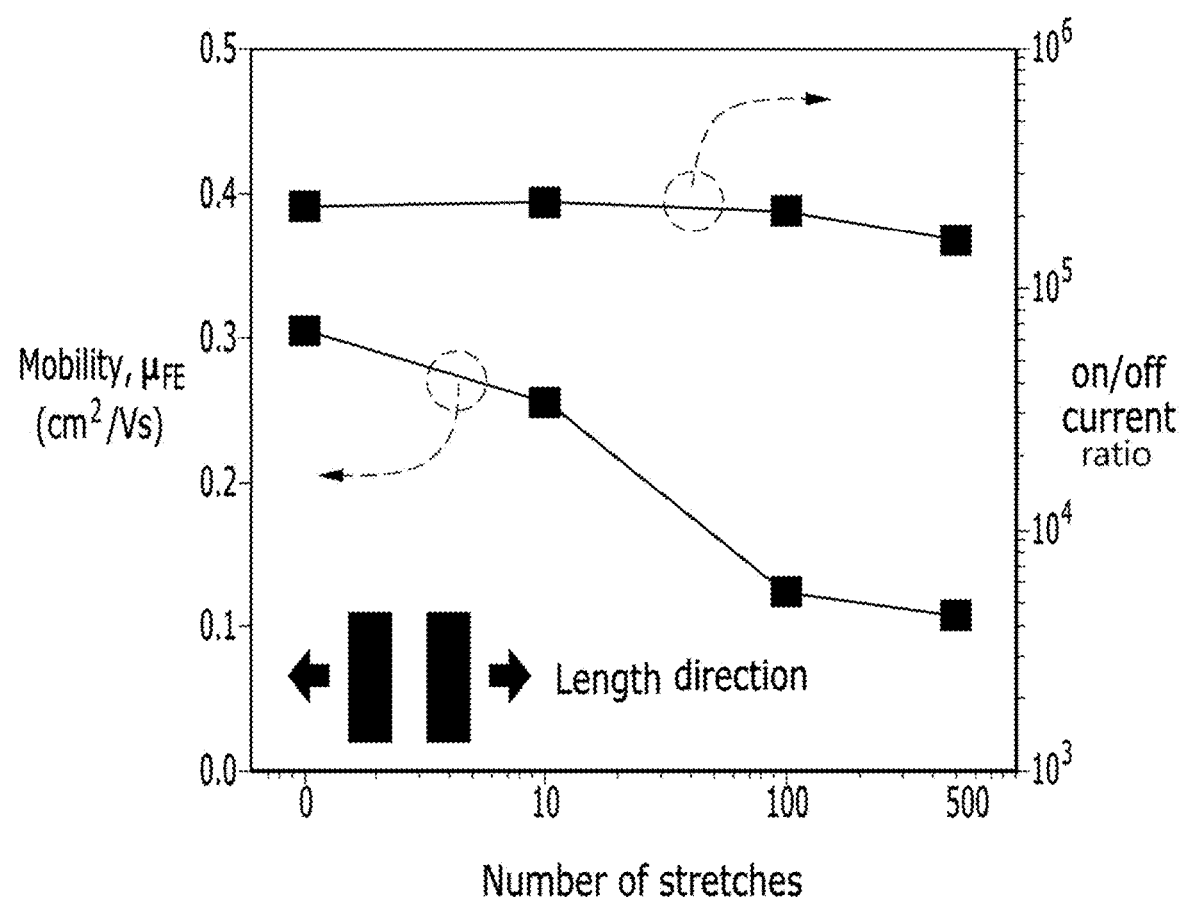
FIG. 10d and FIG. 10e are views showing mobility and an on/off current ratio of OTFTs for 500 stretching cycles at 25% strain in a channel length and a width directions, respectively.
Figure 10E:
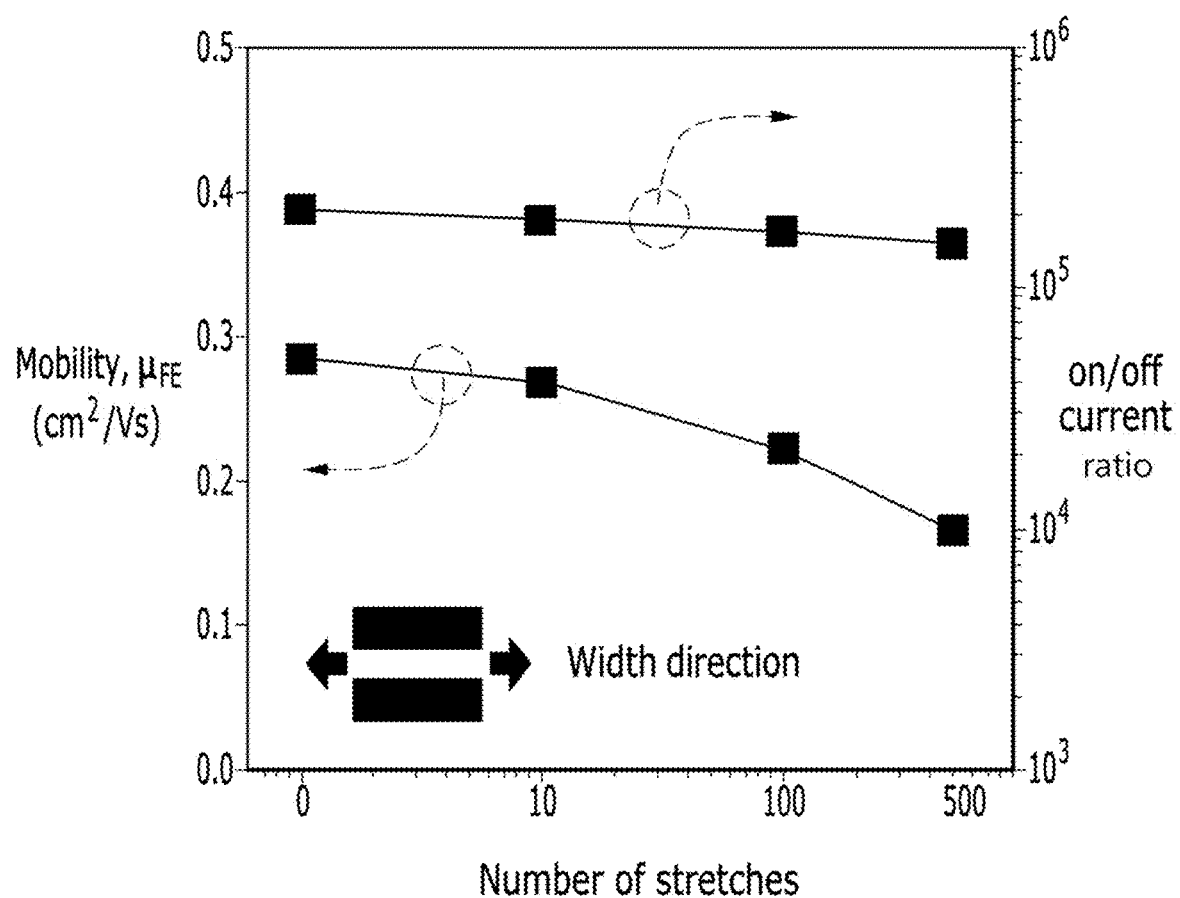
Figure 10F:
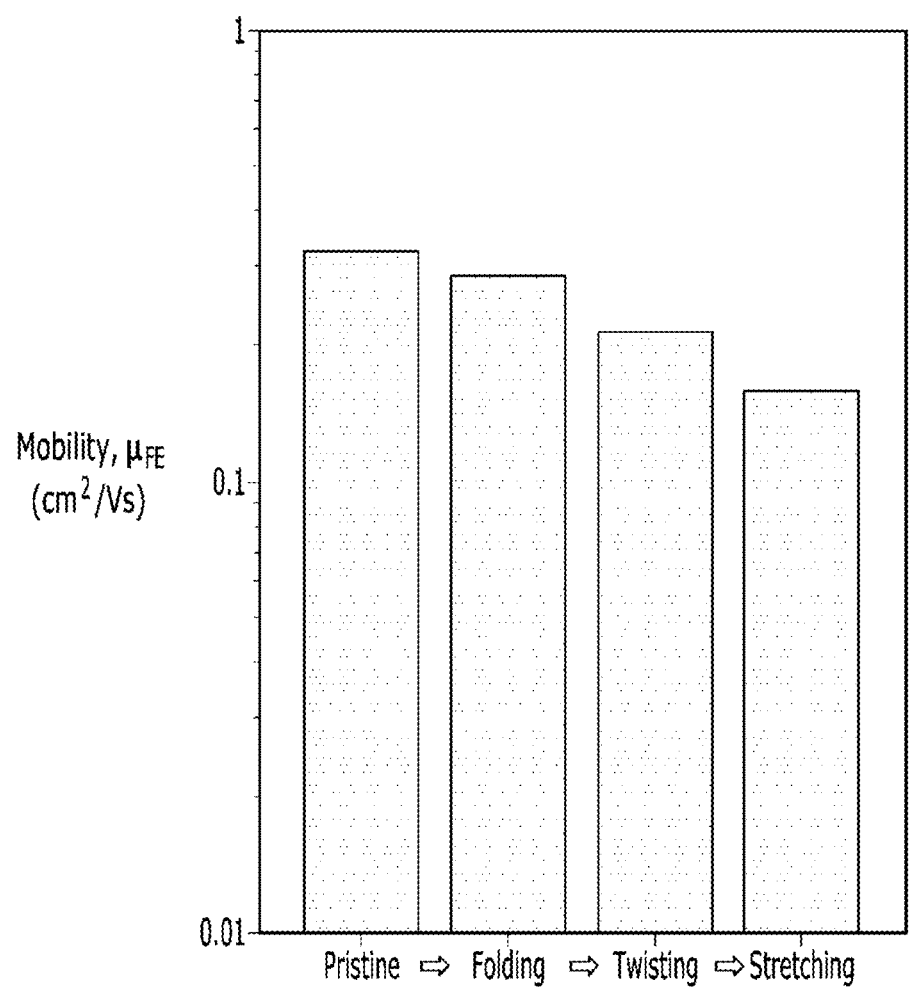
FIG. 10f is a view showing mobilities after various extreme human motions.
Figure 10G:
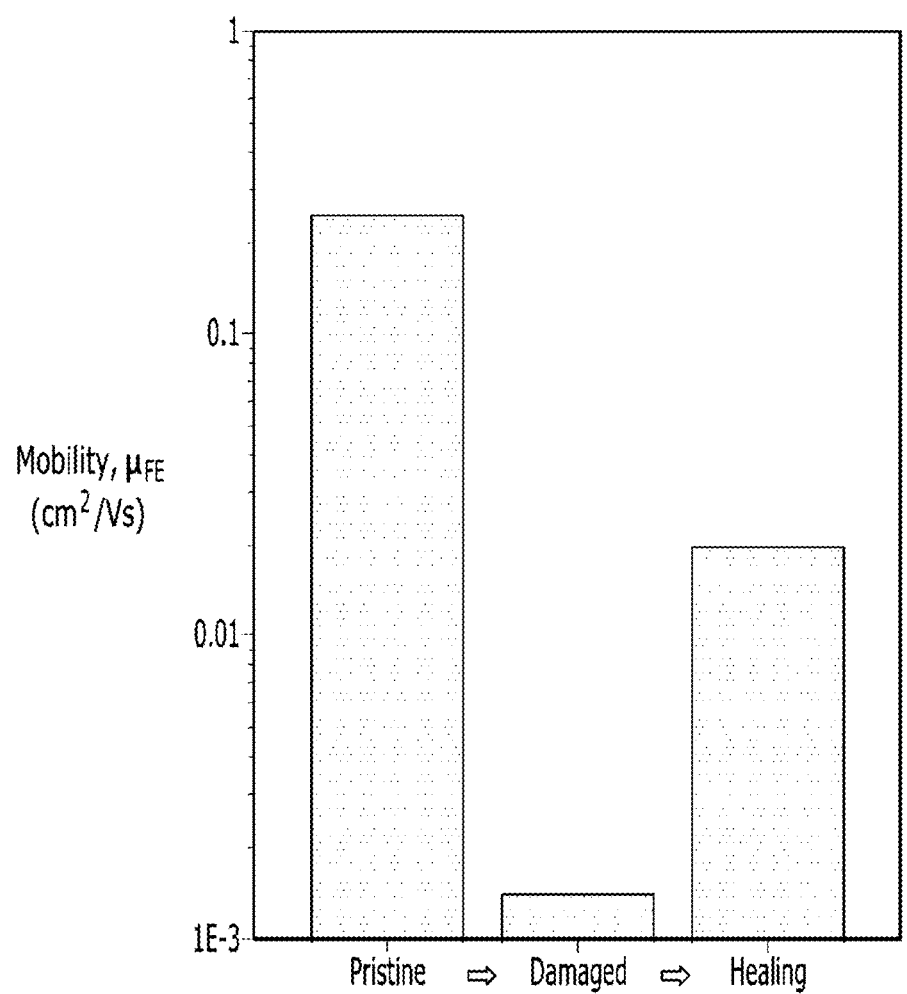
FIG. 10g is a view showing mobilities of mechanically damaged OTFTs before and after a healing process.
Figure 10H:
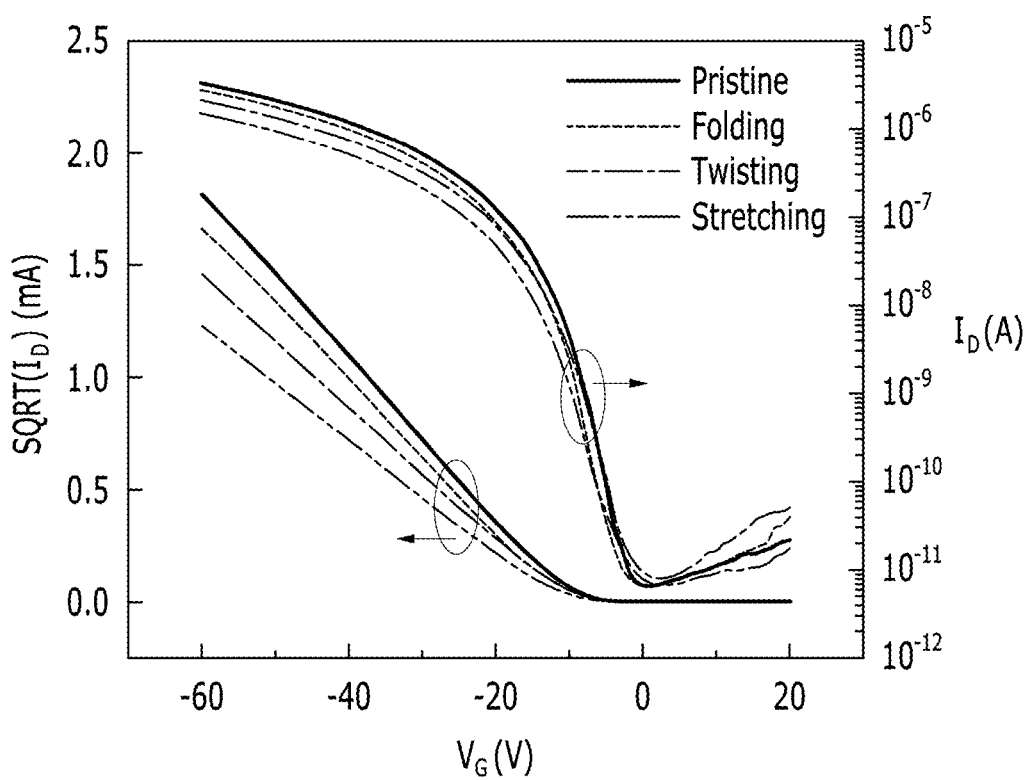
FIG. 10h is transfer curves of the OTFT on a human skin after various motions.

FIG. 10a shows In-situ stretching images of stretchable OTFTs with 100% strain in length and width directions. FIG. 10b is a view showing mobility of the stretchable transistor during a stretching cycle. FIG. 10c is a view showing on/off current ratio and threshold voltage of the stretchable transistor during a stretching cycle, respectively. Mobility and on/off current ratio of OTFTs are measured for 500 times stretching cycle at 25% strain. FIG. 10d and FIG. 10e are views showing mobility and on/off current ratio of the stretchable transistor when being stretched in a channel length and a width direction, respectively. FIG. 10f is a view showing mobilities of the OTFTs after various extreme human motions of being folded, twisted, and stretched on human skin, and FIG. 10g is a view showing mobilities of mechanically damaged OTFTs before and after a healing process. FIG. 10h is a view showing transfer curves of fully stretchable OTFT on human skin for various extreme motions.

To verify the stretchability of these skin-inspired organic transistors, namely stretchable and healable transistors, their electrical performance after various mechanical strain conditions are tested. In this case, since the entire device is being stretched, the device geometry changes upon stretching (FIG. 10a) and the corresponding correction factors for field-effect mobility calculation may be used. The transistors show a relatively slow linear decrease in mobility upon strain to 100%. After releasing the strain, the mobility is recovered to close to initial values (FIG. 10b). The same trend is observed for the on/off current ratios (FIG. 10c).

For future applications in wearable electronics, stretching durability is essential. Considering most applications only require stretchability between 20-30% strain, stretching durability tests at up to 25% strain and 500 cycles are performed for stretchable transistors (FIGS. 10d and 10e). The charge-carrier mobility and on/off current ratio maintain the same order of magnitude without a decrease in performance, although as observed earlier, the mobility along the stretching direction is more sensitive than in the perpendicular direction of stretching. In addition, the devices are mounted on human skin for testing tolerance to human motions, such as folding an arm, twisting a hand, and stretching an elbow in series. After one cycle of each type of motion, the device maintained mobility above 0.1 cm$^2$/Vs (FIGS. 10f and 10h). In addition, the healing ability of the polymer semiconductor may again be observed using a modified heating and solvent annealing process (FIG. 10g, FIG. 11a, and FIG. 11b).

Figure 11A:
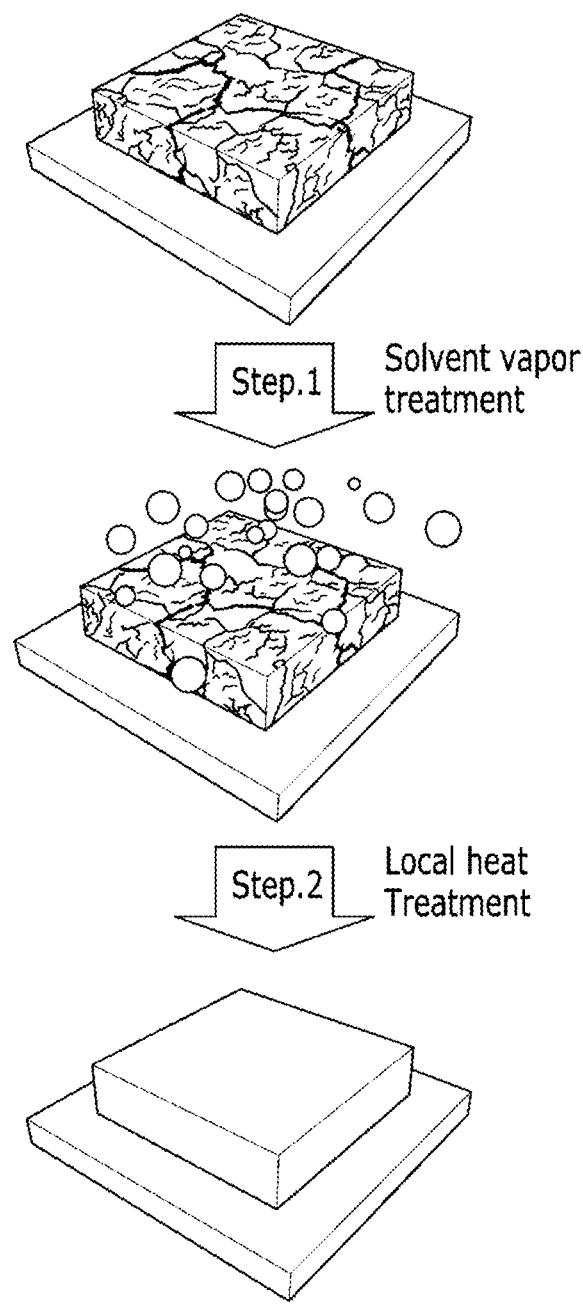
FIG. 11a is a view illustrating a healing process of the fully stretchable OTFT.
Figure 11B:
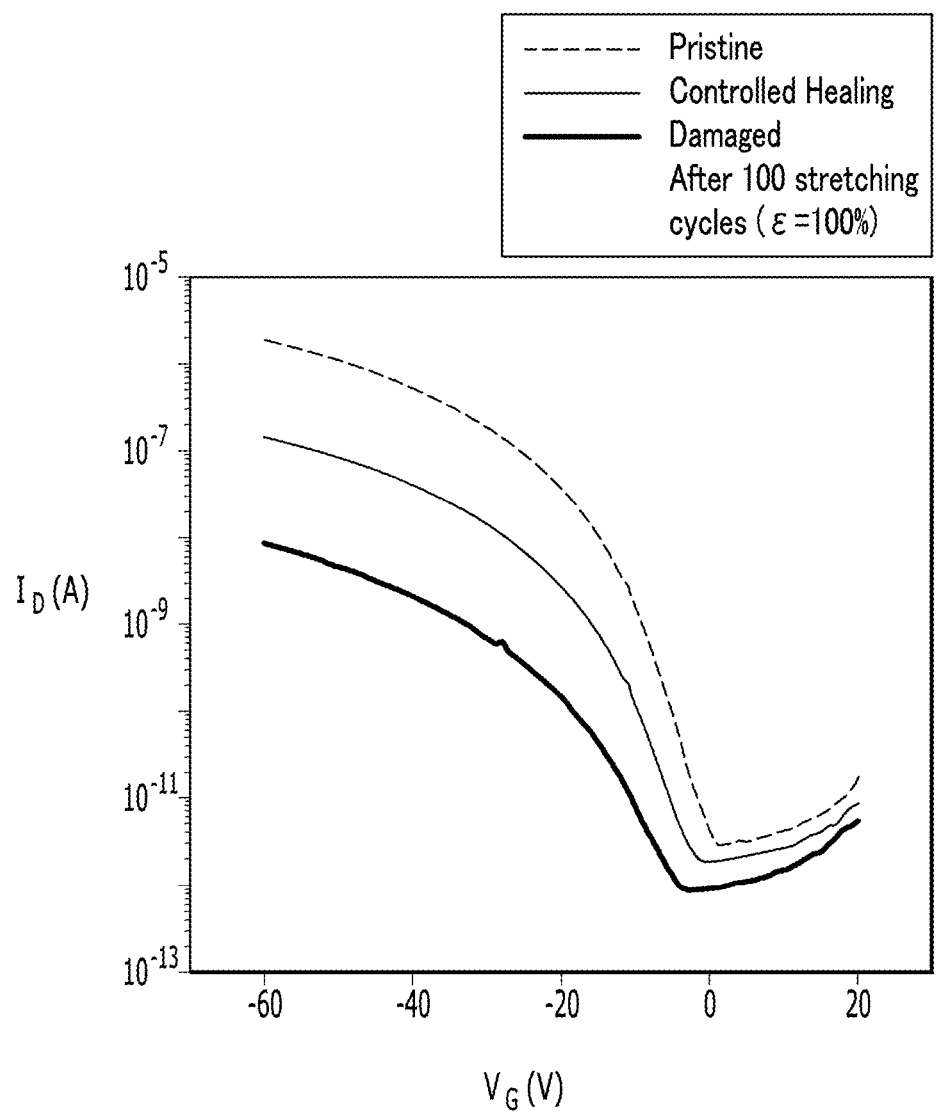
FIG. 11b is a view showing transfer curves of the device prior to and after the healing process.

FIG. 11a is a view illustrating a controlled healing process for fully stretchable OTFTs, and FIG. 11b is a view showing transfer curves of the device before and after healing process.

The healing process for fully stretchable OTFTs is performed and controlled in order to avoid swelling of the PDMS substrate by CHCl$_3$ vapor and melting of the SEBS substrate by heat (150° C.). Modified healing process: 1) Solvent vapor treatment: exposure time for CHCl$_3$ vapor annealing was reduced from 10 min to 2 min to reduce or prevent the PDMS dielectric layer from swelling, (vapor annealing performed three times); 2) Thermal annealing is conducted using a heat gun to locally heat the semiconducting layer for 10 min. The aforementioned healing process may improve the electrical properties of the device.

In the skin-inspired stretchable and healable relatively high mobility semiconducting polymer prepared as above, non-conjugated 2,6-pyridine dicarboxamide (PDCA) moieties are incorporated and they partially break conjugation of polymer backbones to reduce crystallinity and enable dynamic inter- and intra-molecular hydrogen bonding.

Both factors may contribute to the increase in stretchability and mechanical robustness of the resulting polymer semiconductor. The semiconducting polymer of the examples exhibits relatively high mobility of >1.0 cm$^2$/Vs and on/off current ratio of >$10^5$ at 0% strain, while the mobility is maintained at 0.078 cm$^2$/Vs along the stretching direction even at 100% strain and dropped slightly to 1.12 cm$^2$/Vs perpendicular to the stretching direction at 100% strain, but subsequently both recovered to above 1.0 cm²/Vs when the strain was released.

In addition, the mechanically damaged polymer semiconductor thin-films may be healed via heating and solvent vapor treatments. Moreover, according to example embodiments, a skin-inspired organic transistor consisting entirely of intrinsically stretchable electronic materials is prepared. The devices may be stretched up to 100% strain with healing ability and stable operation for 500 stretching cycles at 25% strain without loss in electrical property.

Using the Fe ion introduced to Polymer 6, the stretching test is conducted in the same manner as set forth above. The results confirm that the film including Polymer 6 has enhanced mobility (e.g., an average field effect mobility=0.70 cm²/Vs) and shows no break during the stretching of the film. When the film including Polymer 6 is subjected to 100% strain, no microscale cracks occur.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A polymer comprising:
a first repeating unit comprising a plurality of first conjugated systems, and a non-conjugated hydrogen bonding moiety represented by Chemical Formula 1, wherein the non-conjugated hydrogen bonding moiety is present between two of the first conjugated systems, and
a second repeating unit comprising at least one second conjugated system, wherein the second repeating unit does not comprise the non-conjugated hydrogen bonding moiety represented by Chemical Formula 1:

*-L₁-X₁—Ar₁—X₂-L₂-*      Chemical Formula 1 wherein, in Chemical Formula 1,
each of $L_1$ and $L_2$ is the same or different, and is independently one of a direct bond and a $C_1$ to $C_5$ substituted or unsubstituted alkylene group,
each of $X_1$ and $X_2$ is the same or different, and is independently one of amide, urea, carbamate, —CO—, —OCO—, —NH—, and a combination thereof,
$Ar_1$ is a heteroaromatic group or a phenyl moiety, and
* is a portion that is linked to an adjacent first conjugated system.

2. The polymer of claim 1, wherein one of the first and second conjugated systems includes at least one selected from a moiety represented by Chemical Formula 2-1, a moiety represented by Chemical Formula 2-2, a moiety represented by Chemical Formula 2-3, a moiety represented by Chemical Formula 2-4, a moiety represented by Chemical Formula 2-5, a moiety represented by Chemical Formula 2-6, a moiety represented by Chemical Formula 2-7, or a moiety represented Chemical Formula 2-8:

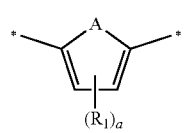

[Chemical Formula 2-1]

wherein, in Chemical Formula 2-1,
A is one of O, S, and NH,
$R_1$ is one of a substituted or unsubstituted aliphatic hydrocarbon group, a substituted or unsubstituted aromatic hydrocarbon group, and a halogen,
a is 0 to 2, and
* is a portion linked to an adjacent moiety;

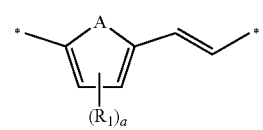

[Chemical Formula 2-2]

wherein, in Chemical Formula 2-2,
A is one of O, S, and NH,
$R_1$ is one of a substituted or unsubstituted aliphatic hydrocarbon group, a substituted or unsubstituted aromatic hydrocarbon group, and a halogen,
a is 0 to 2, and
* is a portion linked to an adjacent moiety;

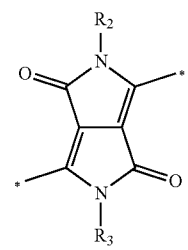

[Chemical Formula 2-3]

wherein, in Chemical Formula 2-3,
each of $R_2$ and $R_3$ is one of hydrogen, a substituted or unsubstituted aliphatic hydrocarbon group, and a substituted or unsubstituted aromatic hydrocarbon group, and
* is a portion linked to an adjacent moiety;

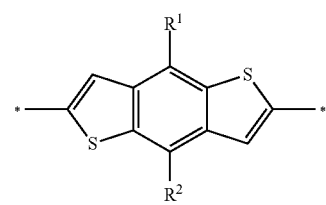

[Chemical Formula 2-4]

wherein, in Chemical Formula 2-4,
each of $R^1$ and $R^2$ is one of hydrogen, a substituted or unsubstituted aliphatic hydrocarbon group, and a substituted or unsubstituted aromatic hydrocarbon group, and
* is a portion linked to an adjacent moiety;

[Chemical Formula 2-5]

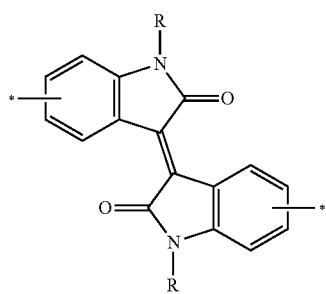

wherein, in Chemical Formula 2-5,
each R is independently one of hydrogen, a substituted or unsubstituted aliphatic hydrocarbon group, and a substituted or unsubstituted aromatic hydrocarbon group, and
* is a portion linked to an adjacent moiety;

[Chemical Formula 2-6]

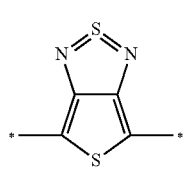

wherein, in Chemical Formula 2-6,
* is a portion linked to an adjacent moiety;

[Chemical Formula 2-7]

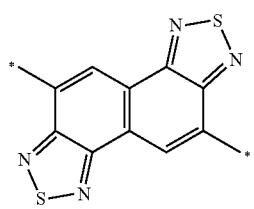

wherein, in Chemical Formula 2-7,
* is a portion linked to an adjacent moiety; and

[Chemical Formula 2-8]

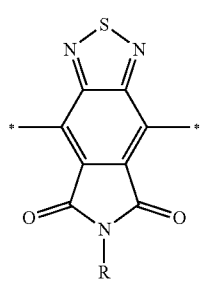

wherein, in Chemical Formula 2-8,
* is a portion linked to an adjacent moiety and R is one of independently hydrogen, a substituted or unsubstituted aliphatic hydrocarbon group, and a substituted or unsubstituted aromatic hydrocarbon group.

3. The polymer of claim 2, wherein the second conjugated system further comprises one of a substituted or unsubstituted phenylene group, a substituted or unsubstituted thiazoline group, a substituted or unsubstituted pyridine group, a substituted or unsubstituted naphthalene group, a substituted or unsubstituted anthracene group, a substituted or unsubstituted naphthacene group, a substituted or unsubstituted fluorene group, a substituted or unsubstituted carbazole group, a substituted or unsubstituted thienothiophene group, a substituted or unsubstituted thieno benzothiophene group, or a combination thereof.

4. The polymer of claim 1, wherein, in Chemical Formula 1, the $Ar_1$ is one of a pyridine moiety, a bipyridine moiety, a phenanthroline moiety, the phenyl moiety, a thiophene moiety, a pyrrole moiety, and a combination thereof.

5. The polymer of claim 1, wherein the non-conjugated hydrogen bonding moiety is represented by Chemical Formula 1-1:

[Chemical Formula 1-1]

wherein, in Chemical Formula 1-1,
each R is in one of hydrogen and a $C_1$ to $C_{10}$ alkyl group,
$Ar_1$ is one of a pyridine moiety, a bipyridine moiety, a phenanthroline moiety, the phenyl moiety, a thiophene moiety, and a pyrrole, moiety, and
n is an integer of 0 to 5.

6. The polymer of claim 1, wherein the polymer consists of the first repeating unit and the second repeating unit.

7. The polymer of claim 1, wherein a ratio between the second repeating unit and the first repeating unit is about 1:0.01 to about 1:30.

8. A polymer comprising:
a first repeating unit comprising a plurality of first conjugated systems, and a non-conjugated hydrogen bonding moiety represented by Chemical Formula 1, wherein the non-conjugated hydrogen bonding moiety is present between two of the first conjugated systems, and
a second repeating unit comprising at least one second conjugated system, wherein the second repeating units, does, not comprise the non-conjugated hydrogen bonding moiety represented by Chemical Formula 1,
wherein the polymer comprises a random copolymer:

  Chemical Formula 1 wherein, in Chemical Formula 1,
each of $L_1$ and $L_2$ are the same or different, and are independently one of a direct bond and a $C_1$ to $C_5$ substituted or unsubstituted alkylene group,
each of $X_1$ and $X_2$ is the same or different, and is independently one of amide, urea, carbamate, —CO—, —OCO—, —NH—, and a combination thereof,
Ar1 is a heteroaromatic group or a phenyl moiety, and
* is a portion that is linked to an adjacent first conjugated system.

9. An electronic device comprising the polymer of claim 1.

10. An organic thin film transistor comprising:
a gate electrode;
an insulating layer on the gate electrode;
a semiconductor layer on the insulating layer, the semiconductor layer including the polymer of claim 1; and
a source electrode and a drain electrode linked to the semiconductor layer.

11. The polymer of claim 1, wherein
Ar1 is a heteroaromatic group.
12. The polymer of claim 1,
at least one of L1 or L2 is a direct bond.
13. The polymer of claim 1,
at least one of L1 or L2 is a C1 to C5 substituted or unsubstituted alkylene group.
14. The polymer of claim 1, wherein
the first repeating unit and the second repeating unit are different from each other.
15. The polymer of claim 1, wherein
Ar1 is a phenyl moiety.
16. The polymer of claim 1, wherein
each of $X_1$ and $X_2$ are the same or different, and are independently one of amide, urea, carbamate, —CO—, —OCO—, and a combination thereof.

* * * * *